(12) United States Patent
Murin

(10) Patent No.: US 8,010,755 B2
(45) Date of Patent: *Aug. 30, 2011

(54) STATES ENCODING IN MULTI-BIT FLASH CELLS FOR OPTIMIZING ERROR RATE

(75) Inventor: Mark Murin, Kfar-Saba (IL)

(73) Assignee: Sandisk IL Ltd, Kfar Saba (IL)

( * ) Notice: Subject to any disclaimer, the term of this patent is extended or adjusted under 35 U.S.C. 154(b) by 47 days.

This patent is subject to a terminal disclaimer.

(21) Appl. No.: 12/346,676

(22) Filed: Dec. 30, 2008

(65) Prior Publication Data
US 2009/0113120 A1    Apr. 30, 2009

Related U.S. Application Data

(63) Continuation of application No. 11/078,478, filed on Mar. 14, 2005, now Pat. No. 7,493,457.

(60) Provisional application No. 60/625,752, filed on Nov. 8, 2004.

(51) Int. Cl.
*G06F 12/00* (2006.01)
*G06F 11/10* (2006.01)

(52) U.S. Cl. ........ 711/157; 711/103; 714/756; 714/773; 365/185.03

(58) Field of Classification Search ............... 365/185.03
See application file for complete search history.

(56) References Cited

U.S. PATENT DOCUMENTS

| | | | |
|---|---|---|---|
| 2,632,058 A | 3/1953 | Gray | |
| 5,434,825 A | 7/1995 | Harari | |
| 5,886,930 A * | 3/1999 | Maclellan et al. | 365/189.05 |
| 6,046,935 A | 4/2000 | Takeuchi et al. | |
| 6,088,261 A | 7/2000 | Nakajima | |
| 6,297,988 B1 | 10/2001 | Parker et al. | |
| 6,522,580 B2 | 2/2003 | Chen et al. | |
| 6,587,373 B2 * | 7/2003 | Talreja | 365/185.03 |
| 6,631,491 B1 | 10/2003 | Shibutani et al. | |
| 6,643,188 B2 | 11/2003 | Tanaka et al. | |
| 6,684,289 B1 | 1/2004 | Gonzalez et al. | |
| 6,707,713 B1 | 3/2004 | Parker et al. | |
| 6,772,383 B1 | 8/2004 | Quach et al. | |
| 2003/0041299 A1 * | 2/2003 | Kanazawa et al. | 714/766 |
| 2003/0219078 A1 * | 11/2003 | Coffey et al. | 375/262 |
| 2005/0213393 A1 | 9/2005 | Lasser | |

FOREIGN PATENT DOCUMENTS

| | | |
|---|---|---|
| KR | 2001-71332 A | 7/2001 |
| WO | WO 00/60476 A1 | 10/2000 |

OTHER PUBLICATIONS

Korean Patent Office, "Office Action," corresponding Korean Patent Application No. 10-2007-7010412, mailed on Apr. 27, 2009, 6 pages (translation only.).

* cited by examiner

*Primary Examiner* — Kaushikkumar Patel
(74) *Attorney, Agent, or Firm* — Davis Wright Tremaine LLP

(57) ABSTRACT

To store N bits of $M \geq 2$ logical pages, the bits are interleaved and the interleaved bits are programmed to [N/M] memory cells, M bits per cell. Preferably, the interleaving puts the same number of bits from each logical page into each bit-page of the [N/M] cells. When the bits are read from the cells, the bits are de-interleaved. The interleaving may be deterministic or random, and may be effected by software or by dedicated hardware.

25 Claims, 11 Drawing Sheets

STATES ENCODING IN MULTI-BIT FLASH CELLS FOR OPTIMIZING ERROR RATE

This patent application is a continuation of U.S. patent application Ser. No. 11/078,478, filed on Mar. 14, 2005, U.S. Publication No. 2006/01011930A1, now U.S. Pat. No. 7,493,457, which application claims the benefit of U.S. Provisional Patent Application No. 60/625,752, filed Nov. 8, 2004.

FIELD AND BACKGROUND OF THE INVENTION

The present invention relates to flash memories and, more particularly, to a method of storing data in multi-bit flash cells.

Flash memory devices have been known for many years. Typically, each cell within a flash memory stores one bit of information. Traditionally, the way to store a bit has been by supporting two states of the cell—one state represents a logical "0" and the other state represents a logical "1". In a flash memory cell the two states are implemented by having a floating gate above the cell's channel (the area connecting the source and drain elements of the cell's transistor), and having two valid states for the amount of charge stored within this floating gate. Typically, one state is with zero charge in the floating gate and is the initial unwritten state of the cell after being erased (commonly defined to represent the "1" state) and another state is with some amount of negative charge in the floating gate (commonly defined to represent the "0" state). Having negative charge in the gate causes the threshold voltage of the cell's transistor (i.e. the voltage that has to be applied to the transistor's control gate in order to cause the transistor to conduct) to increase. Now it is possible to read the stored bit by checking the threshold voltage of the cell: if the threshold voltage is in the higher state then the bit value is "0" and if the threshold voltage is in the lower state then the bit value is "1". Actually there is no need to accurately read the cell's threshold voltage. All that is needed is to correctly identify in which of the two states the cell is currently located. For that purpose it is enough to make a comparison against a reference voltage value that is in the middle between the two states, and thus to determine if the cell's threshold voltage is below or above this reference value.

FIG. 1A shows graphically how this works. Specifically, FIG. 1A shows the distribution of the threshold voltages of a large population of cells. Because the cells in a flash memory are not exactly identical in their characteristics and behavior (due, for example, to small variations in impurities concentrations or to defects in the silicon structure), applying the same programming operation to all the cells does not cause all of the cells to have exactly the same threshold voltage. (Note that, for historical reasons, writing data to a flash memory is commonly referred to as "programming" the flash memory.) Instead, the threshold voltage is distributed similar to the way shown in FIG. 1A. Cells storing a value of "1" typically have a negative threshold voltage, such that most of the cells have a threshold voltage close to the value shown by the left peak of FIG. 1A, with some smaller numbers of cells having lower or higher threshold voltages. Similarly, cells storing a value of "0" typically have a positive threshold voltage, such that most of the cells have a threshold voltage close to the value shown by the right peak of FIG. 1A, with some smaller numbers of cells having lower or higher threshold voltages.

In recent years a new kind of flash memory has appeared on the market, using a technique conventionally called "Multi Level Cells" or MLC for short. (This nomenclature is misleading, because the previous type of flash cells also have more than one level: they have two levels, as described above. Therefore, the two kinds of flash cells are referred to herein as "Single Bit Cells" (SBC) and "Multi-Bit Cells" (MBC).) The improvement brought by the MBC flash is the storing of two or more bits in each cell. In order for a single cell to store two bits of information the cell must be able to be in one of four different states. As the cell's "state" is represented by its threshold voltage, it is clear that a 2-bit MBC cell should support four different valid ranges for its threshold voltage. FIG. 1B shows the threshold voltage distribution for a typical 2-bit MBC cell. As expected, FIG. 1B has four peaks, each corresponding to one state. As for the SBC case, each state is actually a range and not a single number. When reading the cell's contents, all that must be guaranteed is that the range that the cell's threshold voltage is in is correctly identified. For a prior art example of an MBC flash memory see U.S. Pat. No. 5,434,825 to Harari.

Similarly, in order for a single cell to store three bits of information the cell must be able to be in one of eight different states. So a 3-bit MBC cell should support eight different valid ranges for its threshold voltage. FIG. 1C shows the threshold voltage distribution for a typical 3-bit MBC cell. As expected, FIG. 1C has eight peaks, each corresponding to one state. FIG. 1D shows the threshold voltage distribution for a 4-bit MBC cell, for which sixteen states, represented by sixteen threshold voltage ranges, are required.

When encoding two bits in an MBC cell via the four states, it is common to have the left-most state in FIG. 1B (typically having a negative threshold voltage) represent the case of both bits having a value of "1". (In the discussion below the following notation is used—the two bits of a cell are called the "lower bit" and the "upper bit". An explicit value of the bits is written in the form ["upper bit" "lower bit"], with the lower bit value on the right. So the case of the lower bit being "0" and the upper bit being "1" is written as "10". One must understand that the selection of this terminology and notation is arbitrary, and other names and encodings are possible). Using this notation, the left-most state represents the case of "11". The other three states are typically assigned by the following order from left to right: "10", "00", "01". One can see an example of an implementation of an MBC NAND flash memory using this encoding in U.S. Pat. No. 6,522,580 to Chen, which patent is incorporated by reference for all purposes as if fully set forth herein. See in particular FIG. 8 of the Chen patent. U.S. Pat. No. 6,643,188 to Tanaka also shows a similar implementation of an MBC NAND flash memory, but see FIG. 7 there for a different assignment of the states to bit encodings: "11", "10", "01", "00". The Chen encoding is the one illustrated in FIG. 1B.

We extend the above terminology and notation to the cases of more than two bits per cell, as follows. The left-most unwritten state represents "all ones" ("1 . . . 1"), the string "1 . . . 10" represents the case of only the lowest bit of the cell being written to "0", and the string "01 . . . 1" represents the case of only the most upper bit of the cell being written to "0".

When reading an MBC cell's content, the range that the cell's threshold voltage is in must be identified correctly; only in this case this cannot always be achieved by comparing to only one reference voltage. Instead, several comparisons may be necessary. For example, in the case illustrated in FIG. 1B, to read the lower bit, the cell's threshold voltage first is compared to a reference comparison voltage $V_1$ and then, depending on the outcome of the comparison, to either a zero reference comparison voltage or a reference comparison voltage $V_2$. Alternatively, the lower bit is read by unconditionally comparing the threshold voltage to both a zero reference voltage and a reference comparison voltage $V_2$, again requiring two comparisons. For more than two bits per cell, even more comparisons might be required.

The bits of a single MBC cell may all belong to the same flash page, or they may be assigned to different pages so that, for example in a 4-bit cell, the lowest bit is in page 0, the next bit is in page 1, the next bit in page 2, and the highest bit is in page 3. (A page is the smallest portion of data that can be separately written in a flash memory). Both methods are in use. While the methods of the present invention are explained here in the context of the "each bit in its own page" approach, these methods also can be applied to the case of all bits residing in the same page.

As was shown above for the 2-bit MBC cell, there is more than one option in how to define the correspondence between the cell's threshold voltage states and the bit encodings they represent. Each such correspondence is equivalent to a specific ordering of the encoded bit patterns along the threshold voltage axis. We saw above that Chen and Tanaka, while disclosing very similar cell designs, used different assignments (and hence different orderings), both equally usable. The object of the current invention is to provide good orderings that are better than other orderings in some sense.

At first glance, one might think that every permutation of ordering all n-bit patterns should be considered for the n-bit MBC cell. The number of permutations of N elements is equal to N! ("N Factorial"). A cell with n bits has $2^n$ different bit patterns, and therefore has $2^n!$ permutations. So this would lead to the 2-bit cell having 4!=24 possible orderings, the 3-bit cell having 8!=40,320 possible orderings, and so on. However, there are restrictions put on the ordering because of the way the flash cells are programmed, and these restrictions reduce the number of orderings that can actually be used.

First, according to the conventions we defined above, the left-most state always corresponds to the "all ones" bit pattern. Second, assuming a design in which each bit resides in a different page, there are restrictions caused by the bits of a cell being written sequentially rather than all at once. One must remember that programming can only increase the threshold voltage of a cell, not reduce it. Reduction of the threshold voltage can only be done when erasing, but erasing can be applied only to large groups of cells ("blocks" in common terminology). Therefore, any ordering of the bit patterns that requires the threshold voltage to decrease when writing a bit to "0" cannot be used. Consider for example a 2-bit MBC cell. Suppose we selected the following order from left to right— "11", "00", "10", "01". Assume we first wrote the lower bit to "0", so the cell was brought to the "10" state. Now we want to write the upper bit to "0". This requires changing the threshold downward, from the state representing "10" to the state representing "00", but as we noted above, this is impossible to do in typical flash memories. Therefore we should select our ordering of bit patterns in a way that for every legal sequence of bit programming operations, it will never be required to reduce the threshold voltage. An ordering that satisfies these two restrictions is called herein a "valid" ordering. Similarly, an assignment of bit patterns to cell's states that results in a valid ordering is called herein a "valid" assignment.

It is common, in MBC flash memories that assign a cell's bits to different pages, to have a lower bit in a lower-numbered page and to require the user to write the pages in sequential order so that a lower-numbered page is written before a higher-numbered page. We use this practice in the explanations here, but one must understand that the methods of the present invention are equally applicable to other practices of assigning bits to pages and of ordering the writing of pages.

FIG. 2 shows a graphical representation of the restrictions applicable to the ordering of bit patterns in a 2-bit MBC cell. Each bit pattern is shown by its binary representation within a circle, and by its decimal representation outside the circle. Both numerical representations are equivalent, but it is more convenient to use the binary representation for understanding the ordering restrictions, and to use the decimal representation for talking about a certain pattern.

An arrow connecting two circles in FIG. 2 means that the state from which the arrow originates must precede the state to which the arrow points.

One can see in FIG. 2 that, as expected, "11" must be the first state. This is seen from the fact this state must precede all other states. Also, "10" must preceded "00", as shown above. Because of the simplicity of the 2-bit case, it is easy to realize there are only three orderings that satisfy all restrictions:

a. 11, 10, 00, 01 (this is what Chen used)
b. 11, 10, 01, 00 (this is what Tanaka used)
c. 11, 01, 10, 00

FIG. 3 shows the corresponding graphical representation for the case of 3-bit MBC cells, and FIG. 4 shows the corresponding graphical representation for the case of 4-bit MBC cells. Both cases are much more complex than the 2-bit case and allow many more valid orderings.

Let us find out how many legal orderings we have in each case. Consider first the 2-bit case (FIG. 2). As "11" always comes first, we ignore it and consider the equivalent question of how many options we have to put the other three patterns in the right-most three states, while satisfying the restrictions shown in FIG. 2. As "10" and "00" have a strict mandatory order between them, we start by selecting two positions out of the three for putting those two pattern. We designate the number of combinations of n elements taken k at a time as C(n,k), which is equal to $(n!)/((n-k)!)/(k!)$. In this case, k=2 and n=3, and the number of ways to put "10" and "00" in place is 3!/1!/2!=3. The last pattern ("01") must now be put in the only position left, so we are left with three legal orderings, as we already saw above.

Now let us move to the less trivial 3-bit cell (FIG. 3). We notice that after writing the lowest bit of a 3-bit cell, the other 2 bits (still unwritten) represent the same problem of ordering as a 2-bit cell. This can be seen in FIG. 3 by noticing that the "branch" containing {6,4,0,2} has exactly the same structure as the whole of FIG. 2. But we already know this problem has exactly three different solutions. So let us start the construction of an ordering by selecting positions for the four members of the {6,4,0,2} branch out of the seven available positions (recall that the all-ones pattern always has its left-most reserved position). There are C(7,4) ways of doing this. Each such way has three valid internal orderings of the branch members, so in total we have C(7,4)×3 ways of assigning these four patterns. Now for each such selection, we choose two of the three still unassigned positions for representing the {5,1} branch members. This can be done in C(3,2)=3 ways. The last pattern (3) must go into the only position left. The total product is C(7,4)×3×3=315 valid orderings for a 3-bit MBC cell.

We can make the calculation similarly for a 4-bit MBC cell (FIG. 4). The positions for the eight members of the {14,12, 10,6,8,4,2,0} branch can be selected in C(15,8) ways, each one to be multiplied by the 315 possible internal orderings we found above for the 3-bit case. Then we multiply again by 315, which is the number of arrangements we have for putting the remaining seven states into the remaining seven positions. The end result is C(15,8)×315×315=638,512,875. The number of valid orderings of yet larger numbers of bits is enormous.

The Appendices list 3-bit and 4-bit orderings along with analyses of these orderings, as described below. Appendix A lists all 315 3-bit orderings. Appendices B, C, D and E are partial lists of the 4-bit orderings.

The large number of possible bit orderings for MBC cells of more than 2 bits brings up the question which is the best one to use. U.S. Pat. No. 6,046,935 to Takeuchi proposes one method of constructing a bit patterns ordering for MBC cells. FIGS. 86A to 86C of Takeuchi apply the method to 3-bit cells. FIGS. 88A to 88D of Takeuchi apply the method to 4-bit cells. FIGS. 90A to 90E of Takeuchi show how to apply the method to the general M-bit case. However, as will be explained below, the method proposed by Takeuchi results in an ordering that is not optimal.

There is thus a widely recognized need for, and it would be highly advantageous to have, an optimal method of ordering the bits in an MBC cell.

SUMMARY OF THE INVENTION

According to the present invention there is provided a method of storing N input bits of data, including the steps of: (a) providing [N/M] cells, wherein M is at least 2; (b) interleaving the N input bits, thereby providing N interleaved bits; and (c) programming each cell with up to M of the interleaved bits.

According to the present invention there is provided a memory device including: (a) a memory that includes at least K cells; and (b) a controller operative to store N input bits of data in the cells by steps including: (i) interleaving the N input bits, thereby providing N interleaved bits, and (ii) programming each of K cells of the memory with up to M=[N/K] of the interleaved bits; wherein M is at least 2.

According to the present invention there is provided a system for storing data, including: (a) a memory device that includes a memory, the memory including at least K cells; (b) a host of the memory device, for providing N input bits of data to store; and (c) an interleaving mechanism for interleaving the N input bits, thereby providing N interleaved bits, each of K cells of the memory then being programmed with up to M=[N/K] of the interleaved bits; wherein M is at least 2.

According to the present invention there is provided a method of storing N data bits, including the steps of: (a) partitioning the N data bits among M input logical pages, wherein M is at least 2; (b) appending at least one redundancy bit to each input logical page, thereby providing $L \geq N+M$ input bits; (c) providing [L/M] cells; (d) interleaving the L input bits, thereby providing L interleaved bits; and (e) programming each cell with up to M of the interleaved bits. According to the present invention there is provided a memory device for storing N data bits partitioned among $M \geq 2$ logical pages, the memory device including: (a) a mechanism for appending at least one redundancy bit to each logical page, thereby providing $L \geq N+M$ input bits; (b) a memory that includes at least K=[L/M] cells; and (c) a controller operative to: (i) interleave the L input bits, thereby providing L interleaved bits, and (ii) program each of K cells of the memory with up to M of the interleaved bits.

According to the present invention there is provided a system for storing data, including: (a) a host that provides N data bits partitioned among M logical pages, wherein M is at least 2; (b) an error correction mechanism for appending at least one redundancy bit to each logical page, thereby providing $L \geq N+M$ input bits; (c) a memory device that includes a memory, the memory including at least K=[L/M] cells; and (d) an interleaving mechanism for interleaving the L input bits, thereby providing L interleaved bits, each of K cells of the memory then being programmed with up to M of the interleaved bits.

The first method of the present invention is a method of storing N input bits in K=[N/M] cells, with $M \geq 2$. (The notation "[x]" means the smallest integer that is at least as large as the real number x. For example, [3]=3 and [3.5]=4.) The N input bits are interleaved, and each cell is programmed with up to M of the interleaved bits.

Preferably, $M \geq 3$.

Preferably, the N input bits are partitioned among M logical pages, and the interleaving provides each bit-page of the [N/M] cells with substantially the same number of input bits from each logical page.

The interleaving may be either deterministic or random. In one preferable deterministic interleaving method, the N input bits are arranged in at least one M×M matrix and the matrix or matrices are transposed. In one variant of this deterministic interleaving method, each matrix element includes a single input bit. In another variant of this deterministic interleaving method, all N input bits are arranged in a single M×M matrix, and each matrix element includes $N/M^2$ bits.

Preferably, the method also includes the steps of reading the N interleaved bits from the cells and de-interleaving the N interleaved bits that have been read from the cells. Note that because of bit errors, the interleaved bits that are read from the cells may not all be identical to the interleaved bits that were written to the cells. The purpose of the interleaving and the de-interleaving is to distribute any such errors evenly among the bits.

A memory device of the present invention, for implementing the first method of the present invention, includes a memory with K cells and a controller that is operative to store N input bits of data in the cells by interleaving the N input bits, and then programming each cell with up to $M=[N/K] \geq 2$ of the interleaved bits.

Preferably, $M \geq 3$.

Preferably, the controller includes a mechanism for effecting the interleaving. In one class of preferred embodiments of the memory device of the present invention, this mechanism effects the interleaving by executing software. In another class of preferred embodiments of the memory device of the present invention, the controller includes dedicated hardware (as opposed to a general purpose processor that executes software) for effecting the interleaving. Alternatively, the memory includes such dedicated hardware.

Preferably, the memory is a flash memory.

A system of the present invention, for storing data, includes a memory device that includes a memory with K cells, and a host of the memory device that provides N input bits of data to be stored in the memory device. The system also includes a mechanism for interleaving the N input bits. Each cell then is programmed with up to $M=[N/K] \geq 2$ of the interleaved bits.

Preferably, $M \geq 3$.

In one class of preferred embodiments of the system of the present invention, the interleaving mechanism effects the interleaving by executing software. Such an interleaving mechanism may be included in the host, or alternatively may be included in a controller, of the memory, that is included in the memory device. In another class of preferred embodiments of the system of the present invention, the interleaving mechanism includes dedicated hardware. Such an interleaving mechanism may be included in the memory, or may be included in a controller, of the memory, that is included in the memory device.

Preferably, the memory is a flash memory.

The second method of the present invention is a method of storing N data bits. The N data bits are partitioned among $M \geq 2$ logical pages. At least one redundancy bit is appended to each logical page, giving a total of $L \geq N+M$ input bits. The L input bits are interleaved, and each of $[L/M]$ cells is programmed with up to M of the interleaved bits.

Preferably, $M \geq 3$.

Preferably, if each cell has a state transition probability P, then the number of redundancy bits appended to each logical page is selected in accordance with an error probability of about P/M.

Preferably, the interleaved bits are read back from the cells and are de-interleaved, thereby providing M logical pages of de-interleaved bits. Each logical page of the de-interleaved bits includes at least one error correction bit. Because of bit errors, the bits that are read back from the cells may not be identical to the bits with which the cells were programmed. Each logical page of de-interleaved bits is corrected in accordance with its error correction bits.

A memory device of the present invention, for implementing the second method of the present invention to store N data bits partitioned among $M \geq 2$ logical pages, includes a mechanism for appending at least one redundancy bit to each logical page to give a total of $L \geq N+M$ input bits, a memory with at least $K=[L/M]$ cells and a controller that is operative to interleave the L input bits and to program each of the K cells with up to M of the interleaved bits. Preferably, the mechanism that appends the redundancy bits is part of the controller. Preferably, $M \geq 3$.

A system of the present invention, for implementing the second method of the present invention, includes a memory device, a host of the memory device, an error correction mechanism and an interleaving mechanism. The host provides N data bits partitioned among $M \geq 2$ logical pages. The error correction mechanism appends at least one redundancy bit to each logical page to give a total of $L \geq N+M$ input bits. The memory device includes a memory with at least $K=[L/M]$ cells. The interleaving mechanism interleaves the L input bits. Each of K of the cells then is programmed with up to M of the interleaved bits. Preferably, $M \geq 3$.

BRIEF DESCRIPTION OF THE DRAWINGS

The invention is herein described, by way of example only, with reference to the accompanying drawings, wherein.

DESCRIPTION OF THE PREFERRED EMBODIMENTS

The present invention is of a method of programming multi-bit flash cells. The principles and operation of a multi-bit-cell flash memory device according to the present invention may be better understood with reference to the drawings and the accompanying description.

Bit Ordering for Efficient Reading

We now consider the question of what is a good ordering of the bit patterns in an M-bit MBC cell. There is no one clear-cut criterion to use for deciding what is "best". Instead we present several different criteria to choose from. The best criterion to use in an actual design depends upon the requirements of the overall storage system, as is made clear in the discussion below.

We base our evaluation of orderings on the number of comparison operations required for reading the bits contained in an MBC cell. As already explained above, an SBC cell requires just one comparison of its threshold voltage value against a reference in order to determine the cell's data contents. A 2-bit MBC cell may require two comparisons. Cells with more bits generally require more than two comparisons.

We distinguish between two methods of using comparisons in the reading process: static reading and dynamic reading.

Figure 1A:
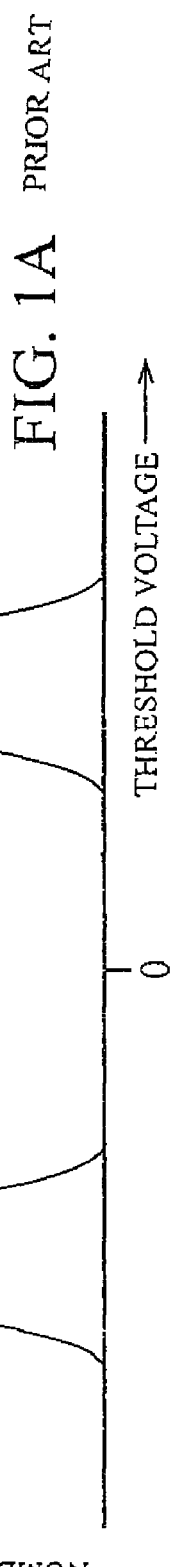
FIGS. 1A-1D show threshold voltage distributions in a one-bit flash cell, a two-bit flash cell, a three-bit flash cell and a four-bit flash cell.
Figure 1B:
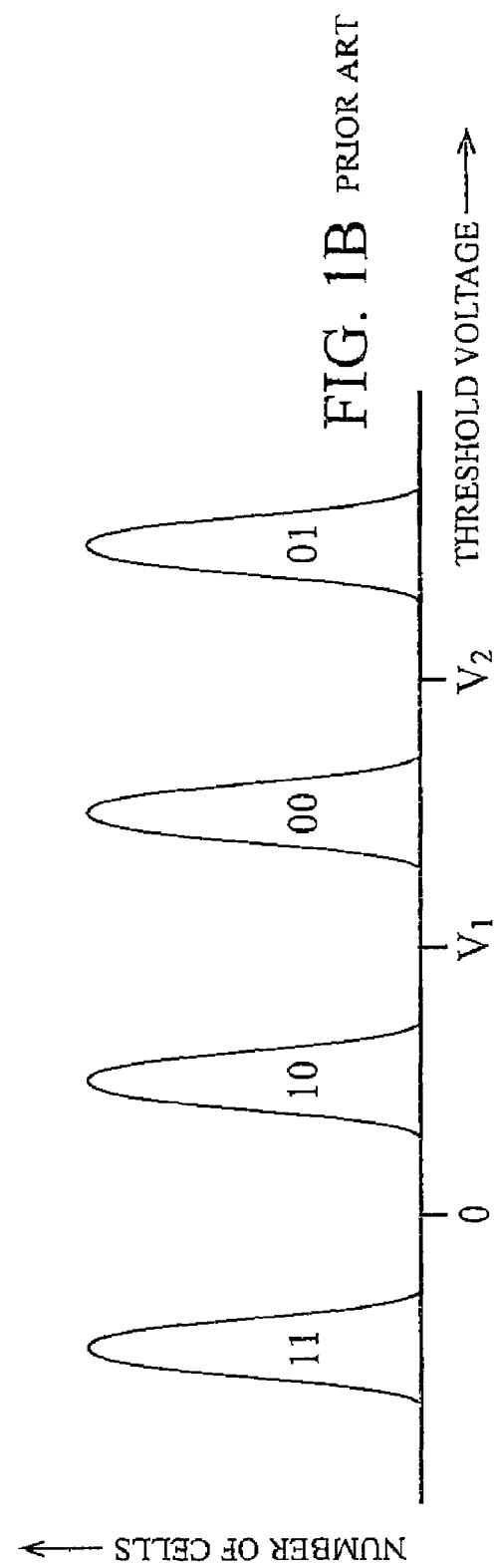

In static reading, all reference voltage values used during the reading process are fully determined prior to starting the reading. Such reading can be implemented either by using one comparator that does all comparisons one by one by changing the reference voltage value to which it compares a cell's threshold voltage, or by using a number of comparators equal to the number of comparisons (in which case all comparators may operate in parallel). It is also possible to use an intermediate scheme in which the number of comparators is less than the number of comparisons but greater than one, thereby providing be some parallelism in the process. All such implementations are considered static methods for the purpose of this invention, as long as all reference values are fully determined prior to reading. For example, reading the lower bit of the 2-bit MBC cell whose encoding is as shown in FIG. 1B by always comparing to both 0 and $V_2$ is a static reading method that uses two comparisons.

In dynamic reading, at least one reference voltage value used during the reading process is determined based on the result of a previous comparison done during the same reading operation. For example, reading the lower bit of the 2-bit MBC cell whose encoding is as shown in FIG. 1B by first comparing to $V_1$, and then depending on the outcome of that comparison, comparing to either 0 or $V_2$, is a dynamic reading method that uses two comparisons.

The number of comparisons required for reading a single bit using static reading depends on the way the value of the bit changes when moving from state to state along the threshold voltage axis. As a first example let us consider the 2-bit MBC case with the ordering of $\{3,2,0,1\}$. In binary notation, that ordering is $\{11,10,00,01\}$. (Note that in the appended claims, decimal notation is used for bit orderings.) Now we separate the bits, each into its own sequence. When we move along the states from left to right the lower bit passes through the values $\{1,0,0,1\}$ while the upper bits passes through $\{1,1,0,0\}$. It is easy to see that we can determine the value of the upper bit by just a single comparison, with the reference value positioned to separate between the two left states and the two right states. The lower bit, however, cannot be determined by any single comparison; the best we can do is to use two comparisons (one separating the left-most state from all other states, and one separating the right-most state from all other states).

If, however, the ordering of states is $\{3,2,1,0\}=\{11,10,01,00\}$, then the lower bit sequence is now $\{1,0,1,0\}$ and the upper bit sequence is again $\{1,1,0,0\}$. So using this ordering the lower bit requires three comparisons and the upper bit requires one comparison.

The third and last valid 2-bit ordering is $\{3,1,2,0\}=\{11,01,10,00\}$, giving $\{1,1,0,0\}$ for the lower bit and $\{1,0,1,0\}$ for the upper bit. This translates to one comparison for the lower bit and three comparisons for the upper bit.

It is easy to realize that the number of comparisons required for reading a single bit using static reading is equal to the number of transitions the bit incurs when traversing all states along the threshold voltage axis from left to right. {1,1,0,0} has just one transition and requires one comparison, while {1,0,1,0} has three transitions and requires three comparisons.

The same rules also apply to reading a cell with more than two bits. For example, a 3-bit cell with the ordering {7,6,2,4,0,5,3,1}={111,110,010,100,000,101,011,001} produces the sequence {1,0,0,0,0,1,1,1} for the lower bit, {1,1,1,0,0,0,1,0} for the middle bit, and {1,1,0,1,0,1,0,0} for the upper bit. The numbers of transitions (and therefore the number of comparisons) are 2 for the lower bit, 3 for the middle bit and 5 for the upper bit.

The number of comparisons required for reading a single bit using dynamic reading also depends on the number of transitions the bit incurs when traversing all states along the threshold voltage axis from left to right, but in a different way than for static reading. For dynamic reading, the number of comparisons is the logarithm to base two of the number of transitions plus one, rounded up. For example, for a 2-bit MBC cell with the ordering of {3,2,0,1}={11,10,00,01} and bit sequences of {1,0,0,1} (two transitions) and {1,1,0,0} (one transition), the numbers of comparisons are two and one, respectively. Note that the ordering of {3,2,1,0}={11,10,01,00} with the bit sequences of {1,0,1,0} (three transitions) and {1,1,0,0} (one transition) also results in two and one comparisons, respectively, even though its number of transitions is different.

Again, the same rules also apply for cells with more than two bits each. For example, reading a 3-bit cell with the ordering {7,6,2,4,0,5,3,1}={111,110,010,100,000,101,011,001} that produces the bit sequences {1,0,0,0,0,1,1,1} (two transitions), {1,1,1,0,0,0,1,0} (three transitions), and {1,1,0,1,0,1,0,0} (five transitions), requires two, two and three comparisons, respectively.

Appendix A lists all the valid orderings for the 3-bit case. Each of the 315 orderings has one line in the table, showing the sequences for each of the three bits, the number of static reading comparisons for each bit (the three columns under the heading "static comp"), and the number of dynamic reading comparisons for each bit (the three columns under the heading "dynamic comp"). Also shown are the total, minimum and maximum numbers for each of the two reading methods, statistics that are referenced in the discussion below.

We now investigate several criteria for selecting the ordering of bit patterns in an MBC cell. These criteria all relate to the number of comparisons required for reading. Generally speaking, the fewer comparisons to be done the better. A higher number of comparisons implies either a longer time for completing the operation (if using a single comparator) or a larger number of comparators (or both).

Criterion A. Minimize the Number of Comparisons for Sequentially Reading all the Bits in a Cell (that is, Reading the Bits One by One and not in One Operation), Using Static Reading In a cell that uses static reading with a single comparator, the time required for sequentially reading all the bits of a cell increases as the sum of the number of comparisons of all bits. Therefore a good criterion for selecting an ordering is to minimize the sum of comparisons of all bits.

Looking at the results above, we see that for the 2-bit case we get a total of three comparisons for {3,2,0,1} and four comparisons for the other two alternatives. Therefore {3,2,0,1} provides the fastest sequential reading of all bits of a cell, and is thus optimal according to this criterion.

Figure 1C:
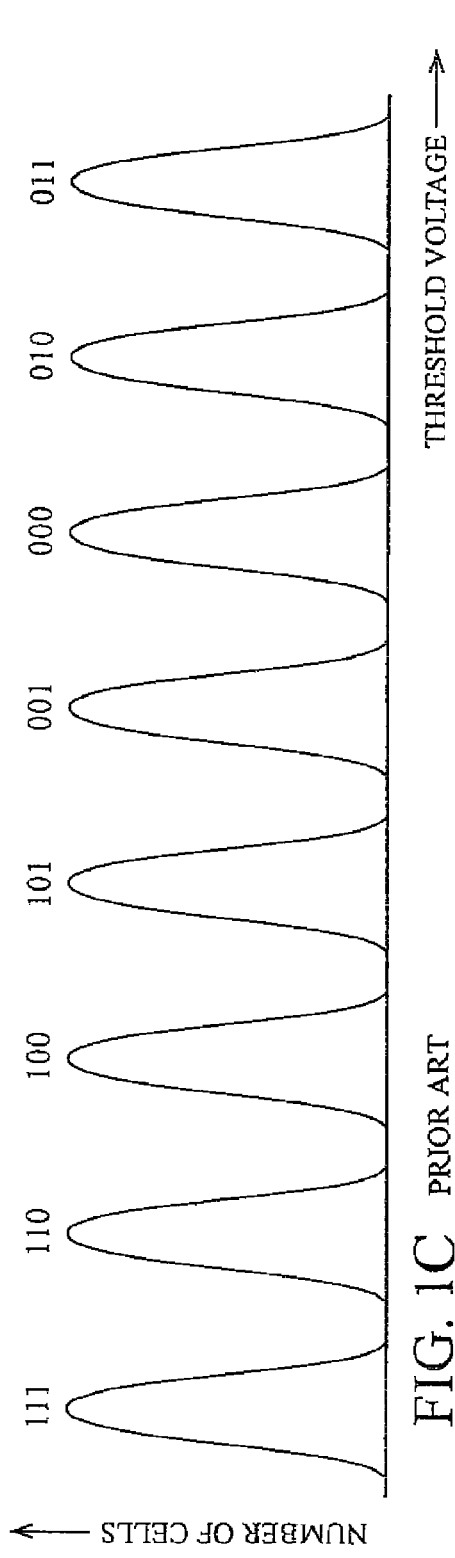

For the 3-bit case, we see in Appendix A that there are two optimal orderings with a total of seven comparisons ({7,6,4,5,1,0,2,3} and {7,6,4,5,1,3,2,0}). The encoding illustrated in FIG. 1C corresponds to the {7,6,4,5,1,0,2,3} ordering. There also are 15 orderings that have a total of eight comparisons, which is close to optimal.

Figure 1D:
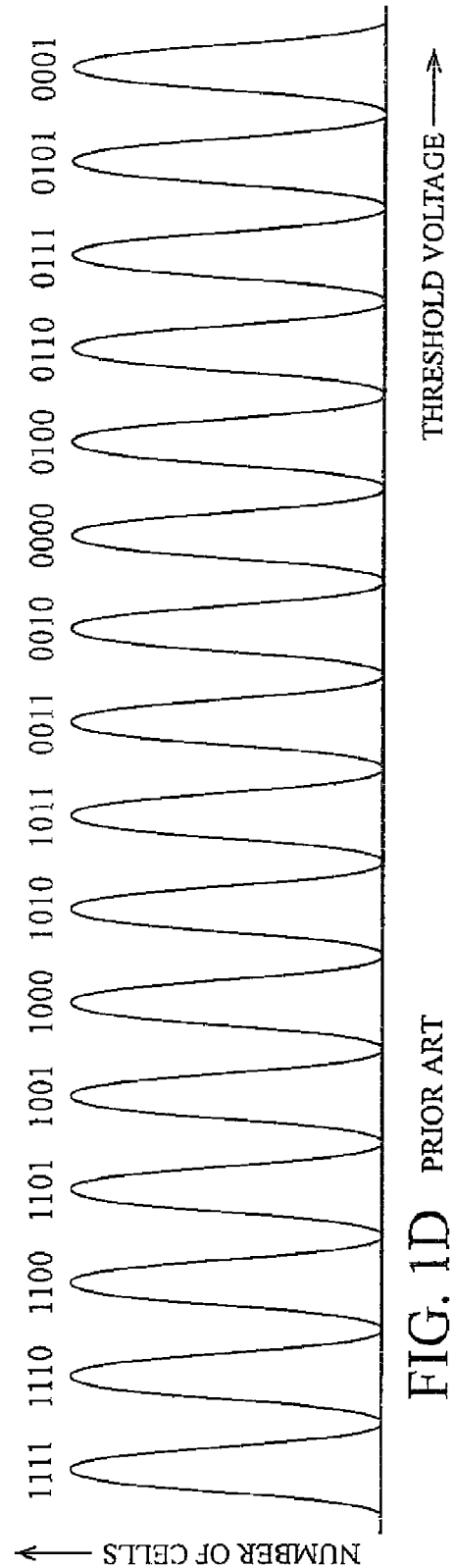

For the 4-bit case, the 36 orderings listed in Appendix B are optimal according to this criterion. Each such ordering has a total of 15 comparisons. The encoding illustrated in FIG. 1D corresponds to the first of these orderings, {15,14,12,13,9,8,10,11,3,2,0,4,6,7,5,1}.

Criterion B. Minimize the Maximum Number of Comparisons for Reading a Single Bit of a Cell Using Static Reading In a cell that uses static reading with a single comparator, the maximum time required for reading any bit of a cell increases with the maximum number of comparisons of any bit. Therefore a good criterion for selecting an ordering is to minimize the maximum number of comparisons for any bit.

For the 2-bit case this maximum number is two for {3,2,0,1} and three for the other two alternatives. Therefore {3,2,0,1} is optimal according to this criterion too.

For the 3-bit case, Appendix A lists ten optimal orderings under this criterion, with a maximum number of comparisons of three: {7,6,2,4,5,1,3,0}, {7,6,2,4,5,3,1,0}, {7,6,4,2,3,5,1,0}, {7,6,4,0,2,3,5,1}, {7,6,4,0,5,1,3,2}, {7,6,4,5,1,3,2,0}, {7,6,5,1,3,2,4,0}, {7,5,6,2,3,1,4,0}, {7,3,6,4,5,1,2,0} and {7,3,6,4,5,1,0,2}.

A complete enumeration of all valid 4-bit orderings shows that the minimum for this criterion is five comparisons. Some of these orderings are listed in Appendix B.

Criterion C. Minimize the Minimum Number of Comparisons for Reading a Single Bit of a Cell Using Static Reading In a cell that uses static reading with a single comparator, the minimum time required for reading any bit of a cell increases with the minimum number of comparisons of any bit. Therefore a good criterion for selecting an ordering is to minimize the minimum number of comparisons for any bit.

For the 2-bit case this minimum number is one, and is the same for all three valid orderings. For the 3-bit case Appendix A shows that the best minimum number is again one, but there are many orderings that result in a higher minimum number, meaning a slower reading operation.

A complete enumeration of all valid 4-bit orderings shows that the minimum for this criterion for the 4-bit case also is one comparison. Some of these orderings are listed in Appendix B.

The method of Takeuchi mentioned above results in an ordering that gives the upper bit only one comparison (note that Takeuchi uses a terminology that is the opposite of the one we use: he calls the first bit that is written into the cell "the upper bit" and not "the lower bit". We continue to use our terminology when discussing Takeuchi method). This implies that the Takeuchi method may be considered optimal in this sense. However, the Takeuchi method is based on assigning the states in a very simple and straight-forward manner—writing the first bit brings the threshold to one of the two left-most states, writing the second bit brings the threshold to one of the four left-most states, writing the third bit brings the threshold to one of the eight left-most states, and writing the n-th bit brings the threshold to one of the $2^n$ left-most bits. The way this is done (see FIGS. 90A to 90E in Takeuchi) always results in the trivial serial ordering in which we start with the highest value for the left-most state and go down by one on each move to the right. For example, the Takeuchi ordering for the 3-bit case is {7,6,5,4,3,2,1,0}, and the Takeuchi ordering for the 4-bit case is {15,14,13,12,11, 10,9,8,7,6,5,4,3,2,1,0}.

Such an ordering requires one comparison for the last bit to be written into the cell, three comparisons for the next-to-last bit, seven comparisons for the third bit from the end, and $2^n-1$ comparisons for the n-th bit from the end. While it is true the Takeuchi ordering provides one bit with only one comparison, the first bit to be written into the cell has the highest number of comparisons possible (seven for the 3-bit case, 15 for the 4-bit case). This creates a large difference in the reading time of different bits of the cell and is not desirable, and therefore such ordering is not considered optimal in spite of having one bit with the minimal number of comparisons.

We use herein the term "serial assignment" for referring to an assignment that results in an ordering such as Takeuchi, having the form $\{2^M-1, 2^M-2, \ldots, 4,3,2,1,0\}$. The corresponding bit ordering is called herein a "serial" bit ordering. All other orderings are called "nonserial" herein.

Criterion D. Achieve Equal Number of Comparisons for Reading a Single Bit of a Cell (Regardless which Bit is Read) Using Static Reading In a cell that uses static reading with a single comparator, it might be beneficial to have all bits being read using the same number of comparisons, so as to provide the same response time regardless of which bit is being read. Therefore a good criterion for selecting an ordering is to achieve the same number of comparisons for all bits.

For the 2-bit case no ordering satisfies this criterion. For the 3-bit case Appendix A shows that there are four orderings in which all bits require three comparisons: {7,6,2,4,5,1,3,0}, {7,6,2,4,5,3,1,0}, {7,6,4,2,3,5,1,0} and {7,6,5,1,3,2,4,0}.

Obviously, there can be no 4-bit ordering with a total of 15 comparisons in which all bits have the same number of comparisons, because 15 is not divisible by 4. Appendix C lists all 4-bit valid orderings with a total of 16 comparisons in which the difference between the lowest and highest bit is not more than two comparisons, and we see that even in this case there is no valid ordering which satisfies this optimization criterion. The best that can be achieved is a difference of two comparisons between the bit with the lowest number of comparisons and the bit with the highest number of comparisons. Actually, if there is a strong desire to get as close as possible to an equal spread of comparisons over all bits, one would do better to choose a 17-comparison 4-bit ordering. Appendix D lists all valid orderings with a total of 17 comparisons in which the difference between the lowest and highest bit is not more than one comparison, and one can see that there are really orderings in which the difference between lowest and highest is only one comparison, resulting in more constant reading response time than can be achieved with either a 15-comparison ordering or a 16-comparison ordering.

Criterion E. Minimize the Number of Comparisons for Sequentially Reading all Bits in a Cell Using Dynamic Reading This is the equivalent of criterion A, but for dynamic reading.

For the 2-bit case, all valid orderings result in the same number of comparisons and therefore there is no one optimal ordering.

For the 3-bit case, Appendix A shows that there is one optimal ordering ({7,6,4,5,1,3,2,0}), with a total of five comparisons. There also are many orderings with a total of six comparisons.

A complete enumeration of all valid 4-bit orderings shows that the minimum for this criterion for the 4-bit case is nine comparisons. Some of these orderings are listed in Appendix B.

Criterion F. Minimize the Maximum Number of Comparisons for Reading a Single Bit of a Cell Using Dynamic Reading This is the equivalent of criterion B, but for dynamic reading.

For the 2-bit case, all valid orderings result in the same number of comparisons (two) and therefore there is no one optimal ordering.

For the 3-bit case, Appendix A shows that there are ten optimal orderings with a maximum number of comparisons of two: {7,6,2,4,5,1,3,0}, {7,6,2,4,5,3,1,0}, {7,6,4,2,3,5,1, 0}, {7,6,4,0,2,3,5,1}, {7,6,4,0,5,1,3,2}, {7,6,4,5,1,3,2,0}, {7,6,5,1,3,2,4,0}, {7,5,6,2,3,1,4,0}, {7,3,6,4,5,1,2,0} and {7,3,6,4,5,1,0,2}.

A complete enumeration of all valid 4-bit orderings shows that the minimum for this criterion for the 4-bit case is three comparisons. Some of these orderings are listed in Appendix B.

Criterion G. Minimize the Minimum Number of Comparisons for Reading a Single Bit of a Cell Using Dynamic Reading This is the equivalent of criterion C, but for dynamic reading.

For the 2-bit case, all valid orderings result in the same minimum number of comparisons (one) and therefore there is no one optimal ordering.

For the 3-bit case, Appendix A shows that the best minimum number is again one, but there are many orderings that result in a higher minimum number, meaning a slower reading operation.

A complete enumeration of all valid 4-bit orderings shows that the minimum for this criterion for the 4-bit case is one comparison. Some of these orderings are listed in Appendix B.

Criterion H. Achieve Equal Number of Comparisons for Reading a Single Bit of a Cell (Regardless Which Bit is Read) Using Dynamic Reading This is the equivalent of criterion D, but for dynamic reading.

For the 2-bit case no ordering satisfies this criterion. For the 3-bit case, Appendix A shows that there are nine orderings in which all bits require two comparisons: {7,6,2,4,5,1,3,0}, {7,6,2,4,5,3,1,0}, {7,6,4,2,3,5,1,0}, {7,6,4,0,2,3,5,1}, {7,6, 4,0,5,1,3,2}, {7,6,5,1,3,2,4,0}, {7,5,6,2,3,1,4,0}, {7,3,6,4,5, 1,2,0} and {7,3,6,4,5,1,0,2}.

Appendix E lists some valid 4-bit orderings for which the difference between the largest number of comparisons and the smallest number of comparisons is 1.

One point of clarification should be added to the definition of the concept of valid allocations and valid orderings. It is assumed above that any intermediate step resulting from programming only some of the bits of a cell (but not all) is identical to the state that would be created if the still not written bits will be written as "1". In other words, programming the last bits of a cell to "1" is actually "doing nothing" but keeping the cell's state unchanged. This is really a convenient way to implement the cell, and this is how typical MBC cells are currently built. However, it is possible to design an MBC cell a bit differently. If we assume the cell is always programmed with the full number of bits it can store, we can rely on the last programming operations to shift the state (the threshold voltage) even if a "1" is to be programmed. This means, for example, that a 4-bit MBC that was programmed with three "0" bits and is waiting to be programmed with the fourth bit will have a different state than the same cell after being programmed with "0001". In such a design either we do not allow not programming all bits, or we devise a different reading scheme for reading cells that were not "filled" with all bits.

Figure 2:
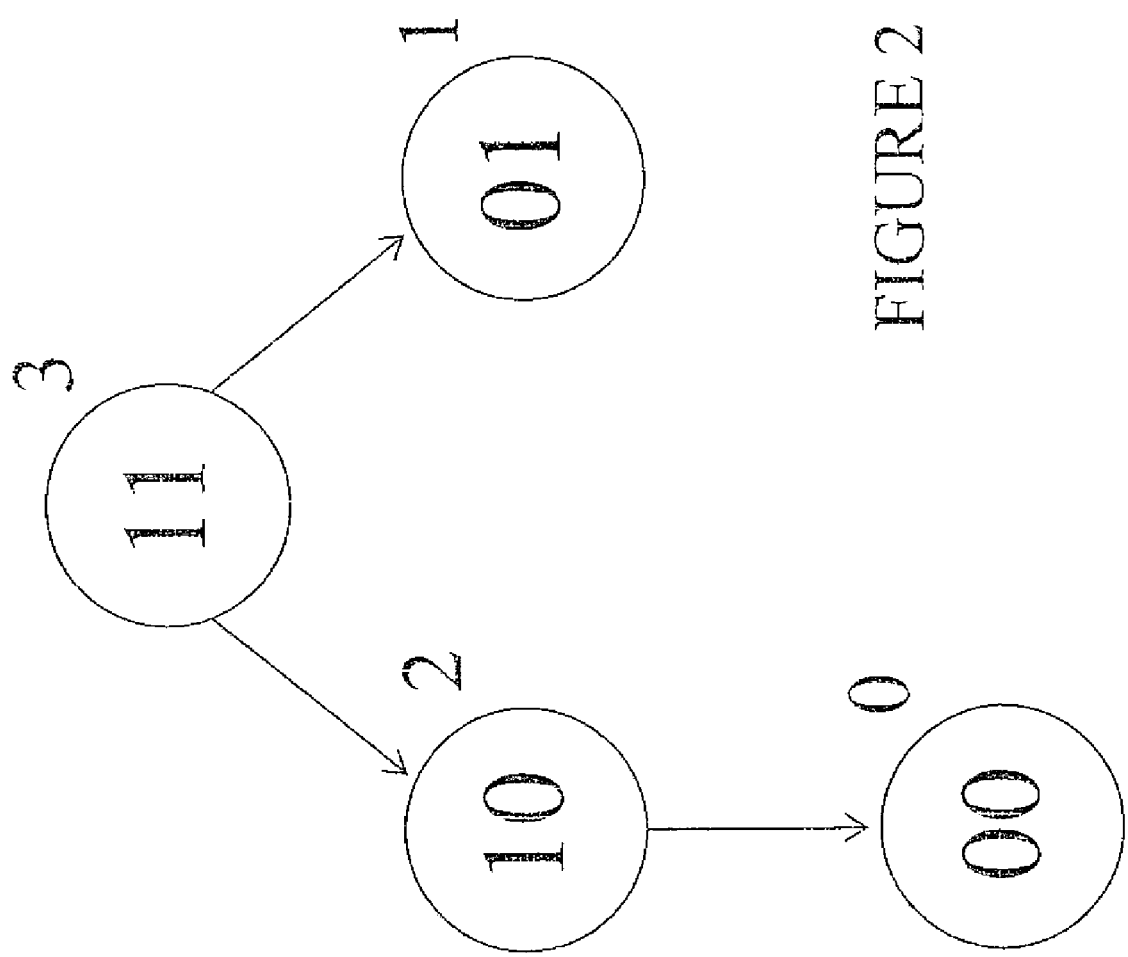
FIG. 2 is a precedence tree for programming a two-bit cell.
Figure 3:
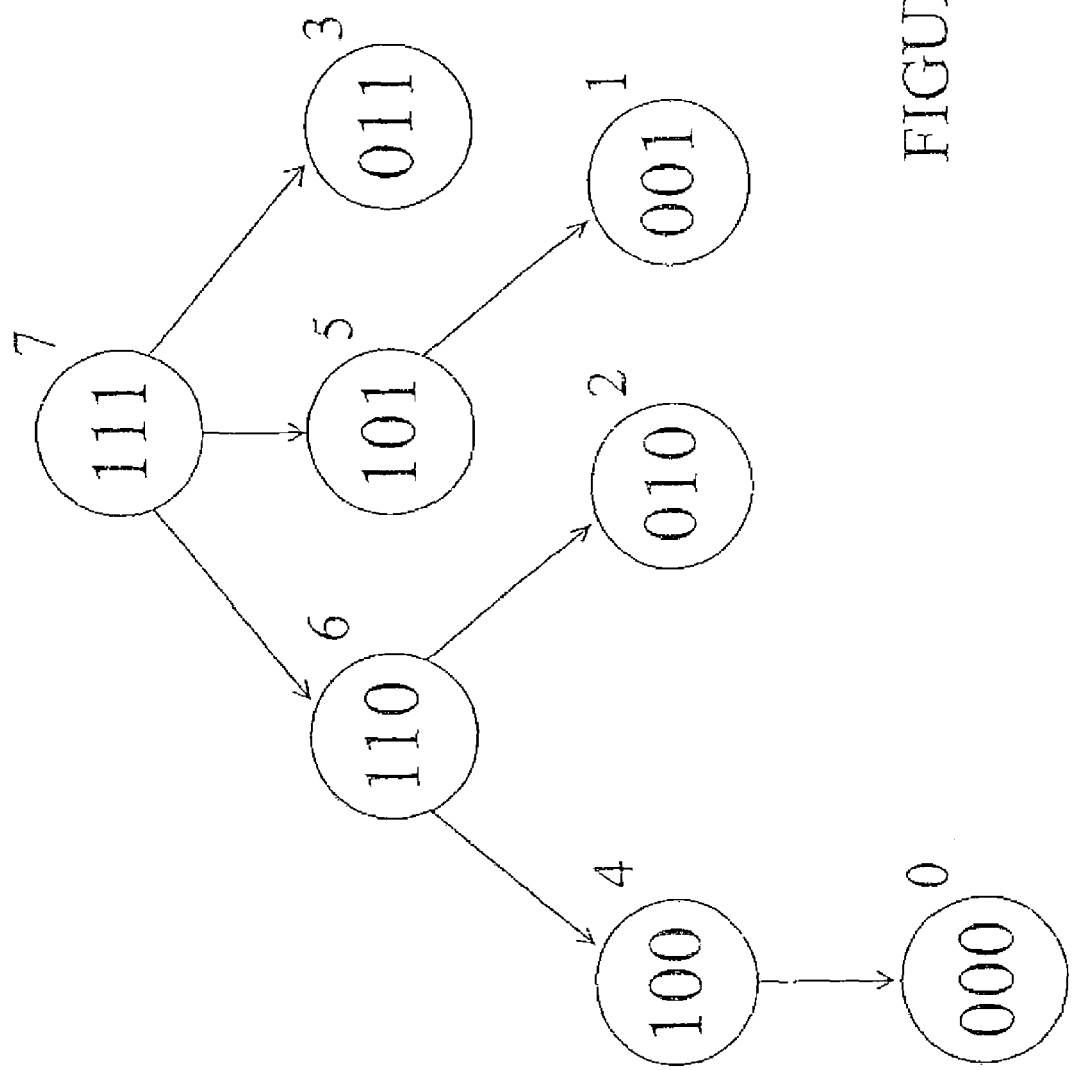
FIG. 3 is a precedence tree for programming a three-bit cell.
Figure 4:
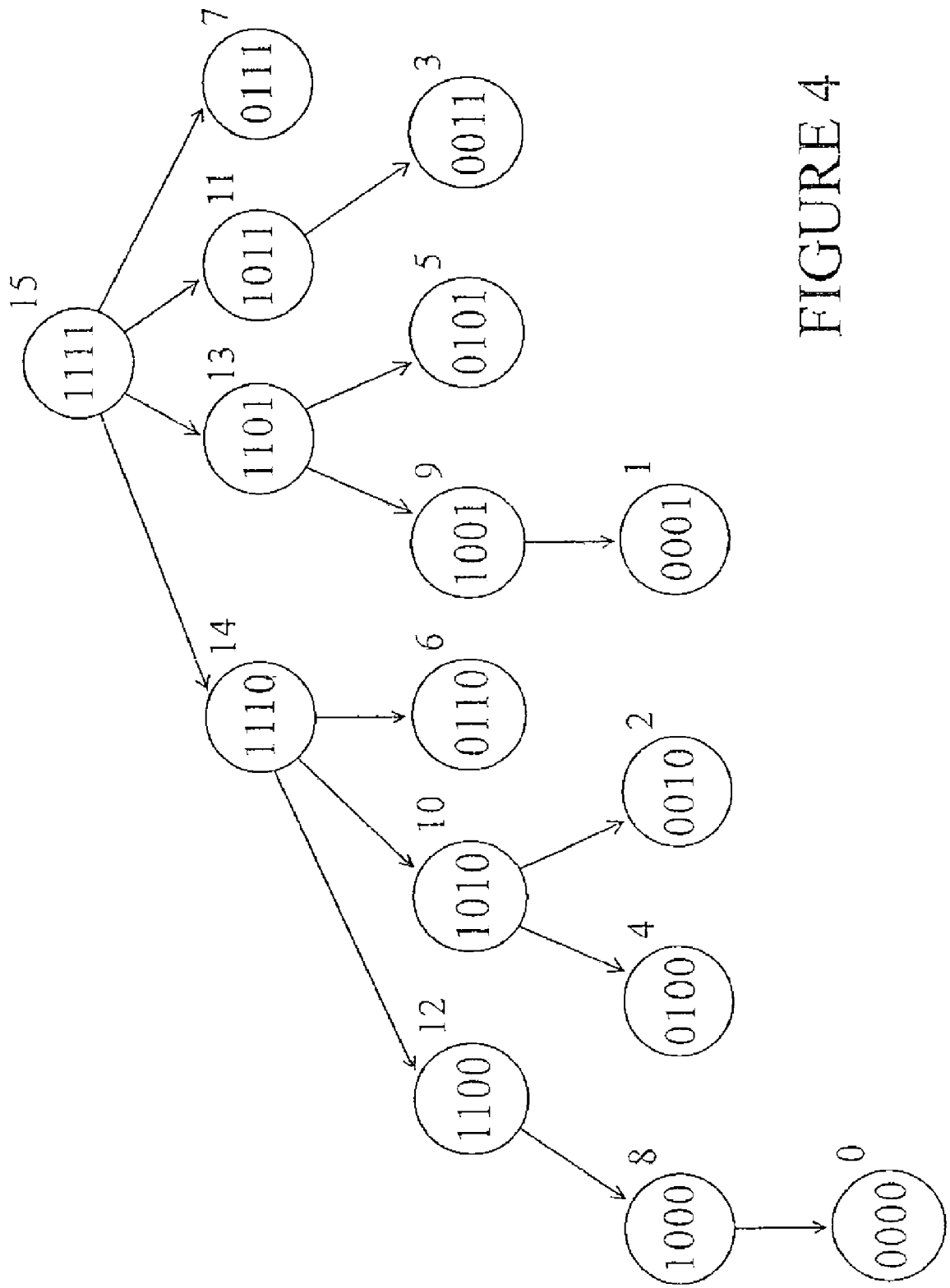
FIG. 4 is a precedence tree for programming a four-bit cell.

FIGS. 2-4, as well as the examples and explanations above, all assume the first implementation. For the second implementation it is still not allowed to decrease the threshold voltage (that is—to move left on the voltage axis) when programming each bit, but there may be more flexibility in the sense that transitions that are impossible in the first implementation are possible in the second one. Therefore the concept of "validity" still is applicable, but the exact rules of which ordering or allocation is valid and which is not may be different. Unlike the first implementation, to which the precedence trees of FIGS. 2-4 apply, it is not possible here to draw similar generic diagrams, as the rules depend on the exact way the intermediate states are defined. The more to the right an intermediate state is, the fewer transitions from it remain valid.

It should be understood that all the methods of the first implementation of the present invention are equally applicable to the second implementation, except that the validity of an allocation or ordering must be checked against its specific transition rules and not against FIGS. 2-4.

Bit Ordering to Minimize Errors

Criteria A-H relate to performance issues. However, it may be the case that reliability issues are much more important than performance. In such case one should optimize the selection of the allocation and encoding according to its influence on the number and distribution of expected bit errors when reading the data stored in the cell. The following embodiment of the present invention attains this end.

When reading the values of the bits previously stored in an MBC cell we are attempting to find out in which of the voltage bands is the cell located. After the band is found, it is converted into the corresponding bits represented by that band according to the allocation and ordering used when writing the cell. It might happen that an error had occurred and the cell's state was changed since it was written. The most common source of such an error in a flash cell is the leakage of electrons stored in the cell's floating gate. This will typically result in the threshold voltage of the cell shifting a bit, resulting in the cell moving from the band it was written into to another band. There are also other error mechanisms in flash cells, for example disturbances of various kinds (e.g. write disturb, read disturb) in which an operation that is not intended to change the state of a certain cell unintentionally changes the state of that cell because of side-effects of the signals and voltages applied to neighboring cells or to the same cell.

Extensive tests of statistics of flash MBC errors have shown that the overwhelming majority of errors involve the shift of the cell's state by one band along the voltage axis. For example, assuming the 2-bit MBC of FIG. 1B, a cell programmed to the "00" state might eventually be read to be in the immediately neighboring "01" or "10" states, but almost never in the "11" state that is two states away from the written state. Similarly, in a 4-bit MBC whose states ordering is {15,14,12,13,9,8,10,11,3,2,0,4,6,7,5,1} if the cell was written to state 3 we can expect the most common errors to bring it to either state 11 or state 2, both of which are the immediate neighbors of state 3. Only rarely does an error lead to reading the cell as being in any of the other 13 states.

Let us investigate the effect of such an error in which a cell is read in a different state than the one it was written in. We start with the simple case of the 2-bit MBC of FIG. 1B. If the written state was "00" and the read state is "01", we shall correctly report the upper bit to be "0" but the lower bit will be wrong: we shall get a "1" instead of "0". If the written state was "00" and the read state is "10", we shall correctly report the lower bit to be "0" but the upper bit will be wrong: we shall get a "1" instead of "0". We are not exploring the implications of a "00" to "11" error because, as we explained above, this 2-states-away error is rare.

The above argument could lead us to the conclusion that each error in reading the cell's state results in one bit being wrong. However, this is an incorrect conclusion. Let us examine a 2-bit MBC using the ordering of Tanaka ({11,10,01, 00}). Suppose the physical phenomenon is exactly the same as in the previous example—the cell was written to be in the third state from the left and ended up being in the second state from the left. In the previous example this meant a transition from "00" to "10". However, in this case there is a different bit assignment which makes this error correspond to a shift from "01" to "10". What we end up with are errors in both lower and upper bits—the lower bit is reported as "0" instead of "1" and the upper bit is reported as "1" instead of "0". So we see that the selection of bit allocation and ordering has an influence on the number of bit errors we shall get when reading the stored data.

Let us now look at the more complicated case of a 4-bit MBC. Consider a 4-bit cell using the serial ordering of {15, 14,13,12,11,10,9,8,7,6,5,4,3,2,1,0}. Suppose the cell was written as "0" and read as "1". This means we wrote "0000" and read "0001". So the lowest bit is in error but the other three bits are still correct. One state error was translated into one bit error. This seems a good result, so is this specific ordering a good one? Suppose now the cell was written as "1" and read as "2". This means we wrote "0001" and read "0010". So now the two lowest bits are in error, while the two upper bits are correct. One state error was translated into two bit errors. This certainly raises questions about the optimality of this ordering, so let us continue the analysis. Suppose the cell was written as "3" and read as "4". This means we wrote "0011" and read "0100". Now all three lowest bits are in error, leaving only the upper bit correct. One state error was translated into three bit errors, certainly not a good result. But we are not finished yet. Suppose the cell was written as "7" and read as "8". This means we wrote "0111" and read "1000". Now all four bits are incorrect. One state error was translated into four bit errors, showing that the serial ordering is not a good one when considering the storage bit error rate.

To see that such "error amplification" is not inevitable and there really are orderings that are better than the serial ordering, let us return to the {15,14,12,13,9,8,10,11,3,2,0,4,6,7,5, 1} ordering already mentioned above. By trying out each and every one-state-away error we verify the following fact: each state error results in exactly one bit error. Let us write down all the possible state transitions to show this fact:

i. 15<-->14, "1111"<-->"1110", only lowest bit affected ii. 14<-->12, "1110"<-->"1100", only second lowest bit affected iii. 12<-->13, "1100"<-->"1101", only lowest bit affected
iv. 13<-->9, "1101"<-->"1001", only second highest bit affected
v. 9<-->8, "1001"<-->"1000", only lowest bit affected
vi. 8<-->10, "1000"<-->"1010", only second lowest bit affected
vii. 10<-->11, "1010"<-->"1011", only lowest bit affected
viii. 11<-->3, "1011"<-->"0011", only highest bit affected
ix. 3<-->2, "0011"<-->"0010", only lowest bit affected
x. 2<-->0, "0010"<-->"0000", only second lowest bit affected
xi. 0<-->4, "0000"<-->"0100", only second highest bit affected
xii. 4<-->6, "0100"<-->"0110", only second lowest bit affected
xiii. 6<-->7, "0110"<-->"0111", only lowest bit affected
xiv. 7<-->5, "0111"<-->"0101", only second lowest bit affected
xv. 5<-->1, "0101"<-->"0001", only second highest bit affected It is important to understand that what we are comparing are different orderings over the same physical cells. The physical phenomena which are the source of the errors are not affected by how we interpret the states to represent bits. The number of cells that end up being in an incorrect state is dictated by the laws of physics and not by the bit assignments. Nevertheless, the same physical fact of a given number of erroneous cells translates into different numbers of erroneous bits depending on the way the bits were allocated to the physical states. So a flash memory designer has an influence on the bit error rate of the data and can reduce the number of bit errors using an appropriately optimized bit allocation.

As it is obvious that each error in a cell's state must generate at least one bit error (or otherwise two different states would represent exactly the same bits), we conclude that the above {15,14,12,13,9,8,10,11,3,2,0,4,6,7,5,1} ordering is optimal in this sense. We define an ordering to be "error-rate optimal" if it satisfies the condition that every error in reading the cell's state that results in reading an incorrect state that is one state away from the correct state generates exactly one bit error. It is easy to identify such an ordering: when looking at the ordering as a sequence of binary numbers, the difference between any two directly adjacent numbers is limited to one bit position. Any ordering satisfying this condition is error-rate optimal, and any ordering that is error-rate optimal must have this feature. This type of binary coding is well known in the mathematical literature and is called a "Gray code", after the inventor of U.S. Pat. No. 2,632,058, which patent is incorporated by reference for all purposes as if fully set forth herein.

There is another way to look at the above error rate optimality condition that is sometimes easier to work with, based on the notion of "transitions" as defined above. As we saw above, the number of bit errors generated in a certain bit position of a cell depends on the way the value of the bit changes when moving from state to state along the threshold voltage axis. As a first example let us consider the 2-bit MBC case with the ordering of {3,2,0,1}. Writing that same ordering using binary notation provides {11,10,00,01}. Now we separate the bits, each into its own sequence. When we move along the states from left to right the lower bit passes through the values {1,0,0,1} while the upper bits passes through {1,1,0,0}. It is easy to see that whenever there is a transition in the sequence of a bit, this bit will be in error if a state error occurs at that position. For example, if a state error moves this 2-bit cell between the second and third states, the lower bit will not be in error (no transition at this point in {1,0,0,1}) but the upper bit will be in error (there is a transition at the middle of {1,1,0,0}). Similarly, let us look at a 3-bit cell with the ordering {7,6,2,4,0,5,3,1}={111,110,010,100,000,101,011,001} that produces the sequence {1,0,0,0,0,1,1,1} for the lower bit, {1,1,1,0,0,0,1,0} for the middle bit, and {1,1,0,1,0,1,0,0} for the upper bit. A state error between the third and fourth states from the right results in bit errors in both the lower and upper bits but not in the middle bit, as there are transitions at this point at the lower and upper bits sequences but not at the middle bit sequence.

The implication of this is that location of transitions in the sequence of a bit position determines if it will incur an error upon a state error at that position. If we assume that all the states of a cell are equally likely to occur when the cell is used (in other words—we have no prior knowledge of the data stored in the cells) and also that the state errors in both directions (right and left) are approximately equally likely to occur, then we can conclude that the probability of an error in a certain bit is directly proportional to the number of transitions along its sequence. Also, the total probability of a bit error in any bit position is directly proportional to the total number of transitions in all the bit sequences together. This leads to the conclusion that the lower the total number of transitions, the better is the ordering from the bit errors point of view. As we previously concluded that an optimal ordering generates exactly one bit transition from each state transition, an equivalent condition for an ordering to be optimal is that the total number of bit transitions is equal to the number of states minus one. For a 3-bit MBC this means the total number of transitions is 7, and for a 4-bit MBC this means the total number of transitions is 15. To summarize—an ordering is error-rate optimal if and only if its total number of transitions over all bit positions is equal to the number of states of the cell minus one.

It is interesting to note that the above error rate optimality condition is equivalent to performance optimality criterion A, the minimization of the number of comparisons for sequentially reading all bits in a cell using static reading. Any ordering that is optimal according to that criterion is also optimal according to the bit error rate criterion, and vice versa.

From Appendix A one can see there are only two valid orderings that are error-rate optimal for a 3-bit MBC: {7,6,4,5,1,0,2,3} and {7,6,4,5,1,3,2,0}. For the 4-bit MBC case one can see by complete enumeration of all valid orderings that there are 36 valid orderings that are error-rate optimal, as listed in Appendix B.

Bit Ordering to Distribute Errors Evenly

We showed above that the 4-bit ordering of {15,14,12,13,9,8,10,11,3,2,0,4,6,7,5,1} is optimal for bit errors reduction. If we take 15 cells of 4 bits each using that ordering and cause each one of them to exhibit one of the 15 possible state errors (for this purpose we consider errors of crossing the same boundary between states to be the same, regardless if the crossing is left-to-right or right-to-left), the total number of bit errors in all cells will be 15, which is the lowest number possible.

Let us look at which bit positions (out of the 4 bit positions of the cells) these 15 bit errors appear. We already listed above which one of the 4 bits of the cell is affected upon each of the state errors. We see that the lowest bit suffers an error in 6 of the cases, the second lowest bit in 5 of the cases, the second highest bit in 3 of the cases, and the highest bit in one case. This means that the distribution of the bit errors between the bit positions is not even, so that some bit positions encounter many more errors than others.

Consider the case in which each bit position of a 4-bit MBC belongs to a different logical page. Suppose the flash memory architecture is based on groups of 15,000 cells each storing 4 bits, so each group stores 4 pages of 15,000 bits. Suppose further that the probability of a state error is 1 in 1,000, that is—on average one cell out of each 1,000 cells will be read in an incorrect state. If the ordering used is error-rate optimal, each state error generates exactly one bit error and therefore the bit error rate is also 1 per 1,000 cells and there will be on average 15 bit errors when reading the full group. However, the distribution of those 15 bit errors is not even—instead of each of the 4 pages including 15/4=3.75 errors on average, we have one page with 15*6/15=6 errors, one page with 15*5/15=5 errors, one page with 15*3/15=3 errors, and one page with 15*1/15=1 error (again, we assume here all state errors are equally likely to occur).

At first thought one might say this uneven distribution is not important—after all why should we care where are the errors located if their total number is the same. But suppose that we have to design Error Correction Code (ECC) circuitry for correcting the errors in the data read from the flash memory. As a page is the unit of data that is read at one time, the correction circuitry should be designed to handle one page at a time. If the errors were distributed evenly among the pages residing in the same cells then the expected error rate when reading each single page (specified in bit errors per bits read) would be the same as the expected error rate calculated over the 4 pages together. In the above example this results in 3.75 bit errors per each page of 15,000 bits. But if the errors are distributed as in the {15,14,12,13,9,8,10,11,3,2,0,4,6,7,5,1} ordering, we have different error rates for different pages: one page with an average of 6 errors, one page with an average of 5 errors, one page with an average of 3 errors, and one page with an average of 1 error.

The expected average of bit errors is a most crucial factor in the design of ECC circuitry. The larger the number of expected errors, the more redundancy is needed for storing extra parity or check bits, and the more complex is the circuitry for both encoding and decoding the stored bits. When working with relatively high error rates (1 per 1,000 and higher) the dependency of ECC complexity and redundancy cost on the error rate is quite significant, and it is highly advantageous if one can somehow reduce the bit error rate one has to protect against. Therefore, from the ECC design point of view the two cases of even and uneven errors distribution among the pages are very much different. In the even case the design has to protect against an expected average number of 3.75 errors per page, while in the uneven case the design must protect against an expected average number of 6 errors per page, which is a much more difficult and costly task.

The bottom line of all this is that while the error-rate optimal ordering {15,14,12,13,9,8,10,11,3,2,0,4,6,7,5,1} is an optimal ordering when looking at the total number of errors, it is not optimal when looking at each page separately. In order to satisfy both optimality criteria we need to find a valid ordering that satisfies the following two conditions:

a. The total number of transitions is the lowest possible. In other words, the ordering is error-rate optimal.

b. Those transitions are evenly spread over the different bit positions.

For the 3-bit MBC case the minimal number of transitions is 7. Unfortunately 7 is not divisible by 3, so, without interleaving the bits to be stored, as described below, there is no way to achieve an optimal overall error rate with completely even distribution. The best we can hope for is an ordering with one bit having 3 transitions and the other two bits having two transitions each.

For the 4-bit MBC case the minimal number of transitions is 15. Unfortunately 15 is not divisible by 4, so, without interleaving the bits to be stored, as described below, there is no way to achieve an optimal overall error rate with completely even distribution. The best we can hope for is an ordering with one bit having 3 transitions and the other 3 bits having 4 transitions each. Returning to our previous example, such ordering will result in one page having 3 errors and 3 pages having 4 errors, as compared with overall average of 3.75 errors per page.

We define an ordering to be "evenly distributed" if the ordering results in the number of transitions of any bit position being different from the number of transitions of any other bit position by no more than one transition.

Appendix A lists all valid orderings of the 3-bit MBC case. We already mentioned above only two of these orderings are error-rate optimal. However we find out neither of these two satisfies the even distribution requirement. {7,6,4,5,1,0,2,3} has a distribution of (4,2,1) transitions, while {7,6,4,5,1,3,2,0} has a distribution of (3,3,1) transitions.

Appendix B lists all valid 4-bit orderings that are error-rate optimal. There are 36 of those. Again we realize none of them is evenly distributed, or even close to evenly distributed. The most evenly distributed orderings have a distribution of (5,5,4,1) transitions, and this is very far from our goal.

One could wonder why we can't find an ordering that has the minimal number of transitions but is more evenly distributed. Indeed, Appendix F lists some 3-bit orderings which have a (3,2,2) distribution. Appendix G lists some 4-bit orderings which have a (4,4,4,3) distribution. However, not a single one of these evenly-distributed orderings is valid, and therefore none of them can be used for representing bit encodings in the MBC. Recalling from above, a non-valid ordering is one in which there are cases in which a bit cannot be written because writing the bit would require moving the cell's threshold to the left (i.e. lowering the threshold voltage), which is not possible.

For example, the 4-bit ordering {15,11,3,1,0,2,6,14,10,8,9,13,12,4,5,7} is shown in Appendix G to have a distribution of (4,4,4,3). However, suppose we have to write a value of "0000" into a cell, one bit at a time. In order to achieve this, we first have to program the lowest bit (getting to an intermediate value of "1110"="14"), then program the second lowest bit (getting to an intermediate value of "11100"="12"), then program the second highest bit (getting to an intermediate value of "1000"="8"), and then finally program the highest bit and get to our desired value of "0000". In the third stage of this sequence the cell should move from state "12" to state "8". In the last stage of this sequence the cell should move from state "8" to state "0". But state 12 lies to the right of state 8 and state 8 lies to the right of state 0 in this ordering, so these changes of state are impossible to do.

So we see we are facing a dilemma. On the one hand we wish to use an ordering that is both error-rate optimal and evenly distributed, while on the other hand we need to use a valid ordering, and there is no ordering satisfying both requirements.

Commonly-owned U.S. patent application Ser. No. 11/061,634 achieves the goals of error-optimality and a close to even distribution without violating the validity requirement imposed by the cell's physical method of operation. The solution of U.S. Ser. No. 11/061,634 is based upon a distinction to be made between the physical representation of the bits in the cells and their logical meaning as interpreted by the user of the data. The validity restriction is imposed by the physical level, while the error rate restriction is imposed by the logical level. Therefore, the seemingly contradictory requirements are solved by using a different ordering at the logical level than at the physical level.

When physically storing the bits into the cells (physical level) an ordering is used that is valid and is also error-rate optimal, but is not necessarily evenly distributed. When inputting and outputting data to/from the flash memory (logical level) an ordering is used that is evenly distributed and also error-rate optimal, but is not necessarily valid. A one-to-one mapping is established between the two orderings and switching between the two orderings is performed before accessing the cells for writing and after accessing the cells for reading.

Nevertheless, if the data to be stored are distributed uniformly and if the state error probabilities are distributed uniformly, it is not possible to achieve a truly even distribution of bit errors by using the logical-bit-ordering to physical-bit-ordering mapping of U.S. Ser. No. 11/061,634, except in the limit of very large M (where M is the number of bits per cell). The following aspect of the present invention achieves a truly even bit errors distribution between the logical pages stored in an MBC device by "mixing" and re-arranging the data that is to be written to the device before actually storing it. If the user sends M logical pages of data to be stored in the same physical page, then the data bits of each logical page are not all put to the same "bit position" in the cells (e.g. to the LSB or MSB positions of all cells), but are divided into all possible bit positions in equal shares. In other words, if a logical page of data contains 15,000 data bits and is to be stored into a 4-bit MBC device, as in the above example, then 3,750 of those data bits are written into the lowest bit positions of some cells, another 3,750 bits are written into the second lowest bit positions, still other 3,750 bits are written into the second highest bit positions, and the remaining 3,750 bits are written into the highest bit positions. The same mixing is also done for the other three logical pages of data sharing the same cells. So at the end of the process each physical bit position of the cells stores a quarter of the data of each logical page.

As is shown below, this process is guaranteed to generate an even distribution of bit errors among the logical data pages, regardless of the distribution of bit errors among the physical bit positions of the cells. Assuming the encoding scheme of the cells is selected to be error-rate optimal (in other words a "Gray code"), then applying this method results in a distribution of errors among logical pages that is both error-rate optimal and truly even.

Let us consider an MBC device with M bits/cell—each physical page of cells in such a device may be seen as a group of M logical bit-pages. (A "bit-page" is the collection of all bits occupying the same bit position in all cells of the same physical page. For example, the collection of all the highest bits of all the cells in a physical page constitutes one bit-page, that we may call "the highest bit-page". Bit-pages should be understood to be different from logical pages: logical pages are the collection of data bits as seen by the user. The innovation of this aspect of the current invention lies in separating the two concepts of bit-pages and logical pages, unlike prior art methods in which there is a one-to-one correspondence between the two, and a certain logical page is stored as a whole in a certain bit-page) When the device uses Gray code for bits encoding (that is—the encoding is error-rate optimal), it will have $2^M-1$ state transitions between its $2^M$ states, and the code will have $k_1, k_2, \ldots, k_M$ bit transitions for bit-pages 1, 2, ..., M respectively. Clearly, $$k_1+k_2+\ldots+k_M=2^M-1$$

If, further, the probability of a state transition in a device (i.e. the probability of an error) is P, then the probability $P_i$ of error in bit-page i will be:

$$P_i=P \cdot k_i/(2^M-1)$$

Because it can be shown that $2^M-1 \neq Mq$ for any integer q, except for M=1, there is no coding scheme that can distribute the error probabilities truly evenly among the bit-pages. This is so because for a truly even distribution all the $P_i$ (and hence all the $k_i$) must be equal, requiring the equality $2^M-1=M \cdot k_i$ Now, if we rearrange the data of the logical pages in such a way that each bit-page stores the same number of data bits belonging to any logical page as are stored in any other bit-page of the same physical page, then each bit-page will have the same probability of bit error of P/M, which is the desired optimal result. This type of data rearrangement is herein called "interleaving", while the opposite operation of arranging the interleaved data back into its original order is herein called "de-interleaving". More generally, "interleaving" means rearranging the data of the logical pages so that each of at least two of the bit-pages have at least one bit from each of at least two of the logical pages, and undoing this "interleaving" is "de-interleaving". The "interleaving" and "de-interleaving" that are described in detail herein are specific examples of "interleaving" and "de-interleaving" that provide equal bit error probabilities to bit-pages whose data are distributed uniformly and whose state error probabilities are distributed uniformly.

Therefore, if the data, coded in Gray code, is interleaved before being written to the memory and then de-interleaved after being read, the result is that these data will have evenly distributed probability of bit error P/M for each logical page, regardless of the specific Gray code used by the device.

It should be noted, that any interleaving/de-interleaving scheme which evenly allocates the user's data bits between bit-pages (with the equal shares of the logical page stored in each bit-page) will result in the same effect of "equalizing" error probabilities over the different logical pages. This equalizing of error probabilities is independent of whether the physical bit ordering is according to a Gray code. If a Gray code physical bit ordering is not used, the total number of bit errors will not be minimized, but the bit errors will be distributed uniformly across all M logical pages.

FIGS. 5A-5D illustrate a simple interleaving scheme.

The original data, organized as M logical pages, are logically divided into M-by-M bit matrices. In each matrix, the j-th row initially contains the data of logical page j and column i corresponds to cell i in the corresponding group of M cells.

The interleaving process transposes each such matrix in the following way:

$$bit[i,j] \Rightarrow bit[j,i]$$

that is, the individual bits of each of the original logical pages are evenly allocated among the bit-pages of the interleaved page, and each bit-page gets 1/M-th of the bits of each original logical page. Therefore, the probability of an error in each interleaved logical page will be:

$$P \cdot k_1/(2^M-1)/M+P \cdot k_2/(2^M-1)/M+\ldots P \cdot k_M/(2^M-1)/M=P/M$$

Figure 5A:
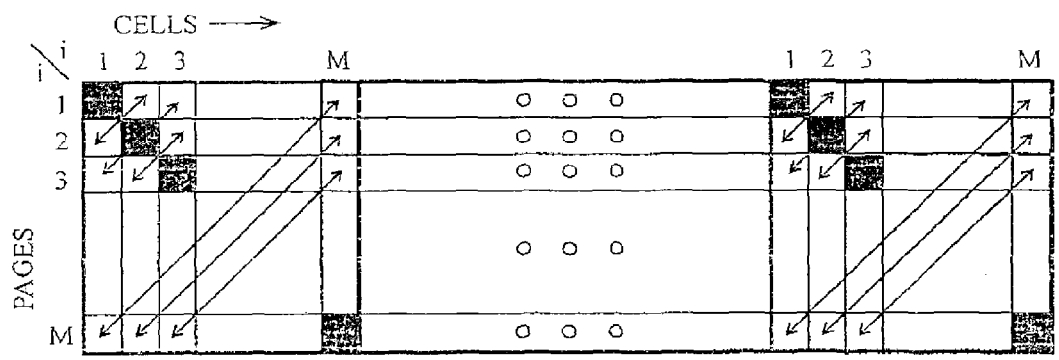
FIGS. 5A-5D illustrate the interleaving and de-interleaving of logical pages.
Figure 5B:
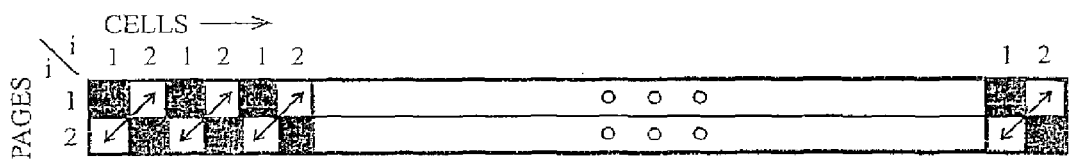
Figure 5C:
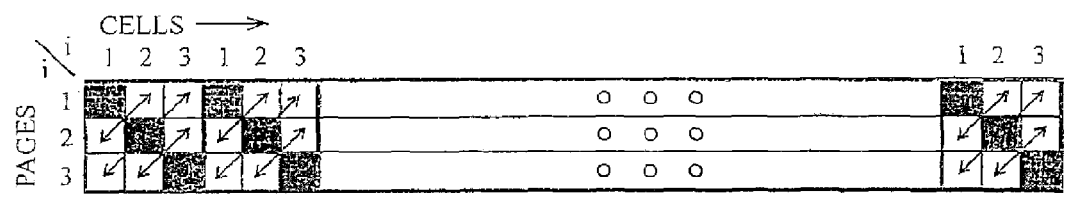
Figure 5D:
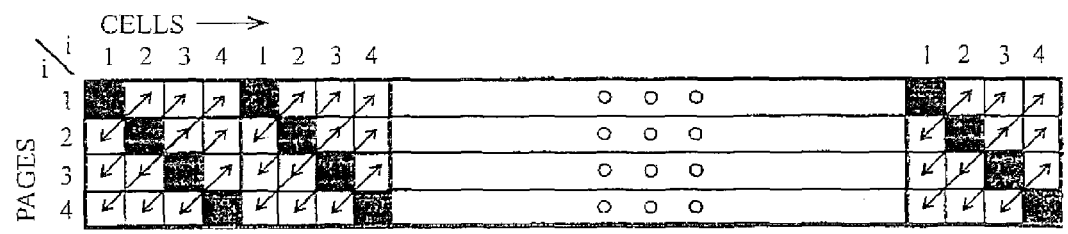

Specific interleaving methods according to the above scheme for the cases of M=2, M=3 and M=4 are presented in FIGS. 5B through 5D.

The de-interleaving process, which has to re-create the "original" data of the logical pages from the interleaved bits, is exactly the same: logically arranging the read bits into M×M matrices and then transposing each matrix by:

$$bit[i,j] \Rightarrow bit[j,i]$$

Alternatively, the bits are transposed, not as individual bits, but as groups of bits, with each group including a consecutive 1/M-th of the bits of one logical page. Each logical page is partitioned among M groups of consecutive bits. The original data thus are organized as a single M×M matrix, with each matrix element being a group of bits, from one of the logical pages, equal in number to 1/M of the number of bits in a logical page. As before, the j-th row of the matrix initially contains the bits of the j-th logical page; but the i-th column of the matrix corresponds to the logical pages' i-th groups of bits. The result of the transposition is that the first 1/M-th of all the logical pages winds up in the first bit-page, the second 1/M-th of all the logical pages winds up in the second bit-page, and in general the i-th 1/M-th of all the logical pages winds up in the i-th bit page.

It should again be emphasized that this interleaving scheme is just an example and any interleaving scheme that satisfies the requirements stated above is acceptable for the purpose of this aspect of the current invention. This includes non-deterministic schemes in which the allocation of data bits of logical pages into bit-pages is done using random processes, as long as the resulting bit error probabilities are the same for all logical pages. The term "interleaving" should be understood to include both deterministic interleaving schemes and non-deterministic interleaving schemes.

Based on the above discussion, the process of encoding and writing the user data into the memory device is done as follows:

1. For each group of logical pages that are to be stored into the same physical page, add ECC redundancy bits (separately for each logical page) in accordance with the probability of error P/M, where P is the device probability of error (probability for a cell to change its state) and M is the number of bits/cell.
2. Interleave the pages' data, including the redundancy bits.
3. Write the interleaved data to the memory device.

The reading and decoding process then is:

1. Read all the data bits stored in a physical page.
2. De-interleave the data, thus re-creating the original logical pages (including the ECC redundancy bits). It should be noted that some bits might be flipped due to errors in the memory device. Note that in the appended claims, the original ECC redundancy bits are called "redundancy bits" and the re-created ECC redundancy bits are called "error correction bits".
3. For each logical page correct the flipped bits (separately for each logical page) using the ECC algorithm and corresponding redundancy bits. The original data of all logical pages stored in that physical page is now reconstructed and can be delivered to the user.

Figure 6:
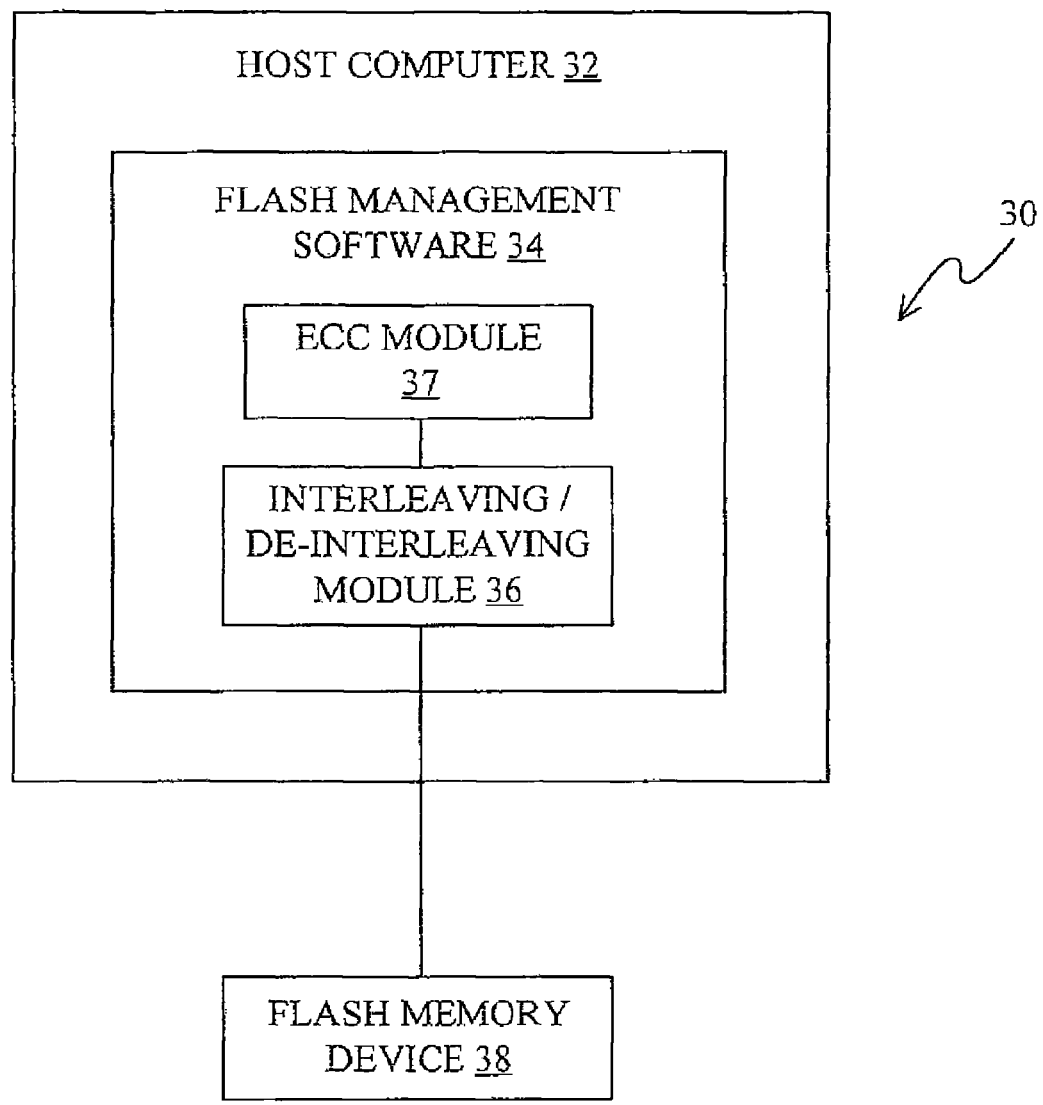
FIGS. 6-10 are high level block diagrams of systems of the present invention.
Figure 7:
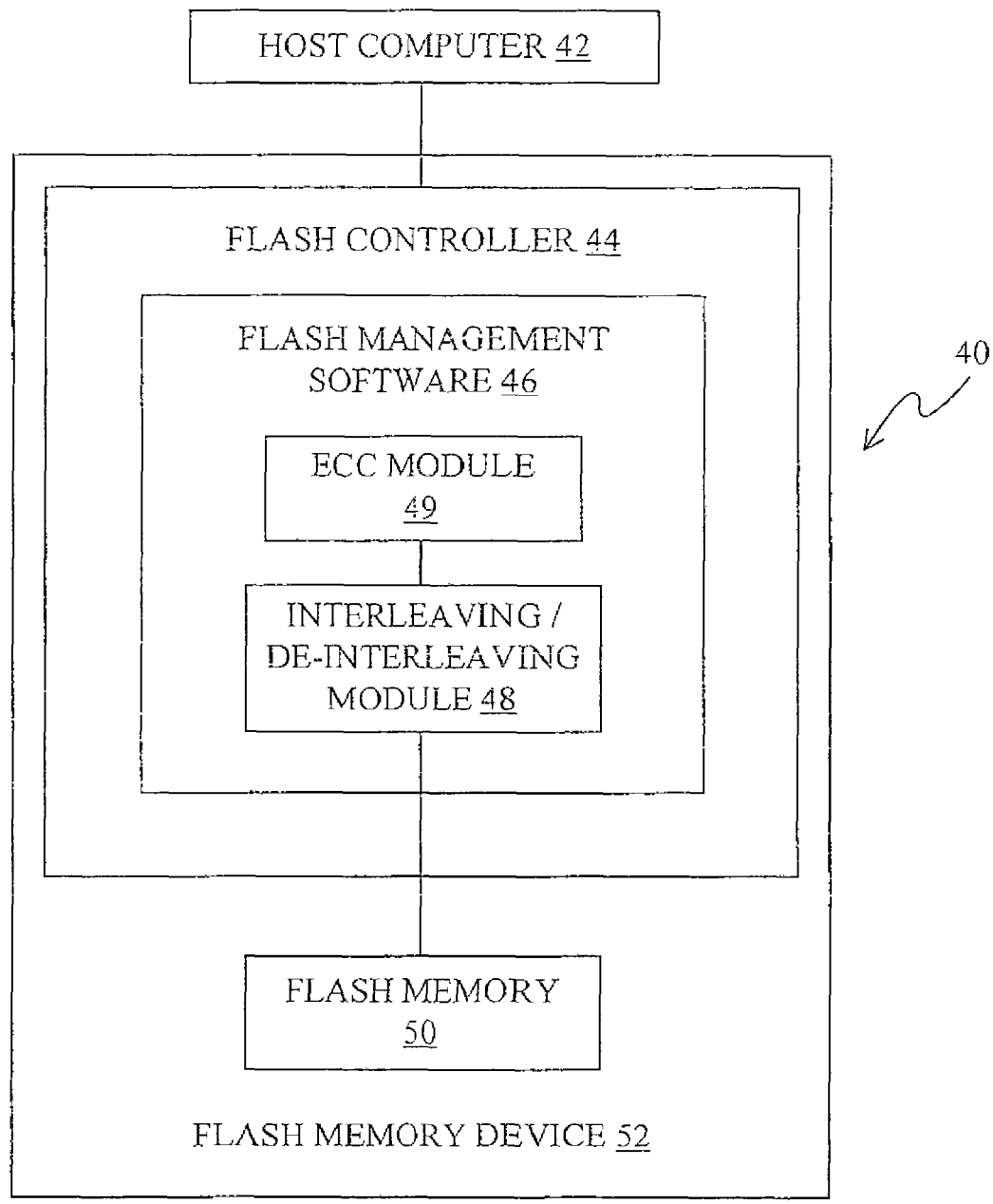

In order to employ the methods of this aspect of the present invention there is a need to have an interleaving stage implemented in writing and a de-interleaving stage implemented in reading. It is possible in principle to have this interleaving/de-interleaving implemented by software, where the software is executed by a host computer (where the flash memory is controlled directly by the host) or by a stand-alone controller (where the flash memory is controlled by a controller in the flash device that serves as the interface for the host). FIG. 6 is a high-level block diagram of a system 30 according to the first case. FIG. 7 is a high-level block diagram of a system 40 according to the second case.

In system 30, a host computer 32 executes flash management software 34 to manage the flash memory of a flash memory device 38. Flash management software 34 includes two software modules of the present invention. One software module is an interleaving/de-interleaving module 36 for interleaving the bits of the logical pages when writing and de-interleaving the bits of the logical pages when reading, for example as illustrated in FIGS. 5A-5D. The other software module is an error correction module 37 for appending redundancy bits to logical pages that are to be written to flash memory device 38 and for correcting logical pages that are received from interleaving/de-interleaving module 36, during the reading of data from flash memory device 38, according to the redundancy bits of those logical pages.

In system 40, a host computer 42 sends read and write instructions to a flash memory device 52. Flash memory device 52 uses a flash controller 44 to manage a flash memory 50 by executing flash management software 46. Flash management software 46 includes two software modules of the present invention. One software module is an interleaving/de-interleaving module 48 for interleaving the bits of the logical pages when writing and de-interleaving the bits of the logical pages when reading, for example as illustrated in FIGS. 5A-5D. The other software module is an error correction module 49 for appending redundancy bits to logical pages that are received from host computer 42 and for correcting logical pages that are received from interleaving/de-interleaving module 48, during the reading of data from flash memory device 52, according to the redundancy bits of those logical pages.

Figure 8:
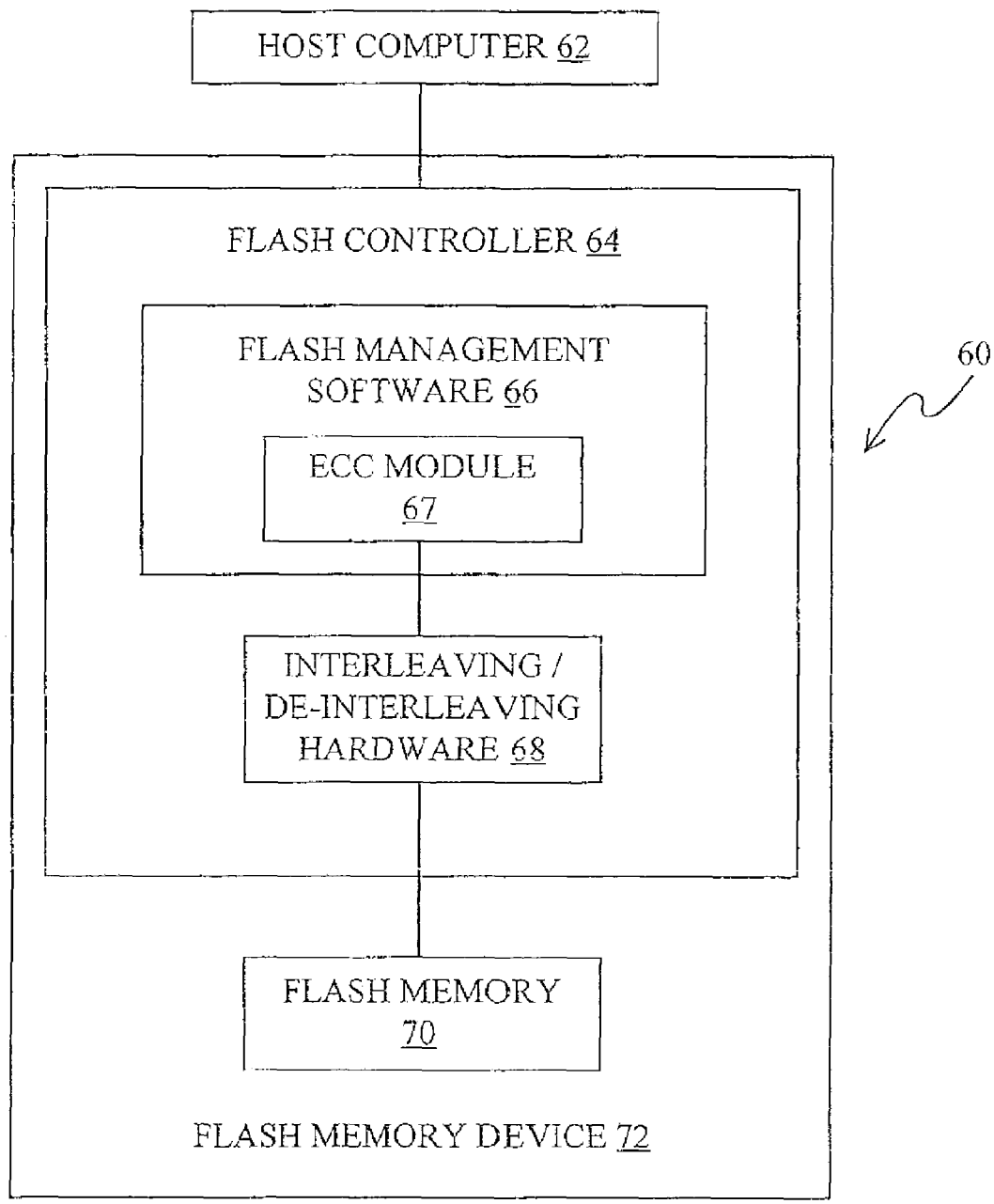
Figure 9:
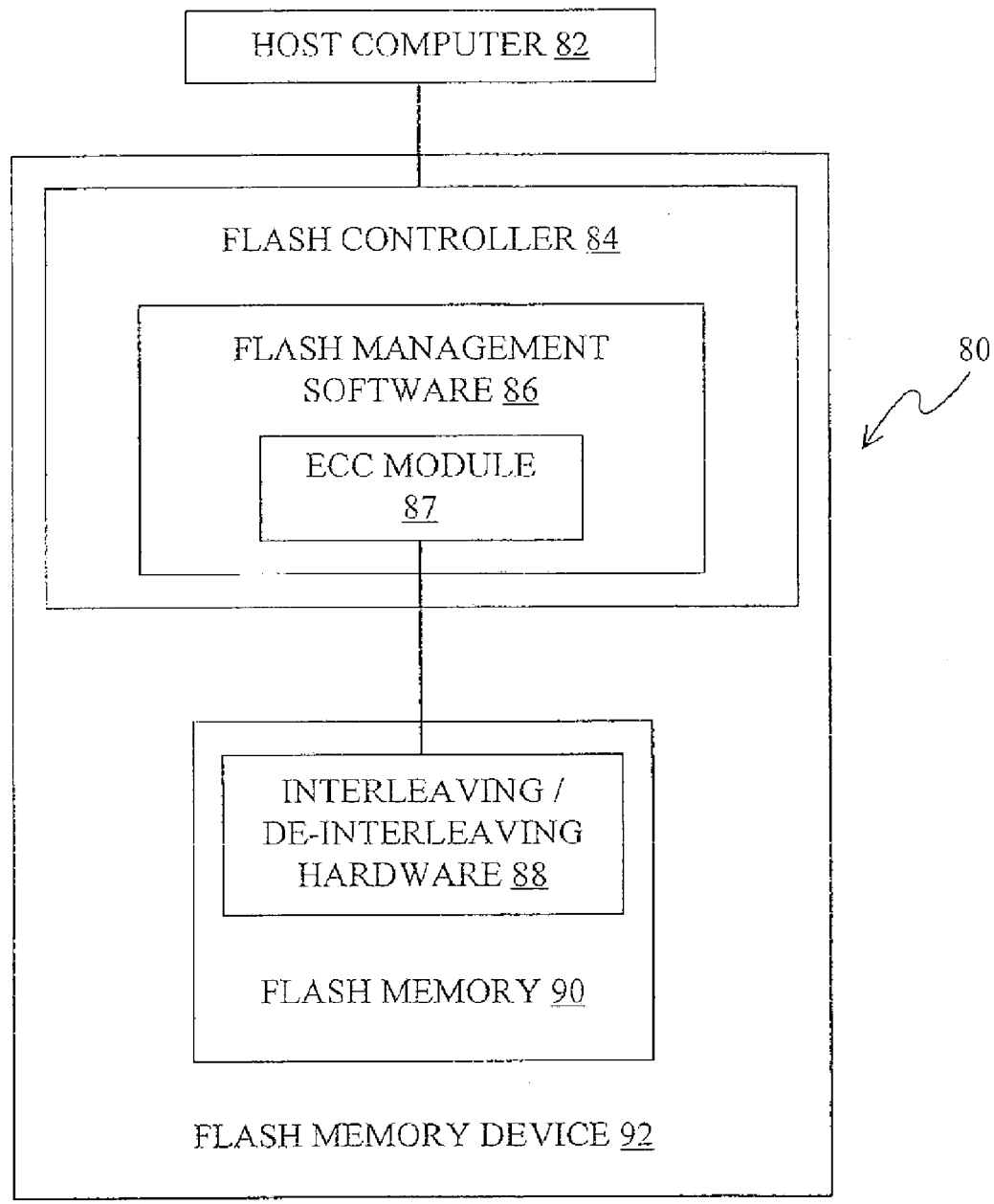
Figure 10:
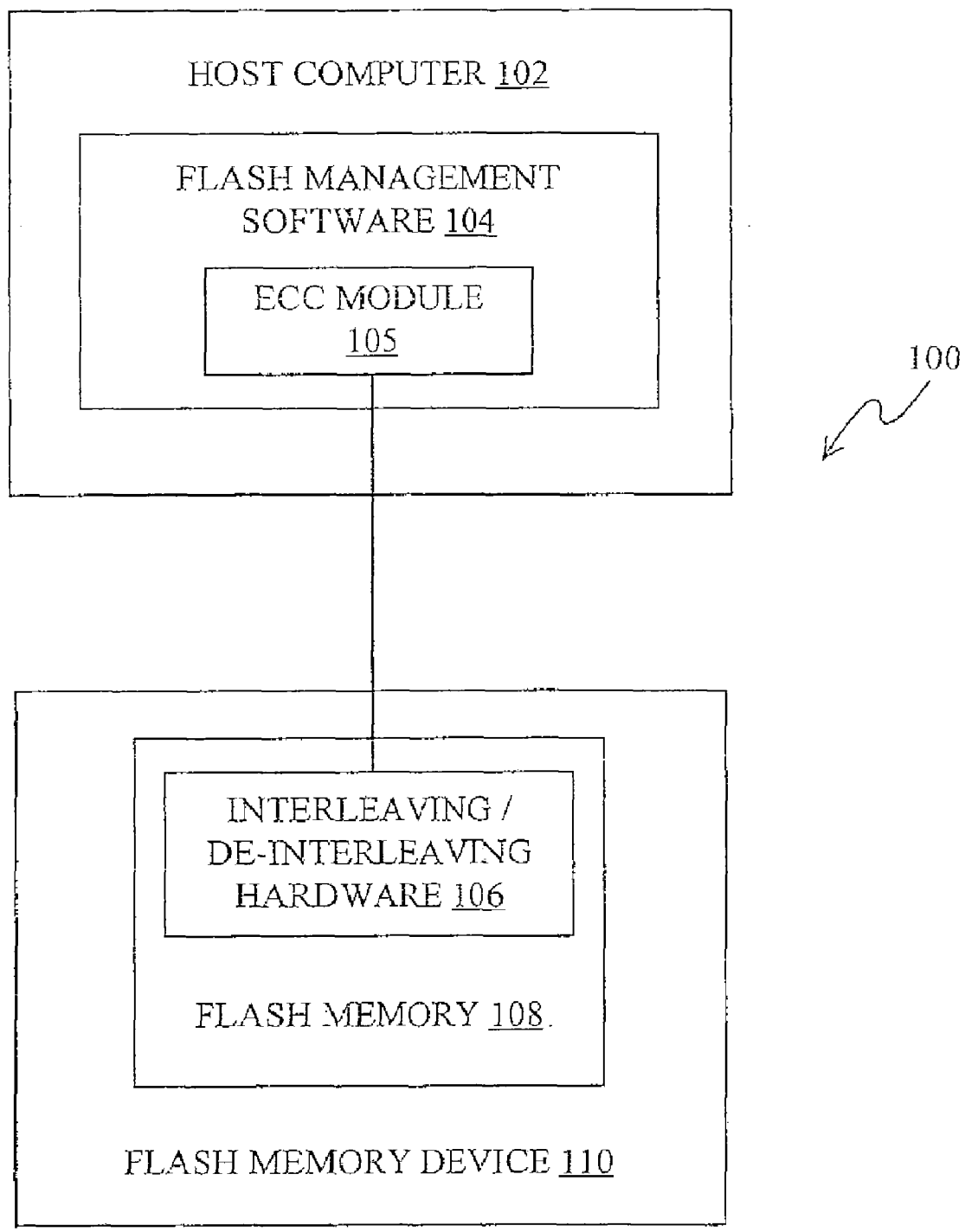

Implementing the interleaving/de-interleaving in software is inefficient. Therefore it is better to have the interleaving/de-interleaving performed in hardware, either within a stand-alone controller die or within the same die as the flash cells. FIG. 8 is a high-level block diagram of a system 60 according to the first case. FIGS. 9 and 10 are high-level block diagrams of a system 80 and of a system 100 according to the second case.

In system 60, a host computer 62 sends read and write instructions to a flash memory device 72. Flash memory device 72 uses a flash controller 64 to manage a flash memory 70 by executing flash management software 66. When flash controller 64 writes to flash memory 70, the logical pages generated by flash management software 66 are interleaved by interleaving/de-interleaving hardware 68 in flash controller 64, for example as illustrated in FIGS. 5A-5D. When flash controller 64 reads from flash memory 70, logical pages received from flash memory 70 are de-interleaved by interleaving/de-interleaving hardware 68, for example as illustrated in FIGS. 5A-5D. As in system 40 of FIG. 9, flash management software 66 includes an error correction module 67 for appending redundancy bits to logical pages that are received from host computer 62 and for correcting logical pages that are received from interleaving/de-interleaving hardware 68, during the reading of data from flash memory device 72, according to the redundancy bits of those logical pages.

In system 80, a host computer 82 sends read and write instructions to a flash memory device 92. Flash memory device 92 uses a flash controller 84 to manage a flash memory 90 by executing flash management software 86. When flash controller 84 writes to flash memory 90, flash memory 90 receives logical pages from flash controller 84 and interleaving/de-interleaving hardware 88 in flash memory 90 interleaves the logical pages, for example as illustrated in FIGS. 5A-5D. When flash controller 84 reads from flash memory 90, interleaving/de-interleaving hardware 88 de-interleaves the logical pages of flash memory 90 for presentation to flash controller 84, for example as illustrated in FIGS. 5A-5D. As in system 40 of FIG. 9 and system 60 of FIG. 10, flash management software 86 includes an error correction module 87 for appending redundancy bits to logical pages that are received from host computer 82 and for correcting logical pages that are received from interleaving/de-interleaving hardware 88, during the reading of data from flash memory device 92, according to the redundancy bits of those logical pages.

In system 100, a host computer 102 executes flash management software 104 to manage a flash memory device 110. Host computer 102 reads logical pages from flash memory device 110 and writes logical pages to flash memory device 110. When host computer 102 writes to flash memory device 110, interleaving/de-interleaving hardware 106 in a flash memory 108 of flash memory device 110 interleaves the logical pages, for example as in FIGS. 5A-5D. When host computer 102 reads from flash memory device 110, interleaving/de-interleaving hardware 106 de-interleaves the logical pages of flash memory 108 for presentation to host computer 102 as illustrated in FIGS. 5A-5D. As in system 30 of FIG. 8, flash management software 104 includes an error correction module 105 for appending redundancy bits to logical pages that are to be written to flash memory device 110 and for correcting logical pages that are received from flash memory device 110 according to the redundancy bits of those logical pages.

The above discussion of interleaving and de-interleaving logical pages to distribute bit errors evenly assumes that the data to be stored are distributed uniformly and that the state error probabilities are distributed uniformly. It will be clear to those skilled in the art how to modify the above procedures to account for nonuniformly distributed data and/or nonuniformly distributed state error probabilities, for example by having different numbers of bits from each logical page stored in the various bit positions.

While the invention has been described with respect to a limited number of embodiments, it will be appreciated that many variations, modifications and other applications of the invention may be made.

APPENDIX A

Evaluation of valid orderings for 3-bit MBC cells

| States order | 1st state | 2nd state | 3rd state | 4th state | 5th state | 6th state | 7th state | 8th state |
|---|---|---|---|---|---|---|---|---|
| 7 6 2 4 0 5 1 3 | 1 1 1 | 1 1 0 | 0 1 0 | 1 0 0 | 0 0 0 | 1 0 1 | 0 0 1 | 0 1 1 |
| 7 6 2 4 0 5 3 1 | 1 1 1 | 1 1 0 | 0 1 0 | 1 0 0 | 0 0 0 | 1 0 1 | 0 1 1 | 0 0 1 |
| 7 6 2 4 0 3 5 1 | 1 1 1 | 1 1 0 | 0 1 0 | 1 0 0 | 0 0 0 | 0 1 1 | 1 0 1 | 0 0 1 |
| 7 6 2 4 5 0 1 3 | 1 1 1 | 1 1 0 | 0 1 0 | 1 0 0 | 1 0 1 | 0 0 0 | 0 0 1 | 0 1 1 |
| 7 6 2 4 5 0 3 1 | 1 1 1 | 1 1 0 | 0 1 0 | 1 0 0 | 1 0 1 | 0 0 0 | 0 1 1 | 0 0 1 |
| 7 6 2 4 5 1 0 3 | 1 1 1 | 1 1 0 | 0 1 0 | 1 0 0 | 1 0 1 | 0 0 1 | 0 0 0 | 0 1 1 |
| 7 6 2 4 5 1 3 0 | 1 1 1 | 1 1 0 | 0 1 0 | 1 0 0 | 1 0 1 | 0 0 1 | 0 1 1 | 0 0 0 |
| 7 6 2 4 5 3 0 1 | 1 1 1 | 1 1 0 | 0 1 0 | 1 0 0 | 1 0 1 | 0 1 1 | 0 0 0 | 0 0 1 |
| 7 6 2 4 5 3 1 0 | 1 1 1 | 1 1 0 | 0 1 0 | 1 0 0 | 1 0 1 | 0 1 1 | 0 0 1 | 0 0 0 |
| 7 6 2 4 3 0 5 1 | 1 1 1 | 1 1 0 | 0 1 0 | 1 0 0 | 0 1 1 | 0 0 0 | 1 0 1 | 0 0 1 |
| 7 6 2 4 3 5 0 1 | 1 1 1 | 1 1 0 | 0 1 0 | 1 0 0 | 0 1 1 | 1 0 1 | 0 0 0 | 0 0 1 |
| 7 6 2 4 3 5 1 0 | 1 1 1 | 1 1 0 | 0 1 0 | 1 0 0 | 0 1 1 | 1 0 1 | 0 0 1 | 0 0 0 |
| 7 6 2 5 4 0 1 3 | 1 1 1 | 1 1 0 | 0 1 0 | 1 0 1 | 1 0 0 | 0 0 0 | 0 0 1 | 0 1 1 |
| 7 6 2 5 4 0 3 1 | 1 1 1 | 1 1 0 | 0 1 0 | 1 0 1 | 1 0 0 | 0 0 0 | 0 1 1 | 0 0 1 |
| 7 6 2 5 4 1 0 3 | 1 1 1 | 1 1 0 | 0 1 0 | 1 0 1 | 1 0 0 | 0 0 1 | 0 0 0 | 0 1 1 |
| 7 6 2 5 4 1 3 0 | 1 1 1 | 1 1 0 | 0 1 0 | 1 0 1 | 1 0 0 | 0 0 1 | 0 1 1 | 0 0 0 |
| 7 6 2 5 4 3 0 1 | 1 1 1 | 1 1 0 | 0 1 0 | 1 0 1 | 1 0 0 | 0 1 1 | 0 0 0 | 0 0 1 |
| 7 6 2 5 4 3 1 0 | 1 1 1 | 1 1 0 | 0 1 0 | 1 0 1 | 1 0 0 | 0 1 1 | 0 0 1 | 0 0 0 |
| 7 6 2 5 1 4 0 3 | 1 1 1 | 1 1 0 | 0 1 0 | 1 0 1 | 0 0 1 | 1 0 0 | 0 0 0 | 0 1 1 |
| 7 6 2 5 1 4 3 0 | 1 1 1 | 1 1 0 | 0 1 0 | 1 0 1 | 0 0 1 | 1 0 0 | 0 1 1 | 0 0 0 |
| 7 6 2 5 1 3 4 0 | 1 1 1 | 1 1 0 | 0 1 0 | 1 0 1 | 0 0 1 | 0 1 1 | 1 0 0 | 0 0 0 |
| 7 6 2 5 3 4 0 1 | 1 1 1 | 1 1 0 | 0 1 0 | 1 0 1 | 0 1 1 | 1 0 0 | 0 0 0 | 0 0 1 |
| 7 6 2 5 3 4 1 0 | 1 1 1 | 1 1 0 | 0 1 0 | 1 0 1 | 0 1 1 | 1 0 0 | 0 0 1 | 0 0 0 |
| 7 6 2 5 3 1 4 0 | 1 1 1 | 1 1 0 | 0 1 0 | 1 0 1 | 0 1 1 | 0 0 1 | 1 0 0 | 0 0 0 |
| 7 6 2 3 4 0 5 1 | 1 1 1 | 1 1 0 | 0 1 0 | 0 1 1 | 1 0 0 | 0 0 0 | 1 0 1 | 0 0 1 |
| 7 6 2 3 4 5 0 1 | 1 1 1 | 1 1 0 | 0 1 0 | 0 1 1 | 1 0 0 | 1 0 1 | 0 0 0 | 0 0 1 |
| 7 6 2 3 4 5 1 0 | 1 1 1 | 1 1 0 | 0 1 0 | 0 1 1 | 1 0 0 | 1 0 1 | 0 0 1 | 0 0 0 |
| 7 6 2 3 5 4 0 1 | 1 1 1 | 1 1 0 | 0 1 0 | 0 1 1 | 1 0 1 | 1 0 0 | 0 0 0 | 0 0 1 |
| 7 6 2 3 5 4 1 0 | 1 1 1 | 1 1 0 | 0 1 0 | 0 1 1 | 1 0 1 | 1 0 0 | 0 0 1 | 0 0 0 |
| 7 6 2 3 5 1 4 0 | 1 1 1 | 1 1 0 | 0 1 0 | 0 1 1 | 1 0 1 | 0 0 1 | 1 0 0 | 0 0 0 |
| 7 6 4 2 0 5 1 3 | 1 1 1 | 1 1 0 | 1 0 0 | 0 1 0 | 0 0 0 | 1 0 1 | 0 0 1 | 0 1 1 |
| 7 6 4 2 0 5 3 1 | 1 1 1 | 1 1 0 | 1 0 0 | 0 1 0 | 0 0 0 | 1 0 1 | 0 1 1 | 0 0 1 |
| 7 6 4 2 0 3 5 1 | 1 1 1 | 1 1 0 | 1 0 0 | 0 1 0 | 0 0 0 | 0 1 1 | 1 0 1 | 0 0 1 |
| 7 6 4 2 5 0 1 3 | 1 1 1 | 1 1 0 | 1 0 0 | 0 1 0 | 1 0 1 | 0 0 0 | 0 0 1 | 0 1 1 |
| 7 6 4 2 5 0 3 1 | 1 1 1 | 1 1 0 | 1 0 0 | 0 1 0 | 1 0 1 | 0 0 0 | 0 1 1 | 0 0 1 |
| 7 6 4 2 5 1 0 3 | 1 1 1 | 1 1 0 | 1 0 0 | 0 1 0 | 1 0 1 | 0 0 1 | 0 0 0 | 0 1 1 |
| 7 6 4 2 5 1 3 0 | 1 1 1 | 1 1 0 | 1 0 0 | 0 1 0 | 1 0 1 | 0 0 1 | 0 1 1 | 0 0 0 |
| 7 6 4 2 5 3 0 1 | 1 1 1 | 1 1 0 | 1 0 0 | 0 1 0 | 1 0 1 | 0 1 1 | 0 0 0 | 0 0 1 |
| 7 6 4 2 5 3 1 0 | 1 1 1 | 1 1 0 | 1 0 0 | 0 1 0 | 1 0 1 | 0 1 1 | 0 0 1 | 0 0 0 |
| 7 6 4 2 3 0 5 1 | 1 1 1 | 1 1 0 | 1 0 0 | 0 1 0 | 0 1 1 | 0 0 0 | 1 0 1 | 0 0 1 |
| 7 6 4 2 3 5 0 1 | 1 1 1 | 1 1 0 | 1 0 0 | 0 1 0 | 0 1 1 | 1 0 1 | 0 0 0 | 0 0 1 |
| 7 6 4 2 3 5 1 0 | 1 1 1 | 1 1 0 | 1 0 0 | 0 1 0 | 0 1 1 | 1 0 1 | 0 0 1 | 0 0 0 |
| 7 6 4 0 2 5 1 3 | 1 1 1 | 1 1 0 | 1 0 0 | 0 0 0 | 0 1 0 | 1 0 1 | 0 0 1 | 0 1 1 |
| 7 6 4 0 2 5 3 1 | 1 1 1 | 1 1 0 | 1 0 0 | 0 0 0 | 0 1 0 | 1 0 1 | 0 1 1 | 0 0 1 |
| 7 6 4 0 2 3 5 1 | 1 1 1 | 1 1 0 | 1 0 0 | 0 0 0 | 0 1 0 | 0 1 1 | 1 0 1 | 0 0 1 |
| 7 6 4 0 5 2 1 3 | 1 1 1 | 1 1 0 | 1 0 0 | 0 0 0 | 1 0 1 | 0 1 0 | 0 0 1 | 0 1 1 |
| 7 6 4 0 5 2 3 1 | 1 1 1 | 1 1 0 | 1 0 0 | 0 0 0 | 1 0 1 | 0 1 0 | 0 1 1 | 0 0 1 |
| 7 6 4 0 5 1 2 3 | 1 1 1 | 1 1 0 | 1 0 0 | 0 0 0 | 1 0 1 | 0 0 1 | 0 1 0 | 0 1 1 |
| 7 6 4 0 5 1 3 2 | 1 1 1 | 1 1 0 | 1 0 0 | 0 0 0 | 1 0 1 | 0 0 1 | 0 1 1 | 0 1 0 |
| 7 6 4 0 5 3 1 2 | 1 1 1 | 1 1 0 | 1 0 0 | 0 0 0 | 1 0 1 | 0 1 1 | 0 0 1 | 0 1 0 |
| 7 6 4 0 5 3 2 1 | 1 1 1 | 1 1 0 | 1 0 0 | 0 0 0 | 1 0 1 | 0 1 1 | 0 1 0 | 0 0 1 |
| 7 6 4 0 3 2 5 1 | 1 1 1 | 1 1 0 | 1 0 0 | 0 0 0 | 0 1 1 | 0 1 0 | 1 0 1 | 0 0 1 |
| 7 6 4 0 3 5 1 2 | 1 1 1 | 1 1 0 | 1 0 0 | 0 0 0 | 0 1 1 | 1 0 1 | 0 0 1 | 0 1 0 |
| 7 6 4 0 3 5 2 1 | 1 1 1 | 1 1 0 | 1 0 0 | 0 0 0 | 0 1 1 | 1 0 1 | 0 1 0 | 0 0 1 |

APPENDIX A-continued

Evaluation of valid orderings for 3-bit MBC cells

| | | | | | | | | |
|---|---|---|---|---|---|---|---|---|
| 7 6 4 5 2 0 1 3 | 1 1 1 | 1 1 0 | 1 0 0 | 1 0 1 | 0 1 0 | 0 0 0 | 0 0 1 | 0 1 1 |
| 7 6 4 5 2 0 3 1 | 1 1 1 | 1 1 0 | 1 0 0 | 1 0 1 | 0 1 0 | 0 0 0 | 0 1 1 | 0 0 1 |
| 7 6 4 5 2 1 0 3 | 1 1 1 | 1 1 0 | 1 0 0 | 1 0 1 | 0 1 0 | 0 0 1 | 0 0 0 | 0 1 1 |
| 7 6 4 5 2 1 3 0 | 1 1 1 | 1 1 0 | 1 0 0 | 1 0 1 | 0 1 0 | 0 0 1 | 0 1 1 | 0 0 0 |
| 7 6 4 5 2 3 0 1 | 1 1 1 | 1 1 0 | 1 0 0 | 1 0 1 | 0 1 0 | 0 1 1 | 0 0 0 | 0 0 1 |
| 7 6 4 5 2 3 1 0 | 1 1 1 | 1 1 0 | 1 0 0 | 1 0 1 | 0 1 0 | 0 1 1 | 0 0 1 | 0 0 0 |
| 7 6 4 5 0 2 1 3 | 1 1 1 | 1 1 0 | 1 0 0 | 1 0 1 | 0 0 0 | 0 1 0 | 0 0 1 | 0 1 1 |
| 7 6 4 5 0 2 3 1 | 1 1 1 | 1 1 0 | 1 0 0 | 1 0 1 | 0 0 0 | 0 1 0 | 0 1 1 | 0 0 1 |
| 7 6 4 5 0 1 2 3 | 1 1 1 | 1 1 0 | 1 0 0 | 1 0 1 | 0 0 0 | 0 0 1 | 0 1 0 | 0 1 1 |
| 7 6 4 5 0 1 3 2 | 1 1 1 | 1 1 0 | 1 0 0 | 1 0 1 | 0 0 0 | 0 0 1 | 0 1 1 | 0 1 0 |
| 7 6 4 5 0 3 1 2 | 1 1 1 | 1 1 0 | 1 0 0 | 1 0 1 | 0 0 0 | 0 1 1 | 0 0 1 | 0 1 0 |
| 7 6 4 5 0 3 2 1 | 1 1 1 | 1 1 0 | 1 0 0 | 1 0 1 | 0 0 0 | 0 1 1 | 0 1 0 | 0 0 1 |
| 7 6 4 5 1 2 0 3 | 1 1 1 | 1 1 0 | 1 0 0 | 1 0 1 | 0 0 1 | 0 1 0 | 0 0 0 | 0 1 1 |
| 7 6 4 5 1 2 3 0 | 1 1 1 | 1 1 0 | 1 0 0 | 1 0 1 | 0 0 1 | 0 1 0 | 0 1 1 | 0 0 0 |
| 7 6 4 5 1 0 2 3 | 1 1 1 | 1 1 0 | 1 0 0 | 1 0 1 | 0 0 1 | 0 0 0 | 0 1 0 | 0 1 1 |
| 7 6 4 5 1 0 3 2 | 1 1 1 | 1 1 0 | 1 0 0 | 1 0 1 | 0 0 1 | 0 0 0 | 0 1 1 | 0 1 0 |
| 7 6 4 5 1 3 2 0 | 1 1 1 | 1 1 0 | 1 0 0 | 1 0 1 | 0 0 1 | 0 1 1 | 0 1 0 | 0 0 0 |
| 7 6 4 5 1 3 0 2 | 1 1 1 | 1 1 0 | 1 0 0 | 1 0 1 | 0 0 1 | 0 1 1 | 0 0 0 | 0 1 0 |
| 7 6 4 5 3 2 0 1 | 1 1 1 | 1 1 0 | 1 0 0 | 1 0 1 | 0 1 1 | 0 1 0 | 0 0 0 | 0 0 1 |
| 7 6 4 5 3 2 1 0 | 1 1 1 | 1 1 0 | 1 0 0 | 1 0 1 | 0 1 1 | 0 1 0 | 0 0 1 | 0 0 0 |
| 7 6 4 5 3 0 2 1 | 1 1 1 | 1 1 0 | 1 0 0 | 1 0 1 | 0 1 1 | 0 0 0 | 0 1 0 | 0 0 1 |
| 7 6 4 5 3 0 1 2 | 1 1 1 | 1 1 0 | 1 0 0 | 1 0 1 | 0 1 1 | 0 0 0 | 0 0 1 | 0 1 0 |
| 7 6 4 5 3 1 2 0 | 1 1 1 | 1 1 0 | 1 0 0 | 1 0 1 | 0 1 1 | 0 0 1 | 0 1 0 | 0 0 0 |
| 7 6 4 5 3 1 0 2 | 1 1 1 | 1 1 0 | 1 0 0 | 1 0 1 | 0 1 1 | 0 0 1 | 0 0 0 | 0 1 0 |
| 7 6 4 3 2 0 5 1 | 1 1 1 | 1 1 0 | 1 0 0 | 0 1 1 | 0 1 0 | 0 0 0 | 1 0 1 | 0 0 1 |
| 7 6 4 3 2 5 0 1 | 1 1 1 | 1 1 0 | 1 0 0 | 0 1 1 | 0 1 0 | 1 0 1 | 0 0 0 | 0 0 1 |
| 7 6 4 3 2 5 1 0 | 1 1 1 | 1 1 0 | 1 0 0 | 0 1 1 | 0 1 0 | 1 0 1 | 0 0 1 | 0 0 0 |
| 7 6 4 3 0 2 5 1 | 1 1 1 | 1 1 0 | 1 0 0 | 0 1 1 | 0 0 0 | 0 1 0 | 1 0 1 | 0 0 1 |
| 7 6 4 3 0 5 2 1 | 1 1 1 | 1 1 0 | 1 0 0 | 0 1 1 | 0 0 0 | 1 0 1 | 0 1 0 | 0 0 1 |

| States order | Lower bit sequence | Middle bit sequence | Upper bit sequence | static comp | T | Min | Max | dynamic comp | T | Min | Max |
|---|---|---|---|---|---|---|---|---|---|---|---|
| 7 6 2 4 0 5 1 3 | 1 0 0 0 0 1 1 1 | 1 1 1 0 0 0 0 1 | 1 1 0 1 0 1 0 0 | 2 2 5 | 9 | 2 | 5 | 2 2 3 | 7 | 2 | 3 |
| 7 6 2 4 0 5 3 1 | 1 0 0 0 0 1 1 1 | 1 1 1 0 0 0 1 0 | 1 1 0 1 0 1 0 0 | 2 3 5 | 10 | 2 | 5 | 2 2 3 | 7 | 2 | 3 |
| 7 6 2 4 0 3 5 1 | 1 0 0 0 0 1 1 1 | 1 1 1 0 0 1 0 0 | 1 1 0 1 0 0 1 0 | 2 3 5 | 10 | 2 | 5 | 2 2 3 | 7 | 2 | 3 |
| 7 6 2 4 5 0 1 3 | 1 0 0 0 1 0 1 1 | 1 1 1 0 0 0 0 1 | 1 1 0 1 1 0 0 0 | 4 2 3 | 9 | 2 | 4 | 3 2 2 | 7 | 2 | 3 |
| 7 6 2 4 5 0 3 1 | 1 0 0 0 1 0 1 1 | 1 1 1 0 0 0 1 0 | 1 1 0 1 1 0 0 0 | 4 3 3 | 10 | 3 | 4 | 3 2 2 | 7 | 2 | 3 |
| 7 6 2 4 5 1 0 3 | 1 0 0 0 1 1 0 1 | 1 1 1 0 0 0 0 1 | 1 1 0 1 1 0 0 0 | 4 2 3 | 9 | 2 | 4 | 3 2 2 | 7 | 2 | 3 |
| 7 6 2 4 5 1 3 0 | 1 0 0 0 1 1 1 0 | 1 1 1 0 0 0 1 0 | 1 1 0 1 1 0 0 0 | 3 3 3 | 9 | 3 | 3 | 2 2 2 | 6 | 2 | 2 |
| 7 6 2 4 5 3 0 1 | 1 0 0 0 1 1 0 1 | 1 1 1 0 0 1 0 0 | 1 1 0 1 1 0 0 0 | 4 3 3 | 10 | 3 | 4 | 3 2 2 | 7 | 2 | 3 |
| 7 6 2 4 5 3 1 0 | 1 0 0 0 1 1 1 0 | 1 1 1 0 0 1 0 0 | 1 1 0 1 1 0 0 0 | 3 3 3 | 9 | 3 | 3 | 2 2 2 | 6 | 2 | 2 |
| 7 6 2 4 3 0 5 1 | 1 0 0 0 1 0 1 1 | 1 1 1 0 1 0 0 0 | 1 1 0 1 0 0 1 0 | 4 3 5 | 12 | 3 | 5 | 3 2 3 | 8 | 2 | 3 |
| 7 6 2 4 3 5 0 1 | 1 0 0 0 1 1 0 1 | 1 1 1 0 1 0 0 0 | 1 1 0 1 0 1 0 0 | 4 3 5 | 12 | 3 | 5 | 3 2 3 | 8 | 2 | 3 |
| 7 6 2 4 3 5 1 0 | 1 0 0 0 1 1 1 0 | 1 1 1 0 1 0 0 0 | 1 1 0 1 0 1 0 0 | 3 3 5 | 11 | 3 | 5 | 2 2 3 | 7 | 2 | 3 |
| 7 6 2 5 4 0 1 3 | 1 0 0 1 0 0 1 1 | 1 1 1 0 0 0 0 1 | 1 1 0 1 1 0 0 0 | 4 2 3 | 9 | 2 | 4 | 3 2 2 | 7 | 2 | 3 |
| 7 6 2 5 4 0 3 1 | 1 0 0 1 0 0 1 1 | 1 1 1 0 0 0 1 0 | 1 1 0 1 1 0 0 0 | 4 3 3 | 10 | 3 | 4 | 3 2 2 | 7 | 2 | 3 |
| 7 6 2 5 4 1 0 3 | 1 0 0 1 0 1 0 1 | 1 1 1 0 0 0 0 1 | 1 1 0 1 1 0 0 0 | 6 2 3 | 11 | 2 | 6 | 3 2 2 | 7 | 2 | 3 |
| 7 6 2 5 4 1 3 0 | 1 0 0 1 0 1 1 0 | 1 1 1 0 0 0 1 0 | 1 1 0 1 1 0 0 0 | 5 3 3 | 11 | 3 | 5 | 3 2 2 | 7 | 2 | 3 |
| 7 6 2 5 4 3 0 1 | 1 0 0 1 0 1 0 1 | 1 1 1 0 0 1 0 0 | 1 1 0 1 1 0 0 0 | 6 3 3 | 12 | 3 | 6 | 3 2 2 | 7 | 2 | 3 |
| 7 6 2 5 4 3 1 0 | 1 0 0 1 0 1 1 0 | 1 1 1 0 0 1 0 0 | 1 1 0 1 1 0 0 0 | 5 3 3 | 11 | 3 | 5 | 3 2 2 | 7 | 2 | 3 |
| 7 6 2 5 1 4 0 3 | 1 0 0 1 1 0 0 1 | 1 1 1 0 0 0 0 1 | 1 1 0 1 0 1 0 0 | 4 2 5 | 11 | 2 | 5 | 3 2 3 | 8 | 2 | 3 |
| 7 6 2 5 1 4 3 0 | 1 0 0 1 1 0 1 0 | 1 1 1 0 0 0 1 0 | 1 1 0 1 0 1 0 0 | 5 3 5 | 13 | 3 | 5 | 3 2 3 | 8 | 2 | 3 |
| 7 6 2 5 1 3 4 0 | 1 0 0 1 1 1 0 0 | 1 1 1 0 0 1 0 0 | 1 1 0 1 0 0 1 0 | 3 3 5 | 11 | 3 | 5 | 2 2 3 | 7 | 2 | 3 |
| 7 6 2 5 3 4 0 1 | 1 0 0 1 1 0 0 1 | 1 1 1 0 1 0 0 0 | 1 1 0 1 0 1 0 0 | 4 3 5 | 12 | 3 | 5 | 3 2 3 | 8 | 2 | 3 |
| 7 6 2 5 3 4 1 0 | 1 0 0 1 1 0 1 0 | 1 1 1 0 1 0 0 0 | 1 1 0 1 0 1 0 0 | 5 3 5 | 13 | 3 | 5 | 3 2 3 | 8 | 2 | 3 |
| 7 6 2 5 3 1 4 0 | 1 0 0 1 1 1 0 0 | 1 1 1 0 1 0 0 0 | 1 1 0 1 0 0 1 0 | 3 3 5 | 11 | 3 | 5 | 2 2 3 | 7 | 2 | 3 |
| 7 6 2 3 4 0 5 1 | 1 0 0 1 0 0 1 1 | 1 1 1 1 0 0 0 0 | 1 1 0 0 1 0 1 0 | 4 1 5 | 10 | 1 | 5 | 3 1 3 | 7 | 1 | 3 |
| 7 6 2 3 4 5 0 1 | 1 0 0 1 0 1 0 1 | 1 1 1 1 0 0 0 0 | 1 1 0 0 1 1 0 0 | 6 1 3 | 10 | 1 | 6 | 3 1 2 | 6 | 1 | 3 |
| 7 6 2 3 4 5 1 0 | 1 0 0 1 0 1 1 0 | 1 1 1 1 0 0 0 0 | 1 1 0 0 1 1 0 0 | 5 1 3 | 9 | 1 | 5 | 3 1 2 | 6 | 1 | 3 |
| 7 6 2 3 5 4 0 1 | 1 0 0 1 1 0 0 1 | 1 1 1 1 0 0 0 0 | 1 1 0 0 1 1 0 0 | 4 1 3 | 8 | 1 | 4 | 3 1 2 | 6 | 1 | 3 |
| 7 6 2 3 5 4 1 0 | 1 0 0 1 1 0 1 0 | 1 1 1 1 0 0 0 0 | 1 1 0 0 1 1 0 0 | 5 1 3 | 9 | 1 | 5 | 3 1 2 | 6 | 1 | 3 |
| 7 6 2 3 5 1 4 0 | 1 0 0 1 1 1 0 0 | 1 1 1 1 0 0 0 0 | 1 1 0 0 1 0 1 0 | 3 1 5 | 9 | 1 | 5 | 2 1 3 | 6 | 1 | 3 |
| 7 6 4 2 0 5 1 3 | 1 0 0 0 0 1 1 1 | 1 1 0 1 0 0 0 1 | 1 1 1 0 0 1 0 0 | 2 4 3 | 9 | 2 | 4 | 2 3 2 | 7 | 2 | 3 |
| 7 6 4 2 0 5 3 1 | 1 0 0 0 0 1 1 1 | 1 1 0 1 0 0 1 0 | 1 1 1 0 0 1 0 0 | 2 5 3 | 10 | 2 | 5 | 2 3 2 | 7 | 2 | 3 |
| 7 6 4 2 0 3 5 1 | 1 0 0 0 0 1 1 1 | 1 1 0 1 0 1 0 0 | 1 1 1 0 0 1 0 0 | 2 5 3 | 10 | 2 | 5 | 2 3 2 | 7 | 2 | 3 |
| 7 6 4 2 5 0 1 3 | 1 0 0 0 1 0 1 1 | 1 1 0 1 0 0 0 1 | 1 1 1 0 1 0 0 0 | 4 4 3 | 11 | 3 | 4 | 3 3 2 | 8 | 2 | 3 |
| 7 6 4 2 5 0 3 1 | 1 0 0 0 1 0 1 1 | 1 1 0 1 0 0 1 0 | 1 1 1 0 1 0 0 0 | 4 5 3 | 12 | 3 | 5 | 3 3 2 | 8 | 2 | 3 |
| 7 6 4 2 5 1 0 3 | 1 0 0 0 1 1 0 1 | 1 1 0 1 0 0 0 1 | 1 1 1 0 1 0 0 0 | 4 4 3 | 11 | 3 | 4 | 3 3 2 | 8 | 2 | 3 |
| 7 6 4 2 5 1 3 0 | 1 0 0 0 1 1 1 0 | 1 1 0 1 0 0 1 0 | 1 1 1 0 1 0 0 0 | 3 5 3 | 11 | 3 | 5 | 2 3 2 | 7 | 2 | 3 |
| 7 6 4 2 5 3 0 1 | 1 0 0 0 1 1 0 1 | 1 1 0 1 0 1 0 0 | 1 1 1 0 1 0 0 0 | 4 5 3 | 12 | 3 | 5 | 3 3 2 | 8 | 2 | 3 |
| 7 6 4 2 5 3 1 0 | 1 0 0 0 1 1 1 0 | 1 1 0 1 0 1 0 0 | 1 1 1 0 1 0 0 0 | 3 5 3 | 11 | 3 | 5 | 2 3 2 | 7 | 2 | 3 |
| 7 6 4 2 3 0 5 1 | 1 0 0 0 1 0 1 1 | 1 1 0 1 1 0 0 0 | 1 1 1 0 0 0 1 0 | 4 3 3 | 10 | 3 | 4 | 3 2 2 | 7 | 2 | 3 |
| 7 6 4 2 3 5 0 1 | 1 0 0 0 1 1 0 1 | 1 1 0 1 1 0 0 0 | 1 1 1 0 0 1 0 0 | 4 3 3 | 10 | 3 | 4 | 3 2 2 | 7 | 2 | 3 |
| 7 6 4 2 3 5 1 0 | 1 0 0 0 1 1 1 0 | 1 1 0 1 1 0 0 0 | 1 1 1 0 0 1 0 0 | 3 3 3 | 9 | 3 | 3 | 2 2 2 | 6 | 2 | 2 |
| 7 6 4 0 2 5 1 3 | 1 0 0 0 0 1 1 1 | 1 1 0 0 1 0 0 1 | 1 1 1 0 0 1 0 0 | 2 4 3 | 9 | 2 | 4 | 2 3 2 | 7 | 2 | 3 |
| 7 6 4 0 2 5 3 1 | 1 0 0 0 0 1 1 1 | 1 1 0 0 1 0 1 0 | 1 1 1 0 0 1 0 0 | 2 5 3 | 10 | 2 | 5 | 2 3 2 | 7 | 2 | 3 |
| 7 6 4 0 2 3 5 1 | 1 0 0 0 0 1 1 1 | 1 1 0 0 1 1 0 0 | 1 1 1 0 0 0 1 0 | 2 3 3 | 8 | 2 | 3 | 2 2 2 | 6 | 2 | 2 |
| 7 6 4 0 5 2 1 3 | 1 0 0 0 1 0 1 1 | 1 1 0 0 0 1 0 1 | 1 1 1 0 1 0 0 0 | 4 4 3 | 11 | 3 | 4 | 3 3 2 | 8 | 2 | 3 |

APPENDIX A-continued

Evaluation of valid orderings for 3-bit MBC cells

| | | | | | | | | | | | |
|---|---|---|---|---|---|---|---|---|---|---|---|
| 76405231 | 10001011 | 11000110 | 11101000 | 433 | 10 | 3 | 4 | 322 | 7 | 2 | 3 |
| 76405123 | 10001101 | 11000011 | 11101000 | 423 | 9 | 2 | 4 | 322 | 7 | 2 | 3 |
| 76405132 | 10001110 | 11000011 | 11101000 | 323 | 8 | 2 | 3 | 222 | 6 | 2 | 2 |
| 76405312 | 10001110 | 11000101 | 11101000 | 343 | 10 | 3 | 4 | 232 | 7 | 2 | 3 |
| 76405321 | 10001101 | 11000110 | 11101000 | 433 | 10 | 3 | 4 | 322 | 7 | 2 | 3 |
| 76403251 | 10001011 | 11001100 | 11100010 | 433 | 10 | 3 | 4 | 322 | 7 | 2 | 3 |
| 76403512 | 10001110 | 11001001 | 11100100 | 343 | 10 | 3 | 4 | 232 | 7 | 2 | 3 |
| 76403521 | 10001101 | 11001010 | 11100100 | 453 | 12 | 3 | 5 | 332 | 8 | 2 | 3 |
| 76452013 | 10010011 | 11001001 | 11110000 | 441 | 9 | 1 | 4 | 331 | 7 | 1 | 3 |
| 76452031 | 10010011 | 11001010 | 11110000 | 451 | 10 | 1 | 5 | 331 | 7 | 1 | 3 |
| 76452103 | 10010101 | 11001001 | 11110000 | 641 | 11 | 1 | 6 | 331 | 7 | 1 | 3 |
| 76452130 | 10010110 | 11001010 | 11110000 | 551 | 11 | 1 | 5 | 331 | 7 | 1 | 3 |
| 76452301 | 10010101 | 11001100 | 11110000 | 631 | 10 | 1 | 6 | 321 | 6 | 1 | 3 |
| 76452310 | 10010110 | 11001100 | 11110000 | 531 | 9 | 1 | 5 | 321 | 6 | 1 | 3 |
| 76450213 | 10010011 | 11000101 | 11110000 | 441 | 9 | 1 | 4 | 331 | 7 | 1 | 3 |
| 76450231 | 10010011 | 11000110 | 11110000 | 431 | 8 | 1 | 4 | 321 | 6 | 1 | 3 |
| 76450123 | 10010101 | 11000011 | 11110000 | 621 | 9 | 1 | 6 | 321 | 6 | 1 | 3 |
| 76450132 | 10010110 | 11000011 | 11110000 | 521 | 8 | 1 | 5 | 321 | 6 | 1 | 3 |
| 76450312 | 10010110 | 11000101 | 11110000 | 541 | 10 | 1 | 5 | 331 | 7 | 1 | 3 |
| 76450321 | 10010101 | 11000110 | 11110000 | 631 | 10 | 1 | 6 | 321 | 6 | 1 | 3 |
| 76451203 | 10011001 | 11000101 | 11110000 | 441 | 9 | 1 | 4 | 331 | 7 | 1 | 3 |
| 76451230 | 10011010 | 11000110 | 11110000 | 531 | 9 | 1 | 5 | 321 | 6 | 1 | 3 |
| 76451023 | 10011001 | 11000011 | 11110000 | 421 | 7 | 1 | 4 | 321 | 6 | 1 | 3 |
| 76451032 | 10011010 | 11000011 | 11110000 | 521 | 8 | 1 | 5 | 321 | 6 | 1 | 3 |
| 76451320 | 10011100 | 11000110 | 11110000 | 331 | 7 | 1 | 3 | 221 | 5 | 1 | 2 |
| 76451302 | 10011100 | 11000101 | 11110000 | 341 | 8 | 1 | 4 | 231 | 6 | 1 | 3 |
| 76453201 | 10011001 | 11001100 | 11110000 | 431 | 8 | 1 | 4 | 321 | 6 | 1 | 3 |
| 76453210 | 10011010 | 11001100 | 11110000 | 531 | 9 | 1 | 5 | 321 | 6 | 1 | 3 |
| 76453021 | 10011001 | 11001010 | 11110000 | 451 | 10 | 1 | 5 | 331 | 7 | 1 | 3 |
| 76453012 | 10011010 | 11001001 | 11110000 | 541 | 10 | 1 | 5 | 331 | 7 | 1 | 3 |
| 76453120 | 10011100 | 11001010 | 11110000 | 351 | 9 | 1 | 5 | 231 | 6 | 1 | 3 |
| 76453102 | 10011100 | 11001001 | 11110000 | 341 | 8 | 1 | 4 | 231 | 6 | 1 | 3 |
| 76432051 | 10010011 | 11011000 | 11100010 | 433 | 10 | 3 | 4 | 322 | 7 | 2 | 3 |
| 76432501 | 10010101 | 11011000 | 11100100 | 633 | 12 | 3 | 6 | 322 | 7 | 2 | 3 |
| 76432510 | 10010110 | 11011000 | 11100100 | 533 | 11 | 3 | 5 | 322 | 7 | 2 | 3 |
| 76430251 | 10010011 | 11010100 | 11100010 | 453 | 12 | 3 | 5 | 332 | 8 | 2 | 3 |
| 76430521 | 10010101 | 11010010 | 11100100 | 653 | 14 | 3 | 6 | 332 | 9 | 2 | 3 |

| States order | 1st state | 2nd state | 3rd state | 4th state | 5th state | 6th state | 7th state | 8th state |
|---|---|---|---|---|---|---|---|---|
| 76430512 | 111 | 110 | 100 | 011 | 000 | 101 | 001 | 010 |
| 76435201 | 111 | 110 | 100 | 011 | 101 | 010 | 000 | 001 |
| 76435210 | 111 | 110 | 100 | 011 | 101 | 010 | 001 | 000 |
| 76435021 | 111 | 110 | 100 | 011 | 101 | 000 | 010 | 001 |
| 76435012 | 111 | 110 | 100 | 011 | 101 | 000 | 001 | 010 |
| 76435120 | 111 | 110 | 100 | 011 | 101 | 001 | 010 | 000 |
| 76435102 | 111 | 110 | 100 | 011 | 101 | 001 | 000 | 010 |
| 76524013 | 111 | 110 | 101 | 010 | 100 | 000 | 001 | 011 |
| 76524031 | 111 | 110 | 101 | 010 | 100 | 000 | 011 | 001 |
| 76524103 | 111 | 110 | 101 | 010 | 100 | 001 | 000 | 011 |
| 76524130 | 111 | 110 | 101 | 010 | 100 | 001 | 011 | 000 |
| 76524301 | 111 | 110 | 101 | 010 | 100 | 011 | 000 | 001 |
| 76524310 | 111 | 110 | 101 | 010 | 100 | 011 | 001 | 000 |
| 76521403 | 111 | 110 | 101 | 010 | 001 | 100 | 000 | 011 |
| 76521430 | 111 | 110 | 101 | 010 | 001 | 100 | 011 | 000 |
| 76521340 | 111 | 110 | 101 | 010 | 001 | 011 | 100 | 000 |
| 76523401 | 111 | 110 | 101 | 010 | 011 | 100 | 000 | 001 |
| 76523410 | 111 | 110 | 101 | 010 | 011 | 100 | 001 | 000 |
| 76523140 | 111 | 110 | 101 | 010 | 011 | 001 | 100 | 000 |
| 76542013 | 111 | 110 | 101 | 100 | 010 | 000 | 001 | 011 |
| 76542031 | 111 | 110 | 101 | 100 | 010 | 000 | 011 | 001 |
| 76542103 | 111 | 110 | 101 | 100 | 010 | 001 | 000 | 011 |
| 76542130 | 111 | 110 | 101 | 100 | 010 | 001 | 011 | 000 |
| 76542301 | 111 | 110 | 101 | 100 | 010 | 011 | 000 | 001 |
| 76542310 | 111 | 110 | 101 | 100 | 010 | 011 | 001 | 000 |
| 76540213 | 111 | 110 | 101 | 100 | 000 | 010 | 001 | 011 |
| 76540231 | 111 | 110 | 101 | 100 | 000 | 010 | 011 | 001 |
| 76540123 | 111 | 110 | 101 | 100 | 000 | 001 | 010 | 011 |
| 76540132 | 111 | 110 | 101 | 100 | 000 | 001 | 011 | 010 |
| 76540312 | 111 | 110 | 101 | 100 | 000 | 011 | 001 | 010 |
| 76540321 | 111 | 110 | 101 | 100 | 000 | 011 | 010 | 001 |
| 76541203 | 111 | 110 | 101 | 100 | 001 | 010 | 000 | 011 |
| 76541230 | 111 | 110 | 101 | 100 | 001 | 010 | 011 | 000 |
| 76541023 | 111 | 110 | 101 | 100 | 001 | 000 | 010 | 011 |
| 76541032 | 111 | 110 | 101 | 100 | 001 | 000 | 011 | 010 |
| 76541320 | 111 | 110 | 101 | 100 | 001 | 011 | 010 | 000 |
| 76541302 | 111 | 110 | 101 | 100 | 001 | 011 | 000 | 010 |
| 76543201 | 111 | 110 | 101 | 100 | 011 | 010 | 000 | 001 |

APPENDIX A-continued

Evaluation of valid orderings for 3-bit MBC cells

| | | | | | | | | |
|---|---|---|---|---|---|---|---|---|
| 7 6 5 4 3 2 1 0 | 1 1 1 | 1 1 0 | 1 0 1 | 1 0 0 | 0 1 1 | 0 1 0 | 0 0 1 | 0 0 0 |
| 7 6 5 4 3 0 2 1 | 1 1 1 | 1 1 0 | 1 0 1 | 1 0 0 | 0 1 1 | 0 0 0 | 0 1 0 | 0 0 1 |
| 7 6 5 4 3 0 1 2 | 1 1 1 | 1 1 0 | 1 0 1 | 1 0 0 | 0 1 1 | 0 0 0 | 0 0 1 | 0 1 0 |
| 7 6 5 4 3 1 2 0 | 1 1 1 | 1 1 0 | 1 0 1 | 1 0 0 | 0 1 1 | 0 0 1 | 0 1 0 | 0 0 0 |
| 7 6 5 4 3 1 0 2 | 1 1 1 | 1 1 0 | 1 0 1 | 1 0 0 | 0 1 1 | 0 0 1 | 0 0 0 | 0 1 0 |
| 7 6 5 1 2 4 0 3 | 1 1 1 | 1 1 0 | 1 0 1 | 0 0 1 | 0 1 0 | 1 0 0 | 0 0 0 | 0 1 1 |
| 7 6 5 1 2 4 3 0 | 1 1 1 | 1 1 0 | 1 0 1 | 0 0 1 | 0 1 0 | 1 0 0 | 0 1 1 | 0 0 0 |
| 7 6 5 1 2 3 4 0 | 1 1 1 | 1 1 0 | 1 0 1 | 0 0 1 | 0 1 0 | 0 1 1 | 1 0 0 | 0 0 0 |
| 7 6 5 1 4 2 0 3 | 1 1 1 | 1 1 0 | 1 0 1 | 0 0 1 | 1 0 0 | 0 1 0 | 0 0 0 | 0 1 1 |
| 7 6 5 1 4 2 3 0 | 1 1 1 | 1 1 0 | 1 0 1 | 0 0 1 | 1 0 0 | 0 1 0 | 0 1 1 | 0 0 0 |
| 7 6 5 1 4 0 2 3 | 1 1 1 | 1 1 0 | 1 0 1 | 0 0 1 | 1 0 0 | 0 0 0 | 0 1 0 | 0 1 1 |
| 7 6 5 1 4 0 3 2 | 1 1 1 | 1 1 0 | 1 0 1 | 0 0 1 | 1 0 0 | 0 0 0 | 0 1 1 | 0 1 0 |
| 7 6 5 1 4 3 2 0 | 1 1 1 | 1 1 0 | 1 0 1 | 0 0 1 | 1 0 0 | 0 1 1 | 0 1 0 | 0 0 0 |
| 7 6 5 1 4 3 0 2 | 1 1 1 | 1 1 0 | 1 0 1 | 0 0 1 | 1 0 0 | 0 1 1 | 0 0 0 | 0 1 0 |
| 7 6 5 1 3 2 4 0 | 1 1 1 | 1 1 0 | 1 0 1 | 0 0 1 | 0 1 1 | 0 1 0 | 1 0 0 | 0 0 0 |
| 7 6 5 1 3 4 2 0 | 1 1 1 | 1 1 0 | 1 0 1 | 0 0 1 | 0 1 1 | 1 0 0 | 0 1 0 | 0 0 0 |
| 7 6 5 1 3 4 0 2 | 1 1 1 | 1 1 0 | 1 0 1 | 0 0 1 | 0 1 1 | 1 0 0 | 0 0 0 | 0 1 0 |
| 7 6 5 3 2 4 0 1 | 1 1 1 | 1 1 0 | 1 0 1 | 0 1 1 | 0 1 0 | 1 0 0 | 0 0 0 | 0 0 1 |
| 7 6 5 3 2 4 1 0 | 1 1 1 | 1 1 0 | 1 0 1 | 0 1 1 | 0 1 0 | 1 0 0 | 0 0 1 | 0 0 0 |
| 7 6 5 3 2 1 4 0 | 1 1 1 | 1 1 0 | 1 0 1 | 0 1 1 | 0 1 0 | 0 0 1 | 1 0 0 | 0 0 0 |
| 7 6 5 3 4 2 0 1 | 1 1 1 | 1 1 0 | 1 0 1 | 0 1 1 | 1 0 0 | 0 1 0 | 0 0 0 | 0 0 1 |
| 7 6 5 3 4 2 1 0 | 1 1 1 | 1 1 0 | 1 0 1 | 0 1 1 | 1 0 0 | 0 1 0 | 0 0 1 | 0 0 0 |
| 7 6 5 3 4 0 2 1 | 1 1 1 | 1 1 0 | 1 0 1 | 0 1 1 | 1 0 0 | 0 0 0 | 0 1 0 | 0 0 1 |
| 7 6 5 3 4 0 1 2 | 1 1 1 | 1 1 0 | 1 0 1 | 0 1 1 | 1 0 0 | 0 0 0 | 0 0 1 | 0 1 0 |
| 7 6 5 3 4 1 2 0 | 1 1 1 | 1 1 0 | 1 0 1 | 0 1 1 | 1 0 0 | 0 0 1 | 0 1 0 | 0 0 0 |
| 7 6 5 3 4 1 0 2 | 1 1 1 | 1 1 0 | 1 0 1 | 0 1 1 | 1 0 0 | 0 0 1 | 0 0 0 | 0 1 0 |
| 7 6 5 3 1 2 4 0 | 1 1 1 | 1 1 0 | 1 0 1 | 0 1 1 | 0 0 1 | 0 1 0 | 1 0 0 | 0 0 0 |
| 7 6 5 3 1 4 2 0 | 1 1 1 | 1 1 0 | 1 0 1 | 0 1 1 | 0 0 1 | 1 0 0 | 0 1 0 | 0 0 0 |
| 7 6 5 3 1 4 0 2 | 1 1 1 | 1 1 0 | 1 0 1 | 0 1 1 | 0 0 1 | 1 0 0 | 0 0 0 | 0 1 0 |
| 7 6 3 2 4 0 5 1 | 1 1 1 | 1 1 0 | 0 1 1 | 0 1 0 | 1 0 0 | 0 0 0 | 1 0 1 | 0 0 1 |
| 7 6 3 2 4 5 0 1 | 1 1 1 | 1 1 0 | 0 1 1 | 0 1 0 | 1 0 0 | 1 0 1 | 0 0 0 | 0 0 1 |
| 7 6 3 2 4 5 1 0 | 1 1 1 | 1 1 0 | 0 1 1 | 0 1 0 | 1 0 0 | 1 0 1 | 0 0 1 | 0 0 0 |
| 7 6 3 2 5 4 0 1 | 1 1 1 | 1 1 0 | 0 1 1 | 0 1 0 | 1 0 1 | 1 0 0 | 0 0 0 | 0 0 1 |
| 7 6 3 2 5 4 1 0 | 1 1 1 | 1 1 0 | 0 1 1 | 0 1 0 | 1 0 1 | 1 0 0 | 0 0 1 | 0 0 0 |
| 7 6 3 2 5 1 4 0 | 1 1 1 | 1 1 0 | 0 1 1 | 0 1 0 | 1 0 1 | 0 0 1 | 1 0 0 | 0 0 0 |
| 7 6 3 4 2 0 5 1 | 1 1 1 | 1 1 0 | 0 1 1 | 1 0 0 | 0 1 0 | 0 0 0 | 1 0 1 | 0 0 1 |
| 7 6 3 4 2 5 0 1 | 1 1 1 | 1 1 0 | 0 1 1 | 1 0 0 | 0 1 0 | 1 0 1 | 0 0 0 | 0 0 1 |
| 7 6 3 4 2 5 1 0 | 1 1 1 | 1 1 0 | 0 1 1 | 1 0 0 | 0 1 0 | 1 0 1 | 0 0 1 | 0 0 0 |
| 7 6 3 4 0 2 5 1 | 1 1 1 | 1 1 0 | 0 1 1 | 1 0 0 | 0 0 0 | 0 1 0 | 1 0 1 | 0 0 1 |
| 7 6 3 4 0 5 2 1 | 1 1 1 | 1 1 0 | 0 1 1 | 1 0 0 | 0 0 0 | 1 0 1 | 0 1 0 | 0 0 1 |
| 7 6 3 4 0 5 1 2 | 1 1 1 | 1 1 0 | 0 1 1 | 1 0 0 | 0 0 0 | 1 0 1 | 0 0 1 | 0 1 0 |
| 7 6 3 4 5 2 0 1 | 1 1 1 | 1 1 0 | 0 1 1 | 1 0 0 | 1 0 1 | 0 1 0 | 0 0 0 | 0 0 1 |
| 7 6 3 4 5 2 1 0 | 1 1 1 | 1 1 0 | 0 1 1 | 1 0 0 | 1 0 1 | 0 1 0 | 0 0 1 | 0 0 0 |
| 7 6 3 4 5 0 2 1 | 1 1 1 | 1 1 0 | 0 1 1 | 1 0 0 | 1 0 1 | 0 0 0 | 0 1 0 | 0 0 1 |
| 7 6 3 4 5 0 1 2 | 1 1 1 | 1 1 0 | 0 1 1 | 1 0 0 | 1 0 1 | 0 0 0 | 0 0 1 | 0 1 0 |

| States order | Lower bit sequence | Middle bit sequence | Upper bit sequence | static comp | T | Min | Max | dynamic comp | T | Min | Max |
|---|---|---|---|---|---|---|---|---|---|---|---|
| 7 6 4 3 0 5 1 2 | 1 0 0 1 0 1 1 0 | 1 1 0 1 0 0 0 1 | 1 1 1 0 0 1 0 0 | 5 4 3 | 12 | 3 | 5 | 3 3 2 | 8 | 2 | 3 |
| 7 6 4 3 5 2 0 1 | 1 0 0 1 1 0 0 1 | 1 1 0 1 0 1 0 0 | 1 1 1 0 1 0 0 0 | 4 5 3 | 12 | 3 | 5 | 3 3 2 | 8 | 2 | 3 |
| 7 6 4 3 5 2 1 0 | 1 0 0 1 1 0 1 0 | 1 1 0 1 0 1 0 0 | 1 1 1 0 1 0 0 0 | 5 5 3 | 13 | 3 | 5 | 3 3 2 | 8 | 2 | 3 |
| 7 6 4 3 5 0 2 1 | 1 0 0 1 1 0 0 1 | 1 1 0 1 0 0 1 0 | 1 1 1 0 1 0 0 0 | 4 5 3 | 12 | 3 | 5 | 3 3 2 | 8 | 2 | 3 |
| 7 6 4 3 5 0 1 2 | 1 0 0 1 1 0 1 0 | 1 1 0 1 0 0 0 1 | 1 1 1 0 1 0 0 0 | 5 4 3 | 12 | 3 | 5 | 3 3 2 | 8 | 2 | 3 |
| 7 6 4 3 5 1 2 0 | 1 0 0 1 1 1 0 0 | 1 1 0 1 0 0 1 0 | 1 1 1 0 1 0 0 0 | 3 5 3 | 11 | 3 | 5 | 2 3 2 | 7 | 2 | 3 |
| 7 6 4 3 5 1 0 2 | 1 0 0 1 1 1 0 0 | 1 1 0 1 0 0 0 1 | 1 1 1 0 1 0 0 0 | 3 4 3 | 10 | 3 | 4 | 2 3 2 | 7 | 2 | 3 |
| 7 6 5 2 4 0 1 3 | 1 0 1 0 0 0 1 1 | 1 1 0 1 0 0 0 1 | 1 1 1 0 1 0 0 0 | 4 4 3 | 11 | 3 | 4 | 3 3 2 | 8 | 2 | 3 |
| 7 6 5 2 4 0 3 1 | 1 0 1 0 0 0 1 1 | 1 1 0 1 0 0 1 0 | 1 1 1 0 1 0 0 0 | 4 5 3 | 12 | 3 | 5 | 3 3 2 | 8 | 2 | 3 |
| 7 6 5 2 4 1 0 3 | 1 0 1 0 0 1 0 1 | 1 1 0 1 0 0 0 1 | 1 1 1 0 1 0 0 0 | 6 4 3 | 13 | 3 | 6 | 3 3 2 | 8 | 2 | 3 |
| 7 6 5 2 4 1 3 0 | 1 0 1 0 0 1 1 0 | 1 1 0 1 0 0 1 0 | 1 1 1 0 1 0 0 0 | 5 5 3 | 13 | 3 | 5 | 3 3 2 | 8 | 2 | 3 |
| 7 6 5 2 4 3 0 1 | 1 0 1 0 0 1 0 1 | 1 1 0 1 0 1 0 0 | 1 1 1 0 1 0 0 0 | 6 5 3 | 14 | 3 | 6 | 3 3 2 | 8 | 2 | 3 |
| 7 6 5 2 4 3 1 0 | 1 0 1 0 0 1 1 0 | 1 1 0 1 0 1 0 0 | 1 1 1 0 1 0 0 0 | 5 5 3 | 13 | 3 | 5 | 3 3 2 | 8 | 2 | 3 |
| 7 6 5 2 1 4 0 3 | 1 0 1 0 1 0 0 1 | 1 1 0 1 0 0 0 1 | 1 1 1 0 0 1 0 0 | 6 4 3 | 13 | 3 | 6 | 3 3 2 | 8 | 2 | 3 |
| 7 6 5 2 1 4 3 0 | 1 0 1 0 1 0 1 0 | 1 1 0 1 0 0 1 0 | 1 1 1 0 0 1 0 0 | 7 5 3 | 15 | 3 | 7 | 3 3 2 | 8 | 2 | 3 |
| 7 6 5 2 1 3 4 0 | 1 0 1 0 1 1 0 0 | 1 1 0 1 0 1 0 0 | 1 1 1 0 0 0 1 0 | 5 5 3 | 13 | 3 | 5 | 3 3 2 | 8 | 2 | 3 |
| 7 6 5 2 3 4 0 1 | 1 0 1 0 1 0 0 1 | 1 1 0 1 1 0 0 0 | 1 1 1 0 0 1 0 0 | 6 3 3 | 12 | 3 | 6 | 3 2 2 | 7 | 2 | 3 |
| 7 6 5 2 3 4 1 0 | 1 0 1 0 1 0 1 0 | 1 1 0 1 1 0 0 0 | 1 1 1 0 0 1 0 0 | 7 3 3 | 13 | 3 | 7 | 3 2 2 | 7 | 2 | 3 |
| 7 6 5 2 3 1 4 0 | 1 0 1 0 1 1 0 0 | 1 1 0 1 1 0 0 0 | 1 1 1 0 0 0 1 0 | 5 3 3 | 11 | 3 | 5 | 3 2 2 | 7 | 2 | 3 |
| 7 6 5 4 2 0 1 3 | 1 0 1 0 0 0 1 1 | 1 1 0 0 1 0 0 1 | 1 1 1 1 0 0 0 0 | 4 4 1 | 9 | 1 | 4 | 3 3 1 | 7 | 1 | 3 |
| 7 6 5 4 2 0 3 1 | 1 0 1 0 0 0 1 1 | 1 1 0 0 1 0 1 0 | 1 1 1 1 0 0 0 0 | 4 5 1 | 10 | 1 | 5 | 3 3 1 | 7 | 1 | 3 |
| 7 6 5 4 2 1 0 3 | 1 0 1 0 0 1 0 1 | 1 1 0 0 1 0 0 1 | 1 1 1 1 0 0 0 0 | 6 4 1 | 11 | 1 | 6 | 3 3 1 | 7 | 1 | 3 |
| 7 6 5 4 2 1 3 0 | 1 0 1 0 0 1 1 0 | 1 1 0 0 1 0 1 0 | 1 1 1 1 0 0 0 0 | 5 5 1 | 11 | 1 | 5 | 3 3 1 | 7 | 1 | 3 |
| 7 6 5 4 2 3 0 1 | 1 0 1 0 0 1 0 1 | 1 1 0 0 1 1 0 0 | 1 1 1 1 0 0 0 0 | 6 3 1 | 10 | 1 | 6 | 3 2 1 | 6 | 1 | 3 |
| 7 6 5 4 2 3 1 0 | 1 0 1 0 0 1 1 0 | 1 1 0 0 1 1 0 0 | 1 1 1 1 0 0 0 0 | 5 3 1 | 9 | 1 | 5 | 3 2 1 | 6 | 1 | 3 |
| 7 6 5 4 0 2 1 3 | 1 0 1 0 0 0 1 1 | 1 1 0 0 0 1 0 1 | 1 1 1 1 0 0 0 0 | 4 4 1 | 9 | 1 | 4 | 3 3 1 | 7 | 1 | 3 |
| 7 6 5 4 0 2 3 1 | 1 0 1 0 0 0 1 1 | 1 1 0 0 0 1 1 0 | 1 1 1 1 0 0 0 0 | 4 3 1 | 8 | 1 | 4 | 3 2 1 | 6 | 1 | 3 |
| 7 6 5 4 0 1 2 3 | 1 0 1 0 0 1 0 1 | 1 1 0 0 0 0 1 1 | 1 1 1 1 0 0 0 0 | 6 2 1 | 9 | 1 | 6 | 3 2 1 | 6 | 1 | 3 |
| 7 6 5 4 0 1 3 2 | 1 0 1 0 0 1 1 0 | 1 1 0 0 0 0 1 1 | 1 1 1 1 0 0 0 0 | 5 2 1 | 8 | 1 | 5 | 3 2 1 | 6 | 1 | 3 |
| 7 6 5 4 0 3 1 2 | 1 0 1 0 0 1 1 0 | 1 1 0 0 0 1 0 1 | 1 1 1 1 0 0 0 0 | 5 4 1 | 10 | 1 | 5 | 3 3 1 | 7 | 1 | 3 |

APPENDIX A-continued

Evaluation of valid orderings for 3-bit MBC cells

| | | | | | | | | | | | |
|---|---|---|---|---|---|---|---|---|---|---|---|
| 76540321 | 10100101 | 11000110 | 11110000 | 6 3 1 | 10 | 1 | 6 | 3 2 1 | 6 | 1 | 3 |
| 76541203 | 10101001 | 11000101 | 11110000 | 6 4 1 | 11 | 1 | 6 | 3 3 1 | 7 | 1 | 3 |
| 76541230 | 10101010 | 11000110 | 11110000 | 7 3 1 | 11 | 1 | 7 | 3 2 1 | 6 | 1 | 3 |
| 76541023 | 10101001 | 11000011 | 11110000 | 6 2 1 | 9 | 1 | 6 | 3 2 1 | 6 | 1 | 3 |
| 76541032 | 10101010 | 11000011 | 11110000 | 7 2 1 | 10 | 1 | 7 | 3 2 1 | 6 | 1 | 3 |
| 76541320 | 10101100 | 11000110 | 11110000 | 5 3 1 | 9 | 1 | 5 | 3 2 1 | 6 | 1 | 3 |
| 76541302 | 10101100 | 11000101 | 11110000 | 5 4 1 | 10 | 1 | 5 | 3 3 1 | 7 | 1 | 3 |
| 76543201 | 10101001 | 11001100 | 11110000 | 6 3 1 | 10 | 1 | 6 | 3 2 1 | 6 | 1 | 3 |
| 76543210 | 10101010 | 11001100 | 11110000 | 7 3 1 | 11 | 1 | 7 | 3 2 1 | 6 | 1 | 3 |
| 76543021 | 10101001 | 11001010 | 11110000 | 6 5 1 | 12 | 1 | 6 | 3 3 1 | 7 | 1 | 3 |
| 76543012 | 10101010 | 11001001 | 11110000 | 7 4 1 | 12 | 1 | 7 | 3 3 1 | 7 | 1 | 3 |
| 76543120 | 10101100 | 11001010 | 11110000 | 5 5 1 | 11 | 1 | 5 | 3 3 1 | 7 | 1 | 3 |
| 76543102 | 10101100 | 11001001 | 11110000 | 5 4 1 | 10 | 1 | 5 | 3 3 1 | 7 | 1 | 3 |
| 76512403 | 10110001 | 11001001 | 11100100 | 4 4 3 | 11 | 3 | 4 | 3 3 2 | 8 | 2 | 3 |
| 76512430 | 10110010 | 11001010 | 11100100 | 5 5 3 | 13 | 3 | 5 | 3 3 2 | 8 | 2 | 3 |
| 76512340 | 10110100 | 11001100 | 11100010 | 5 3 3 | 11 | 3 | 5 | 3 2 2 | 7 | 2 | 3 |
| 76514203 | 10110001 | 11000101 | 11101000 | 4 4 3 | 11 | 3 | 4 | 3 3 2 | 8 | 2 | 3 |
| 76514230 | 10110010 | 11000110 | 11101000 | 5 3 3 | 11 | 3 | 5 | 3 2 2 | 7 | 2 | 3 |
| 76514023 | 10110001 | 11000011 | 11101000 | 4 2 3 | 9 | 2 | 4 | 3 2 2 | 7 | 2 | 3 |
| 76514032 | 10110010 | 11000011 | 11101000 | 5 2 3 | 10 | 2 | 5 | 3 2 2 | 7 | 2 | 3 |
| 76514320 | 10110100 | 11000110 | 11101000 | 5 3 3 | 11 | 3 | 5 | 3 2 2 | 7 | 2 | 3 |
| 76514302 | 10110100 | 11000101 | 11101000 | 5 4 3 | 12 | 3 | 5 | 3 3 2 | 8 | 2 | 3 |
| 76513240 | 10111000 | 11001100 | 11100010 | 3 3 3 | 9 | 3 | 3 | 2 2 2 | 6 | 2 | 2 |
| 76513420 | 10111000 | 11001010 | 11100100 | 3 5 3 | 11 | 3 | 5 | 2 3 2 | 7 | 2 | 3 |
| 76513402 | 10111000 | 11001001 | 11100100 | 3 4 3 | 10 | 3 | 4 | 2 3 2 | 7 | 2 | 3 |
| 76532401 | 10110001 | 11011000 | 11100100 | 4 3 3 | 10 | 3 | 4 | 3 2 2 | 7 | 2 | 3 |
| 76532410 | 10110010 | 11011000 | 11100100 | 5 3 3 | 11 | 3 | 5 | 3 2 2 | 7 | 2 | 3 |
| 76532140 | 10110100 | 11011000 | 11100010 | 5 3 3 | 11 | 3 | 5 | 3 2 2 | 7 | 2 | 3 |
| 76534201 | 10110001 | 11010100 | 11101000 | 4 5 3 | 12 | 3 | 5 | 3 3 2 | 8 | 2 | 3 |
| 76534210 | 10110010 | 11010100 | 11101000 | 5 5 3 | 13 | 3 | 5 | 3 3 2 | 8 | 2 | 3 |
| 76534021 | 10110001 | 11010010 | 11101000 | 4 5 3 | 12 | 3 | 5 | 3 3 2 | 8 | 2 | 3 |
| 76534012 | 10110010 | 11010001 | 11101000 | 5 4 3 | 12 | 3 | 5 | 3 3 2 | 8 | 2 | 3 |
| 76534120 | 10110100 | 11010010 | 11101000 | 5 5 3 | 13 | 3 | 5 | 3 3 2 | 8 | 2 | 3 |
| 76534102 | 10110100 | 11010001 | 11101000 | 5 4 3 | 12 | 3 | 5 | 3 3 2 | 8 | 2 | 3 |
| 76531240 | 10111000 | 11010100 | 11100010 | 3 5 3 | 11 | 3 | 5 | 2 3 2 | 7 | 2 | 3 |
| 76531420 | 10111000 | 11010010 | 11100100 | 3 5 3 | 11 | 3 | 5 | 2 3 2 | 7 | 2 | 3 |
| 76531402 | 10111000 | 11010001 | 11100100 | 3 4 3 | 10 | 3 | 4 | 2 3 2 | 7 | 2 | 3 |
| 76324051 | 10100011 | 11110000 | 11001010 | 4 1 5 | 10 | 1 | 5 | 3 1 3 | 7 | 1 | 3 |
| 76324501 | 10100101 | 11110000 | 11001100 | 6 1 3 | 10 | 1 | 6 | 3 1 2 | 6 | 1 | 3 |
| 76324510 | 10100110 | 11110000 | 11001100 | 5 1 3 | 9 | 1 | 5 | 3 1 2 | 6 | 1 | 3 |
| 76325401 | 10101001 | 11110000 | 11001100 | 6 1 3 | 10 | 1 | 6 | 3 1 2 | 6 | 1 | 3 |
| 76325410 | 10101010 | 11110000 | 11001100 | 7 1 3 | 11 | 1 | 7 | 3 1 2 | 6 | 1 | 3 |
| 76325140 | 10101100 | 11110000 | 11001010 | 5 1 5 | 11 | 1 | 5 | 3 1 3 | 7 | 1 | 3 |
| 76342051 | 10100011 | 11101000 | 11001010 | 4 3 5 | 12 | 3 | 5 | 3 2 3 | 8 | 2 | 3 |
| 76342501 | 10100101 | 11101000 | 11010100 | 6 3 5 | 14 | 3 | 6 | 3 2 3 | 8 | 2 | 3 |
| 76342510 | 10100110 | 11101000 | 11010100 | 5 3 5 | 13 | 3 | 5 | 3 2 3 | 8 | 2 | 3 |
| 76340251 | 10100011 | 11100100 | 11010010 | 4 3 5 | 12 | 3 | 5 | 3 2 3 | 8 | 2 | 3 |
| 76340521 | 10100101 | 11100010 | 11010100 | 6 3 5 | 14 | 3 | 6 | 3 2 3 | 8 | 2 | 3 |
| 76340512 | 10100110 | 11100001 | 11010100 | 5 2 5 | 12 | 2 | 5 | 3 2 3 | 8 | 2 | 3 |
| 76345201 | 10101001 | 11100100 | 11011000 | 6 3 3 | 12 | 3 | 6 | 3 2 2 | 7 | 2 | 3 |
| 76345210 | 10101010 | 11100100 | 11011000 | 7 3 3 | 13 | 3 | 7 | 3 2 2 | 7 | 2 | 3 |
| 76345021 | 10101001 | 11100010 | 11011000 | 6 3 3 | 12 | 3 | 6 | 3 2 2 | 7 | 2 | 3 |
| 76345012 | 10101010 | 11100001 | 11011000 | 7 2 3 | 12 | 2 | 7 | 3 2 2 | 7 | 2 | 3 |

| States order | 1st state | 2nd state | 3rd state | 4th state | 5th state | 6th state | 7th state | 8th state |
|---|---|---|---|---|---|---|---|---|
| 76345120 | 1 1 1 | 1 1 0 | 0 1 1 | 1 0 0 | 1 0 1 | 0 0 1 | 0 1 0 | 0 0 0 |
| 76345102 | 1 1 1 | 1 1 0 | 0 1 1 | 1 0 0 | 1 0 1 | 0 0 1 | 0 0 0 | 0 1 0 |
| 76352401 | 1 1 1 | 1 1 0 | 0 1 1 | 1 0 1 | 0 1 0 | 1 0 0 | 0 0 0 | 0 0 1 |
| 76352410 | 1 1 1 | 1 1 0 | 0 1 1 | 1 0 1 | 0 1 0 | 1 0 0 | 0 0 1 | 0 0 0 |
| 76352140 | 1 1 1 | 1 1 0 | 0 1 1 | 1 0 1 | 0 1 0 | 0 0 1 | 1 0 0 | 0 0 0 |
| 76354201 | 1 1 1 | 1 1 0 | 0 1 1 | 1 0 1 | 1 0 0 | 0 1 0 | 0 0 1 | 0 0 0 |
| 76354210 | 1 1 1 | 1 1 0 | 0 1 1 | 1 0 1 | 1 0 0 | 0 1 0 | 0 0 1 | 0 0 0 |
| 76354021 | 1 1 1 | 1 1 0 | 0 1 1 | 1 0 1 | 1 0 0 | 0 0 0 | 0 1 0 | 0 0 1 |
| 76354012 | 1 1 1 | 1 1 0 | 0 1 1 | 1 0 1 | 1 0 0 | 0 0 0 | 0 0 1 | 0 1 0 |
| 76354120 | 1 1 1 | 1 1 0 | 0 1 1 | 1 0 1 | 1 0 0 | 0 0 1 | 0 1 0 | 0 0 0 |
| 76354102 | 1 1 1 | 1 1 0 | 0 1 1 | 1 0 1 | 1 0 0 | 0 0 1 | 0 0 0 | 0 1 0 |
| 76351240 | 1 1 1 | 1 1 0 | 0 1 1 | 1 0 1 | 0 0 1 | 0 1 0 | 1 0 0 | 0 0 0 |
| 76351420 | 1 1 1 | 1 1 0 | 0 1 1 | 1 0 1 | 0 0 1 | 1 0 0 | 0 1 0 | 0 0 0 |
| 76351402 | 1 1 1 | 1 1 0 | 0 1 1 | 1 0 1 | 0 0 1 | 1 0 0 | 0 0 0 | 0 1 0 |
| 75624013 | 1 1 1 | 1 0 1 | 1 1 0 | 0 1 0 | 1 0 0 | 0 0 0 | 0 0 1 | 0 1 1 |
| 75624031 | 1 1 1 | 1 0 1 | 1 1 0 | 0 1 0 | 1 0 0 | 0 0 0 | 0 1 1 | 0 0 1 |
| 75624103 | 1 1 1 | 1 0 1 | 1 1 0 | 0 1 0 | 1 0 0 | 0 0 1 | 0 0 0 | 0 1 1 |
| 75624130 | 1 1 1 | 1 0 1 | 1 1 0 | 0 1 0 | 1 0 0 | 0 0 1 | 0 1 1 | 0 0 0 |
| 75624301 | 1 1 1 | 1 0 1 | 1 1 0 | 0 1 0 | 1 0 0 | 0 1 1 | 0 0 0 | 0 0 1 |
| 75624310 | 1 1 1 | 1 0 1 | 1 1 0 | 0 1 0 | 1 0 0 | 0 1 1 | 0 0 1 | 0 0 0 |
| 75621403 | 1 1 1 | 1 0 1 | 1 1 0 | 0 1 0 | 0 0 1 | 1 0 0 | 0 0 0 | 0 1 1 |
| 75621430 | 1 1 1 | 1 0 1 | 1 1 0 | 0 1 0 | 0 0 1 | 1 0 0 | 0 1 1 | 0 0 0 |

APPENDIX A-continued

Evaluation of valid orderings for 3-bit MBC cells

| | | | | | | | | |
|---|---|---|---|---|---|---|---|---|
| 75621340 | 111 | 101 | 110 | 010 | 001 | 011 | 100 | 000 |
| 75623401 | 111 | 101 | 110 | 010 | 011 | 100 | 000 | 001 |
| 75623410 | 111 | 101 | 110 | 010 | 011 | 100 | 001 | 000 |
| 75623140 | 111 | 101 | 110 | 010 | 011 | 001 | 100 | 000 |
| 75642013 | 111 | 101 | 110 | 100 | 010 | 000 | 001 | 011 |
| 75642031 | 111 | 101 | 110 | 100 | 010 | 000 | 011 | 001 |
| 75642103 | 111 | 101 | 110 | 100 | 010 | 001 | 000 | 011 |
| 75642130 | 111 | 101 | 110 | 100 | 010 | 001 | 011 | 000 |
| 75642301 | 111 | 101 | 110 | 100 | 010 | 011 | 000 | 001 |
| 75642310 | 111 | 101 | 110 | 100 | 010 | 011 | 001 | 000 |
| 75640213 | 111 | 101 | 110 | 100 | 000 | 010 | 001 | 011 |
| 75640231 | 111 | 101 | 110 | 100 | 000 | 010 | 011 | 001 |
| 75640123 | 111 | 101 | 110 | 100 | 000 | 001 | 010 | 011 |
| 75640132 | 111 | 101 | 110 | 100 | 000 | 001 | 011 | 010 |
| 75640312 | 111 | 101 | 110 | 100 | 000 | 011 | 001 | 010 |
| 75640321 | 111 | 101 | 110 | 100 | 000 | 011 | 010 | 001 |
| 75641203 | 111 | 101 | 110 | 100 | 001 | 010 | 000 | 011 |
| 75641230 | 111 | 101 | 110 | 100 | 001 | 010 | 011 | 000 |
| 75641023 | 111 | 101 | 110 | 100 | 001 | 000 | 010 | 011 |
| 75641032 | 111 | 101 | 110 | 100 | 001 | 000 | 011 | 010 |
| 75641320 | 111 | 101 | 110 | 100 | 001 | 011 | 010 | 000 |
| 75641302 | 111 | 101 | 110 | 100 | 001 | 011 | 000 | 010 |
| 75643201 | 111 | 101 | 110 | 100 | 011 | 010 | 000 | 001 |
| 75643210 | 111 | 101 | 110 | 100 | 011 | 010 | 001 | 000 |
| 75643021 | 111 | 101 | 110 | 100 | 011 | 000 | 010 | 001 |
| 75643012 | 111 | 101 | 110 | 100 | 011 | 000 | 001 | 010 |
| 75643120 | 111 | 101 | 110 | 100 | 011 | 001 | 010 | 000 |
| 75643102 | 111 | 101 | 110 | 100 | 011 | 001 | 000 | 010 |
| 75612403 | 111 | 101 | 110 | 001 | 010 | 100 | 000 | 011 |
| 75612430 | 111 | 101 | 110 | 001 | 010 | 100 | 011 | 000 |
| 75612340 | 111 | 101 | 110 | 001 | 010 | 011 | 100 | 000 |
| 75614203 | 111 | 101 | 110 | 001 | 100 | 010 | 000 | 011 |
| 75614230 | 111 | 101 | 110 | 001 | 100 | 010 | 011 | 000 |
| 75614023 | 111 | 101 | 110 | 001 | 100 | 000 | 010 | 011 |
| 75614032 | 111 | 101 | 110 | 001 | 100 | 000 | 011 | 010 |
| 75614320 | 111 | 101 | 110 | 001 | 100 | 011 | 010 | 000 |
| 75614302 | 111 | 101 | 110 | 001 | 100 | 011 | 000 | 010 |
| 75613240 | 111 | 101 | 110 | 001 | 011 | 010 | 100 | 000 |
| 75613420 | 111 | 101 | 110 | 001 | 011 | 100 | 010 | 000 |
| 75613402 | 111 | 101 | 110 | 001 | 011 | 100 | 000 | 010 |
| 75632401 | 111 | 101 | 110 | 011 | 010 | 100 | 000 | 001 |
| 75632410 | 111 | 101 | 110 | 011 | 010 | 100 | 001 | 000 |
| 75632140 | 111 | 101 | 110 | 011 | 010 | 001 | 100 | 000 |
| 75634201 | 111 | 101 | 110 | 011 | 100 | 010 | 000 | 001 |
| 75634210 | 111 | 101 | 110 | 011 | 100 | 010 | 001 | 000 |
| 75634021 | 111 | 101 | 110 | 011 | 100 | 000 | 010 | 001 |
| 75634012 | 111 | 101 | 110 | 011 | 100 | 000 | 001 | 010 |
| 75634120 | 111 | 101 | 110 | 011 | 100 | 001 | 010 | 000 |
| 75634102 | 111 | 101 | 110 | 011 | 100 | 001 | 000 | 010 |
| 75631240 | 111 | 101 | 110 | 011 | 001 | 010 | 100 | 000 |
| 75631420 | 111 | 101 | 110 | 011 | 001 | 100 | 010 | 000 |
| 75631402 | 111 | 101 | 110 | 011 | 001 | 100 | 000 | 010 |
| 75162403 | 111 | 101 | 001 | 110 | 010 | 100 | 000 | 011 |
| 75162430 | 111 | 101 | 001 | 110 | 010 | 100 | 011 | 000 |
| 75162340 | 111 | 101 | 001 | 110 | 010 | 011 | 100 | 000 |
| 75164203 | 111 | 101 | 001 | 110 | 100 | 010 | 000 | 011 |
| 75164230 | 111 | 101 | 001 | 110 | 100 | 010 | 011 | 000 |
| 75164023 | 111 | 101 | 001 | 110 | 100 | 000 | 010 | 011 |
| 75164032 | 111 | 101 | 001 | 110 | 100 | 000 | 011 | 010 |
| 75164320 | 111 | 101 | 001 | 110 | 100 | 011 | 010 | 000 |
| 75164302 | 111 | 101 | 001 | 110 | 100 | 011 | 000 | 010 |

| States order | Lower bit sequence | Middle bit sequence | Upper bit sequence | static comp | T | Min | Max | dynamic comp | T | Min | Max |
|---|---|---|---|---|---|---|---|---|---|---|---|
| 76345120 | 10101100 | 11100010 | 11011000 | 5 3 3 | 11 | 3 | 5 | 3 2 2 | 7 | 2 | 3 |
| 76345102 | 10101100 | 11100001 | 11011000 | 5 2 3 | 10 | 2 | 5 | 3 2 2 | 7 | 2 | 3 |
| 76352401 | 10110001 | 11101000 | 11010100 | 4 3 5 | 12 | 3 | 5 | 3 2 3 | 8 | 2 | 3 |
| 76352410 | 10110010 | 11101000 | 11010100 | 5 3 5 | 13 | 3 | 5 | 3 2 3 | 8 | 2 | 3 |
| 76352140 | 10110100 | 11101000 | 11010010 | 5 3 5 | 13 | 3 | 5 | 3 2 3 | 8 | 2 | 3 |
| 76354201 | 10110001 | 11100100 | 11011000 | 4 3 3 | 10 | 3 | 4 | 3 2 2 | 7 | 2 | 3 |
| 76354210 | 10110010 | 11100100 | 11011000 | 5 3 3 | 11 | 3 | 5 | 3 2 2 | 7 | 2 | 3 |
| 76354021 | 10110001 | 11100010 | 11011000 | 4 3 3 | 10 | 3 | 4 | 3 2 2 | 7 | 2 | 3 |
| 76354012 | 10110010 | 11100001 | 11011000 | 5 2 3 | 10 | 2 | 5 | 3 2 2 | 7 | 2 | 3 |
| 76354120 | 10110100 | 11100010 | 11011000 | 5 3 3 | 11 | 3 | 5 | 3 2 2 | 7 | 2 | 3 |
| 76354102 | 10110100 | 11100001 | 11011000 | 5 2 3 | 10 | 2 | 5 | 3 2 2 | 7 | 2 | 3 |
| 76351240 | 10111000 | 11100100 | 11010010 | 3 3 5 | 11 | 3 | 5 | 2 2 3 | 7 | 2 | 3 |
| 76351420 | 10111000 | 11100010 | 11010100 | 3 3 5 | 11 | 3 | 5 | 2 2 3 | 7 | 2 | 3 |
| 76351402 | 10111000 | 11100001 | 11010100 | 3 2 5 | 10 | 2 | 5 | 2 2 3 | 7 | 2 | 3 |

APPENDIX A-continued

Evaluation of valid orderings for 3-bit MBC cells

| | | | | | | | | | | |
|---|---|---|---|---|---|---|---|---|---|---|
| 7 5 6 2 4 0 1 3 | 1 1 0 0 0 0 1 1 | 1 0 1 1 0 0 0 1 | 1 1 1 0 1 0 0 0 | 2 4 3 | 9 | 2 | 4 | 2 3 2 | 7 | 2 | 3 |
| 7 5 6 2 4 0 3 1 | 1 1 0 0 0 0 1 1 | 1 0 1 1 0 0 1 0 | 1 1 1 0 1 0 0 0 | 2 5 3 | 10 | 2 | 5 | 2 3 2 | 7 | 2 | 3 |
| 7 5 6 2 4 1 0 3 | 1 1 0 0 0 1 0 1 | 1 0 1 1 0 0 0 1 | 1 1 1 0 1 0 0 0 | 4 4 3 | 11 | 3 | 4 | 3 3 2 | 8 | 2 | 3 |
| 7 5 6 2 4 1 3 0 | 1 1 0 0 0 1 1 0 | 1 0 1 1 0 0 1 0 | 1 1 1 0 1 0 0 0 | 3 5 3 | 11 | 3 | 5 | 2 3 2 | 7 | 2 | 3 |
| 7 5 6 2 4 3 0 1 | 1 1 0 0 0 1 0 1 | 1 0 1 1 0 1 0 0 | 1 1 1 0 1 0 0 0 | 4 5 3 | 12 | 3 | 5 | 3 3 2 | 8 | 2 | 3 |
| 7 5 6 2 4 3 1 0 | 1 1 0 0 0 1 1 0 | 1 0 1 1 0 1 0 0 | 1 1 1 0 1 0 0 0 | 3 5 3 | 11 | 3 | 5 | 2 3 2 | 7 | 2 | 3 |
| 7 5 6 2 1 4 0 3 | 1 1 0 0 1 0 0 1 | 1 0 1 1 0 0 0 1 | 1 1 1 0 0 1 0 0 | 4 4 3 | 11 | 3 | 4 | 3 3 2 | 8 | 2 | 3 |
| 7 5 6 2 1 4 3 0 | 1 1 0 0 1 0 1 0 | 1 0 1 1 0 0 1 0 | 1 1 1 0 0 1 0 0 | 5 5 3 | 13 | 3 | 5 | 3 3 2 | 8 | 2 | 3 |
| 7 5 6 2 1 3 4 0 | 1 1 0 0 1 1 0 0 | 1 0 1 1 0 1 0 0 | 1 1 1 0 0 0 1 0 | 3 5 3 | 11 | 3 | 5 | 2 3 2 | 7 | 2 | 3 |
| 7 5 6 2 3 4 0 1 | 1 1 0 0 1 0 0 1 | 1 0 1 1 1 0 0 0 | 1 1 1 0 0 1 0 0 | 4 3 3 | 10 | 3 | 4 | 3 2 2 | 7 | 2 | 3 |
| 7 5 6 2 3 4 1 0 | 1 1 0 0 1 0 1 0 | 1 0 1 1 1 0 0 0 | 1 1 1 0 0 1 0 0 | 5 3 3 | 11 | 3 | 5 | 3 2 2 | 7 | 2 | 3 |
| 7 5 6 2 3 1 4 0 | 1 1 0 0 1 1 0 0 | 1 0 1 1 1 0 0 0 | 1 1 1 0 0 0 1 0 | 3 3 3 | 9 | 3 | 3 | 2 2 2 | 6 | 2 | 2 |
| 7 5 6 4 2 0 1 3 | 1 1 0 0 0 0 1 1 | 1 0 1 0 1 0 0 1 | 1 1 1 1 0 0 0 0 | 2 6 1 | 9 | 1 | 6 | 2 3 1 | 6 | 1 | 3 |
| 7 5 6 4 2 0 3 1 | 1 1 0 0 0 0 1 1 | 1 0 1 0 1 0 1 0 | 1 1 1 1 0 0 0 0 | 2 7 1 | 10 | 1 | 7 | 2 3 1 | 6 | 1 | 3 |
| 7 5 6 4 2 1 0 3 | 1 1 0 0 0 1 0 1 | 1 0 1 0 1 0 0 1 | 1 1 1 1 0 0 0 0 | 4 6 1 | 11 | 1 | 6 | 3 3 1 | 7 | 1 | 3 |
| 7 5 6 4 2 1 3 0 | 1 1 0 0 0 1 1 0 | 1 0 1 0 1 0 1 0 | 1 1 1 1 0 0 0 0 | 3 7 1 | 11 | 1 | 7 | 2 3 1 | 6 | 1 | 3 |
| 7 5 6 4 2 3 0 1 | 1 1 0 0 0 1 0 1 | 1 0 1 0 1 1 0 0 | 1 1 1 1 0 0 0 0 | 4 5 1 | 10 | 1 | 5 | 3 3 1 | 7 | 1 | 3 |
| 7 5 6 4 2 3 1 0 | 1 1 0 0 0 1 1 0 | 1 0 1 0 1 1 0 0 | 1 1 1 1 0 0 0 0 | 3 5 1 | 9 | 1 | 5 | 2 3 1 | 6 | 1 | 3 |
| 7 5 6 4 0 2 1 3 | 1 1 0 0 0 0 1 1 | 1 0 1 0 0 1 0 1 | 1 1 1 1 0 0 0 0 | 2 6 1 | 9 | 1 | 6 | 2 3 1 | 6 | 1 | 3 |
| 7 5 6 4 0 2 3 1 | 1 1 0 0 0 0 1 1 | 1 0 1 0 0 1 1 0 | 1 1 1 1 0 0 0 0 | 2 5 1 | 8 | 1 | 5 | 2 3 1 | 6 | 1 | 3 |
| 7 5 6 4 0 1 2 3 | 1 1 0 0 0 1 0 1 | 1 0 1 0 0 0 1 1 | 1 1 1 1 0 0 0 0 | 4 4 1 | 9 | 1 | 4 | 3 3 1 | 7 | 1 | 3 |
| 7 5 6 4 0 1 3 2 | 1 1 0 0 0 1 1 0 | 1 0 1 0 0 0 1 1 | 1 1 1 1 0 0 0 0 | 3 4 1 | 8 | 1 | 4 | 2 3 1 | 6 | 1 | 3 |
| 7 5 6 4 0 3 1 2 | 1 1 0 0 0 1 0 1 | 1 0 1 0 0 1 1 0 | 1 1 1 1 0 0 0 0 | 3 6 1 | 10 | 1 | 6 | 2 3 1 | 6 | 1 | 3 |
| 7 5 6 4 0 3 2 1 | 1 1 0 0 0 1 0 1 | 1 0 1 0 0 1 1 0 | 1 1 1 1 0 0 0 0 | 4 5 1 | 10 | 1 | 5 | 3 3 1 | 7 | 1 | 3 |
| 7 5 6 4 1 2 0 3 | 1 1 0 0 1 0 0 1 | 1 0 1 0 0 1 0 1 | 1 1 1 1 0 0 0 0 | 4 6 1 | 11 | 1 | 6 | 3 3 1 | 7 | 1 | 3 |
| 7 5 6 4 1 2 3 0 | 1 1 0 0 1 0 1 0 | 1 0 1 0 0 1 1 0 | 1 1 1 1 0 0 0 0 | 5 5 1 | 11 | 1 | 5 | 3 3 1 | 7 | 1 | 3 |
| 7 5 6 4 1 0 2 3 | 1 1 0 0 1 0 0 1 | 1 0 1 0 0 0 1 1 | 1 1 1 1 0 0 0 0 | 4 4 1 | 9 | 1 | 4 | 3 3 1 | 7 | 1 | 3 |
| 7 5 6 4 1 0 3 2 | 1 1 0 0 1 0 1 0 | 1 0 1 0 0 0 1 1 | 1 1 1 1 0 0 0 0 | 5 4 1 | 10 | 1 | 5 | 3 3 1 | 7 | 1 | 3 |
| 7 5 6 4 1 3 2 0 | 1 1 0 0 1 1 0 0 | 1 0 1 0 0 1 1 0 | 1 1 1 1 0 0 0 0 | 3 5 1 | 9 | 1 | 5 | 2 3 1 | 6 | 1 | 3 |
| 7 5 6 4 1 3 0 2 | 1 1 0 0 1 1 0 0 | 1 0 1 0 0 1 0 1 | 1 1 1 1 0 0 0 0 | 3 6 1 | 10 | 1 | 6 | 2 3 1 | 6 | 1 | 3 |
| 7 5 6 4 3 2 0 1 | 1 1 0 0 1 0 0 1 | 1 0 1 0 1 1 0 0 | 1 1 1 1 0 0 0 0 | 4 5 1 | 10 | 1 | 5 | 3 3 1 | 7 | 1 | 3 |
| 7 5 6 4 3 2 1 0 | 1 1 0 0 1 0 1 0 | 1 0 1 0 1 1 0 0 | 1 1 1 1 0 0 0 0 | 5 5 1 | 11 | 1 | 5 | 3 3 1 | 7 | 1 | 3 |
| 7 5 6 4 3 0 2 1 | 1 1 0 0 1 0 0 1 | 1 0 1 0 1 0 1 0 | 1 1 1 1 0 0 0 0 | 4 7 1 | 12 | 1 | 7 | 3 3 1 | 7 | 1 | 3 |
| 7 5 6 4 3 0 1 2 | 1 1 0 0 1 0 1 0 | 1 0 1 0 1 0 0 1 | 1 1 1 1 0 0 0 0 | 5 6 1 | 12 | 1 | 6 | 3 3 1 | 7 | 1 | 3 |
| 7 5 6 4 3 1 2 0 | 1 1 0 0 1 1 0 0 | 1 0 1 0 1 0 1 0 | 1 1 1 1 0 0 0 0 | 3 7 1 | 11 | 1 | 7 | 2 3 1 | 6 | 1 | 3 |
| 7 5 6 4 3 1 0 2 | 1 1 0 0 1 1 0 0 | 1 0 1 0 1 0 0 1 | 1 1 1 1 0 0 0 0 | 3 6 1 | 10 | 1 | 6 | 2 3 1 | 6 | 1 | 3 |
| 7 5 6 1 2 4 0 3 | 1 1 0 1 0 0 0 1 | 1 0 1 0 1 0 0 1 | 1 1 1 0 0 1 0 0 | 4 6 3 | 13 | 3 | 6 | 3 3 2 | 8 | 2 | 3 |
| 7 5 6 1 2 4 3 0 | 1 1 0 1 0 0 1 0 | 1 0 1 0 1 0 1 0 | 1 1 1 0 0 1 0 0 | 5 7 3 | 15 | 3 | 7 | 3 3 2 | 8 | 2 | 3 |
| 7 5 6 1 2 3 4 0 | 1 1 0 1 0 1 0 0 | 1 0 1 0 1 1 0 0 | 1 1 1 0 0 0 1 0 | 5 5 3 | 13 | 3 | 5 | 3 3 2 | 8 | 2 | 3 |
| 7 5 6 1 4 2 0 3 | 1 1 0 1 0 0 0 1 | 1 0 1 0 0 1 0 1 | 1 1 1 0 1 0 0 0 | 4 5 3 | 13 | 3 | 6 | 3 3 2 | 8 | 2 | 3 |
| 7 5 6 1 4 2 3 0 | 1 1 0 1 0 0 1 0 | 1 0 1 0 0 1 1 0 | 1 1 1 0 1 0 0 0 | 5 5 3 | 13 | 3 | 5 | 3 3 2 | 8 | 2 | 3 |
| 7 5 6 1 4 0 2 3 | 1 1 0 1 0 0 0 1 | 1 0 1 0 0 0 1 1 | 1 1 1 0 1 0 0 0 | 4 4 3 | 11 | 3 | 4 | 3 3 2 | 8 | 2 | 3 |
| 7 5 6 1 4 0 3 2 | 1 1 0 1 0 0 1 0 | 1 0 1 0 0 0 1 1 | 1 1 1 0 1 0 0 0 | 5 4 3 | 12 | 3 | 5 | 3 3 2 | 8 | 2 | 3 |
| 7 5 6 1 4 3 2 0 | 1 1 0 1 0 1 0 0 | 1 0 1 0 0 1 1 0 | 1 1 1 0 1 0 0 0 | 5 5 3 | 13 | 3 | 5 | 3 3 2 | 8 | 2 | 3 |
| 7 5 6 1 4 3 0 2 | 1 1 0 1 0 1 0 0 | 1 0 1 0 0 1 0 1 | 1 1 1 0 1 0 0 0 | 5 6 3 | 14 | 3 | 6 | 3 3 2 | 8 | 2 | 3 |
| 7 5 6 1 3 2 4 0 | 1 1 0 1 1 0 0 0 | 1 0 1 0 1 1 0 0 | 1 1 1 0 0 0 1 0 | 3 5 3 | 11 | 3 | 5 | 2 3 2 | 7 | 2 | 3 |
| 7 5 6 1 3 4 2 0 | 1 1 0 1 1 0 0 0 | 1 0 1 0 1 0 1 0 | 1 1 1 0 0 1 0 0 | 3 7 3 | 13 | 3 | 7 | 2 3 2 | 7 | 2 | 3 |
| 7 5 6 1 3 4 0 2 | 1 1 0 1 1 0 0 0 | 1 0 1 0 1 0 0 1 | 1 1 1 0 1 0 0 0 | 3 6 3 | 12 | 3 | 4 | 2 3 2 | 7 | 2 | 3 |
| 7 5 6 3 2 4 0 1 | 1 1 0 1 0 0 0 1 | 1 0 1 1 1 0 0 0 | 1 1 1 0 0 1 0 0 | 4 3 3 | 10 | 3 | 4 | 3 2 2 | 7 | 2 | 3 |
| 7 5 6 3 2 4 1 0 | 1 1 0 1 0 0 1 0 | 1 0 1 1 1 0 0 0 | 1 1 1 0 0 1 0 0 | 5 3 3 | 11 | 3 | 5 | 3 2 2 | 7 | 2 | 3 |
| 7 5 6 3 2 1 4 0 | 1 1 0 1 0 1 0 0 | 1 0 1 1 1 0 0 0 | 1 1 1 0 0 0 1 0 | 5 3 3 | 11 | 3 | 5 | 3 2 2 | 7 | 2 | 3 |
| 7 5 6 3 4 2 0 1 | 1 1 0 1 0 0 0 1 | 1 0 1 1 0 1 0 0 | 1 1 1 0 1 0 0 0 | 4 5 3 | 12 | 3 | 5 | 3 3 2 | 8 | 2 | 3 |
| 7 5 6 3 4 2 1 0 | 1 1 0 1 0 0 1 0 | 1 0 1 1 0 1 0 0 | 1 1 1 0 1 0 0 0 | 5 5 3 | 13 | 3 | 5 | 3 3 2 | 8 | 2 | 3 |
| 7 5 6 3 4 0 2 1 | 1 1 0 1 0 0 0 1 | 1 0 1 1 0 0 1 0 | 1 1 1 0 1 0 0 0 | 4 5 3 | 12 | 3 | 5 | 3 3 2 | 8 | 2 | 3 |
| 7 5 6 3 4 0 1 2 | 1 1 0 1 0 0 1 0 | 1 0 1 1 0 0 1 0 | 1 1 1 0 1 0 0 0 | 5 4 3 | 12 | 3 | 5 | 3 3 2 | 8 | 2 | 3 |
| 7 5 6 3 4 1 2 0 | 1 1 0 1 0 1 0 0 | 1 0 1 1 0 1 0 0 | 1 1 1 0 1 0 0 0 | 5 5 3 | 13 | 3 | 5 | 3 3 2 | 8 | 2 | 3 |
| 7 5 6 3 4 1 0 2 | 1 1 0 1 0 1 0 0 | 1 0 1 1 0 0 0 1 | 1 1 1 0 1 0 0 0 | 5 4 3 | 12 | 3 | 5 | 3 3 2 | 8 | 2 | 3 |
| 7 5 6 3 1 2 4 0 | 1 1 0 1 1 0 0 0 | 1 0 1 1 0 1 0 0 | 1 1 1 0 0 0 1 0 | 3 5 3 | 11 | 3 | 5 | 2 3 2 | 7 | 2 | 3 |
| 7 5 6 3 1 4 2 0 | 1 1 0 1 1 0 0 0 | 1 0 1 1 0 0 1 0 | 1 1 1 0 0 1 0 0 | 3 5 3 | 11 | 3 | 5 | 2 3 2 | 7 | 2 | 3 |
| 7 5 6 3 1 4 0 2 | 1 1 0 1 1 0 0 0 | 1 0 1 1 0 0 0 1 | 1 1 1 0 1 0 0 0 | 3 4 3 | 10 | 3 | 4 | 2 3 2 | 7 | 2 | 3 |
| 7 5 1 6 2 4 0 3 | 1 1 1 0 0 0 0 1 | 1 0 0 1 1 0 0 1 | 1 1 0 1 0 1 0 0 | 2 4 5 | 11 | 2 | 5 | 2 3 3 | 8 | 2 | 3 |
| 7 5 1 6 2 4 3 0 | 1 1 1 0 0 0 1 0 | 1 0 0 1 1 0 1 0 | 1 1 0 1 0 1 0 0 | 3 5 5 | 13 | 3 | 5 | 2 3 3 | 8 | 2 | 3 |
| 7 5 1 6 2 3 4 0 | 1 1 1 0 0 1 0 0 | 1 0 0 1 1 1 0 0 | 1 1 0 1 0 0 1 0 | 3 3 5 | 11 | 3 | 5 | 2 2 3 | 7 | 2 | 3 |
| 7 5 1 6 4 2 0 3 | 1 1 1 0 0 0 0 1 | 1 0 0 1 0 1 0 1 | 1 1 0 1 1 0 0 0 | 2 6 3 | 11 | 2 | 8 | 2 3 2 | 7 | 2 | 3 |
| 7 5 1 6 4 2 3 0 | 1 1 1 0 0 0 1 0 | 1 0 0 1 0 1 1 0 | 1 1 0 1 1 0 0 0 | 3 5 3 | 11 | 3 | 5 | 2 3 2 | 7 | 2 | 3 |
| 7 5 1 6 4 0 2 3 | 1 1 1 0 0 0 0 1 | 1 0 0 1 0 0 1 1 | 1 1 0 1 1 0 0 0 | 2 4 3 | 9 | 2 | 4 | 2 3 2 | 7 | 2 | 3 |
| 7 5 1 6 4 0 3 2 | 1 1 1 0 0 0 1 0 | 1 0 0 1 0 0 1 1 | 1 1 0 1 1 0 0 0 | 2 4 3 | 10 | 3 | 4 | 2 3 2 | 7 | 2 | 3 |
| 7 5 1 6 4 3 2 0 | 1 1 1 0 0 1 0 0 | 1 0 0 1 0 1 1 0 | 1 1 0 1 1 0 0 0 | 3 5 3 | 11 | 3 | 5 | 2 3 2 | 7 | 2 | 3 |
| 7 5 1 6 4 3 0 2 | 1 1 1 0 0 1 0 0 | 1 0 0 1 0 1 0 1 | 1 1 0 1 1 0 0 0 | 3 6 3 | 12 | 3 | 6 | 2 3 2 | 7 | 2 | 3 |

| States order | 1st state | 2nd state | 3rd state | 4th state | 5th state | 6th state | 7th state | 8th state |
|---|---|---|---|---|---|---|---|---|
| 7 5 1 6 3 2 4 0 | 1 1 1 | 1 0 1 | 0 0 1 | 1 1 0 | 0 1 1 | 0 1 0 | 1 0 0 | 0 0 0 |
| 7 5 1 6 3 4 2 0 | 1 1 1 | 1 0 1 | 0 0 1 | 1 1 0 | 0 1 1 | 1 0 0 | 0 1 0 | 0 0 0 |
| 7 5 1 6 3 4 0 2 | 1 1 1 | 1 0 1 | 0 0 1 | 1 1 0 | 0 1 1 | 1 0 0 | 0 0 0 | 0 1 0 |
| 7 5 1 3 6 2 4 0 | 1 1 1 | 1 0 1 | 0 0 1 | 0 1 1 | 1 1 0 | 0 1 0 | 1 0 0 | 0 0 0 |
| 7 5 1 3 6 4 2 0 | 1 1 1 | 1 0 1 | 0 0 1 | 0 1 1 | 1 1 0 | 1 0 0 | 0 1 0 | 0 0 0 |
| 7 5 1 3 6 4 0 2 | 1 1 1 | 1 0 1 | 0 0 1 | 0 1 1 | 1 1 0 | 1 0 0 | 0 0 0 | 0 1 0 |

APPENDIX A-continued

Evaluation of valid orderings for 3-bit MBC cells

| | | | | | | | | |
|---|---|---|---|---|---|---|---|---|
| 7 5 3 6 2 4 0 1 | 1 1 1 | 1 0 1 | 0 1 1 | 1 1 0 | 0 1 0 | 1 0 0 | 0 0 0 | 0 0 1 |
| 7 5 3 6 2 4 1 0 | 1 1 1 | 1 0 1 | 0 1 1 | 1 1 0 | 0 1 0 | 1 0 0 | 0 0 1 | 0 0 0 |
| 7 5 3 6 2 1 4 0 | 1 1 1 | 1 0 1 | 0 1 1 | 1 1 0 | 0 1 0 | 0 0 1 | 1 0 0 | 0 0 0 |
| 7 5 3 6 4 2 0 1 | 1 1 1 | 1 0 1 | 0 1 1 | 1 1 0 | 1 0 0 | 0 1 0 | 0 0 0 | 0 0 1 |
| 7 5 3 6 4 2 1 0 | 1 1 1 | 1 0 1 | 0 1 1 | 1 1 0 | 1 0 0 | 0 1 0 | 0 0 1 | 0 0 0 |
| 7 5 3 6 4 0 2 1 | 1 1 1 | 1 0 1 | 0 1 1 | 1 1 0 | 1 0 0 | 0 0 0 | 0 1 0 | 0 0 1 |
| 7 5 3 6 4 0 1 2 | 1 1 1 | 1 0 1 | 0 1 1 | 1 1 0 | 1 0 0 | 0 0 0 | 0 0 1 | 0 1 0 |
| 7 5 3 6 4 1 2 0 | 1 1 1 | 1 0 1 | 0 1 1 | 1 1 0 | 1 0 0 | 0 0 1 | 0 1 0 | 0 0 0 |
| 7 5 3 6 4 1 0 2 | 1 1 1 | 1 0 1 | 0 1 1 | 1 1 0 | 1 0 0 | 0 0 1 | 0 0 0 | 0 1 0 |
| 7 5 3 6 1 2 4 0 | 1 1 1 | 1 0 1 | 0 1 1 | 1 1 0 | 0 0 1 | 0 1 0 | 1 0 0 | 0 0 0 |
| 7 5 3 6 1 4 2 0 | 1 1 1 | 1 0 1 | 0 1 1 | 1 1 0 | 0 0 1 | 1 0 0 | 0 1 0 | 0 0 0 |
| 7 5 3 6 1 4 0 2 | 1 1 1 | 1 0 1 | 0 1 1 | 1 1 0 | 0 0 1 | 1 0 0 | 0 0 0 | 0 1 0 |
| 7 5 3 1 6 2 4 0 | 1 1 1 | 1 0 1 | 0 1 1 | 0 0 1 | 1 1 0 | 0 1 0 | 1 0 0 | 0 0 0 |
| 7 5 3 1 6 4 2 0 | 1 1 1 | 1 0 1 | 0 1 1 | 0 0 1 | 1 1 0 | 1 0 0 | 0 1 0 | 0 0 0 |
| 7 5 3 1 6 4 0 2 | 1 1 1 | 1 0 1 | 0 1 1 | 0 0 1 | 1 1 0 | 1 0 0 | 0 0 0 | 0 1 0 |
| 7 3 6 2 4 0 5 1 | 1 1 1 | 0 1 1 | 1 1 0 | 0 1 0 | 1 0 0 | 0 0 0 | 1 0 1 | 0 0 1 |
| 7 3 6 2 4 5 0 1 | 1 1 1 | 0 1 1 | 1 1 0 | 0 1 0 | 1 0 0 | 1 0 1 | 0 0 0 | 0 0 1 |
| 7 3 6 2 4 5 1 0 | 1 1 1 | 0 1 1 | 1 1 0 | 0 1 0 | 1 0 0 | 1 0 1 | 0 0 1 | 0 0 0 |
| 7 3 6 2 5 4 0 1 | 1 1 1 | 0 1 1 | 1 1 0 | 0 1 0 | 1 0 1 | 1 0 0 | 0 0 0 | 0 0 1 |
| 7 3 6 2 5 4 1 0 | 1 1 1 | 0 1 1 | 1 1 0 | 0 1 0 | 1 0 1 | 1 0 0 | 0 0 1 | 0 0 0 |
| 7 3 6 2 5 1 4 0 | 1 1 1 | 0 1 1 | 1 1 0 | 0 1 0 | 1 0 1 | 0 0 1 | 1 0 0 | 0 0 0 |
| 7 3 6 4 2 0 5 1 | 1 1 1 | 0 1 1 | 1 1 0 | 1 0 0 | 0 1 0 | 0 0 0 | 1 0 1 | 0 0 1 |
| 7 3 6 4 2 5 0 1 | 1 1 1 | 0 1 1 | 1 1 0 | 1 0 0 | 0 1 0 | 1 0 1 | 0 0 0 | 0 0 1 |
| 7 3 6 4 2 5 1 0 | 1 1 1 | 0 1 1 | 1 1 0 | 1 0 0 | 0 1 0 | 1 0 1 | 0 0 1 | 0 0 0 |
| 7 3 6 4 0 2 5 1 | 1 1 1 | 0 1 1 | 1 1 0 | 1 0 0 | 0 0 0 | 0 1 0 | 1 0 1 | 0 0 1 |
| 7 3 6 4 0 5 2 1 | 1 1 1 | 0 1 1 | 1 1 0 | 1 0 0 | 0 0 0 | 1 0 1 | 0 1 0 | 0 0 1 |
| 7 3 6 4 0 5 1 2 | 1 1 1 | 0 1 1 | 1 1 0 | 1 0 0 | 0 0 0 | 1 0 1 | 0 0 1 | 0 1 0 |
| 7 3 6 4 5 2 0 1 | 1 1 1 | 0 1 1 | 1 1 0 | 1 0 0 | 1 0 1 | 0 1 0 | 0 0 0 | 0 0 1 |
| 7 3 6 4 5 2 1 0 | 1 1 1 | 0 1 1 | 1 1 0 | 1 0 0 | 1 0 1 | 0 1 0 | 0 0 1 | 0 0 0 |
| 7 3 6 4 5 0 2 1 | 1 1 1 | 0 1 1 | 1 1 0 | 1 0 0 | 1 0 1 | 0 0 0 | 0 1 0 | 0 0 1 |
| 7 3 6 4 5 0 1 2 | 1 1 1 | 0 1 1 | 1 1 0 | 1 0 0 | 1 0 1 | 0 0 0 | 0 0 1 | 0 1 0 |
| 7 3 6 4 5 1 2 0 | 1 1 1 | 0 1 1 | 1 1 0 | 1 0 0 | 1 0 1 | 0 0 1 | 0 1 0 | 0 0 0 |
| 7 3 6 4 5 1 0 2 | 1 1 1 | 0 1 1 | 1 1 0 | 1 0 0 | 1 0 1 | 0 0 1 | 0 0 0 | 0 1 0 |
| 7 3 6 5 2 4 0 1 | 1 1 1 | 0 1 1 | 1 1 0 | 1 0 1 | 0 1 0 | 1 0 0 | 0 0 0 | 0 0 1 |
| 7 3 6 5 2 4 1 0 | 1 1 1 | 0 1 1 | 1 1 0 | 1 0 1 | 0 1 0 | 1 0 0 | 0 0 1 | 0 0 0 |
| 7 3 6 5 2 1 4 0 | 1 1 1 | 0 1 1 | 1 1 0 | 1 0 1 | 0 1 0 | 0 0 1 | 1 0 0 | 0 0 0 |
| 7 3 6 5 4 2 0 1 | 1 1 1 | 0 1 1 | 1 1 0 | 1 0 1 | 1 0 0 | 0 1 0 | 0 0 0 | 0 0 1 |
| 7 3 6 5 4 2 1 0 | 1 1 1 | 0 1 1 | 1 1 0 | 1 0 1 | 1 0 0 | 0 1 0 | 0 0 1 | 0 0 0 |
| 7 3 6 5 4 0 2 1 | 1 1 1 | 0 1 1 | 1 1 0 | 1 0 1 | 1 0 0 | 0 0 0 | 0 1 0 | 0 0 1 |
| 7 3 6 5 4 0 1 2 | 1 1 1 | 0 1 1 | 1 1 0 | 1 0 1 | 1 0 0 | 0 0 0 | 0 0 1 | 0 1 0 |
| 7 3 6 5 4 1 2 0 | 1 1 1 | 0 1 1 | 1 1 0 | 1 0 1 | 1 0 0 | 0 0 1 | 0 1 0 | 0 0 0 |
| 7 3 6 5 4 1 0 2 | 1 1 1 | 0 1 1 | 1 1 0 | 1 0 1 | 1 0 0 | 0 0 1 | 0 0 0 | 0 1 0 |
| 7 3 6 5 1 2 4 0 | 1 1 1 | 0 1 1 | 1 1 0 | 1 0 1 | 0 0 1 | 0 1 0 | 1 0 0 | 0 0 0 |
| 7 3 6 5 1 4 2 0 | 1 1 1 | 0 1 1 | 1 1 0 | 1 0 1 | 0 0 1 | 1 0 0 | 0 1 0 | 0 0 0 |
| 7 3 6 5 1 4 0 2 | 1 1 1 | 0 1 1 | 1 1 0 | 1 0 1 | 0 0 1 | 1 0 0 | 0 0 0 | 0 1 0 |
| 7 3 5 6 2 4 0 1 | 1 1 1 | 0 1 1 | 1 0 1 | 1 1 0 | 0 1 0 | 1 0 0 | 0 0 0 | 0 0 1 |
| 7 3 5 6 2 4 1 0 | 1 1 1 | 0 1 1 | 1 0 1 | 1 1 0 | 0 1 0 | 1 0 0 | 0 0 1 | 0 0 0 |
| 7 3 5 6 2 1 4 0 | 1 1 1 | 0 1 1 | 1 0 1 | 1 1 0 | 0 1 0 | 0 0 1 | 1 0 0 | 0 0 0 |
| 7 3 5 6 4 2 0 1 | 1 1 1 | 0 1 1 | 1 0 1 | 1 1 0 | 1 0 0 | 0 1 0 | 0 0 0 | 0 0 1 |
| 7 3 5 6 4 2 1 0 | 1 1 1 | 0 1 1 | 1 0 1 | 1 1 0 | 1 0 0 | 0 1 0 | 0 0 1 | 0 0 0 |
| 7 3 5 6 4 0 2 1 | 1 1 1 | 0 1 1 | 1 0 1 | 1 1 0 | 1 0 0 | 0 0 0 | 0 1 0 | 0 0 1 |
| 7 3 5 6 4 0 1 2 | 1 1 1 | 0 1 1 | 1 0 1 | 1 1 0 | 1 0 0 | 0 0 0 | 0 0 1 | 0 1 0 |
| 7 3 5 6 4 1 2 0 | 1 1 1 | 0 1 1 | 1 0 1 | 1 1 0 | 1 0 0 | 0 0 1 | 0 1 0 | 0 0 0 |
| 7 3 5 6 4 1 0 2 | 1 1 1 | 0 1 1 | 1 0 1 | 1 1 0 | 1 0 0 | 0 0 1 | 0 0 0 | 0 1 0 |
| 7 3 5 6 1 2 4 0 | 1 1 1 | 0 1 1 | 1 0 1 | 1 1 0 | 0 0 1 | 0 1 0 | 1 0 0 | 0 0 0 |
| 7 3 5 6 1 4 2 0 | 1 1 1 | 0 1 1 | 1 0 1 | 1 1 0 | 0 0 1 | 1 0 0 | 0 1 0 | 0 0 0 |
| 7 3 5 6 1 4 0 2 | 1 1 1 | 0 1 1 | 1 0 1 | 1 1 0 | 0 0 1 | 1 0 0 | 0 0 0 | 0 1 0 |
| 7 3 5 1 6 2 4 0 | 1 1 1 | 0 1 1 | 1 0 1 | 0 0 1 | 1 1 0 | 0 1 0 | 1 0 0 | 0 0 0 |
| 7 3 5 1 6 4 2 0 | 1 1 1 | 0 1 1 | 1 0 1 | 0 0 1 | 1 1 0 | 1 0 0 | 0 1 0 | 0 0 0 |
| 7 3 5 1 6 4 0 2 | 1 1 1 | 0 1 1 | 1 0 1 | 0 0 1 | 1 1 0 | 1 0 0 | 0 0 0 | 0 1 0 |

| States order | Lower bit sequence | Middle bit sequence | Upper bit sequence | static comp | T | Min | Max | dynamic comp | T | Min | Max |
|---|---|---|---|---|---|---|---|---|---|---|---|
| 7 5 1 6 3 2 4 0 | 1 1 1 0 1 0 0 0 | 1 0 0 1 1 1 0 0 | 1 1 0 1 0 0 1 0 | 3 3 5 | 11 | 3 | 5 | 2 2 3 | 7 | 2 | 3 |
| 7 5 1 6 3 4 2 0 | 1 1 1 0 1 0 0 0 | 1 0 0 1 1 0 1 0 | 1 1 0 1 0 1 0 0 | 3 5 5 | 13 | 3 | 5 | 2 3 3 | 8 | 2 | 3 |
| 7 5 1 6 3 4 0 2 | 1 1 1 0 1 0 0 0 | 1 0 0 1 1 0 0 1 | 1 1 0 1 0 1 0 0 | 3 4 5 | 12 | 3 | 5 | 2 3 3 | 8 | 2 | 3 |
| 7 5 1 3 6 2 4 0 | 1 1 1 1 0 0 0 0 | 1 0 0 1 1 1 0 0 | 1 1 0 0 1 0 1 0 | 1 3 5 | 9 | 1 | 5 | 1 2 3 | 6 | 1 | 3 |
| 7 5 1 3 6 4 2 0 | 1 1 1 1 0 0 0 0 | 1 0 0 1 1 0 1 0 | 1 1 0 0 1 1 0 0 | 1 5 3 | 9 | 1 | 5 | 1 3 2 | 6 | 1 | 3 |
| 7 5 1 3 6 4 0 2 | 1 1 1 1 0 0 0 0 | 1 0 0 1 1 0 0 1 | 1 1 0 0 1 1 0 0 | 1 4 3 | 8 | 1 | 4 | 1 3 2 | 6 | 1 | 3 |
| 7 5 3 6 2 4 0 1 | 1 1 1 0 0 0 0 1 | 1 0 1 1 1 0 0 0 | 1 1 0 1 0 1 0 0 | 2 3 5 | 10 | 2 | 5 | 2 2 3 | 7 | 2 | 3 |
| 7 5 3 6 2 4 1 0 | 1 1 1 0 0 0 1 0 | 1 0 1 1 1 0 0 0 | 1 1 0 1 0 1 0 0 | 3 3 5 | 11 | 3 | 5 | 2 2 3 | 7 | 2 | 3 |
| 7 5 3 6 2 1 4 0 | 1 1 1 0 0 1 0 0 | 1 0 1 1 1 0 0 0 | 1 1 0 1 0 0 1 0 | 3 3 5 | 11 | 3 | 5 | 2 2 3 | 7 | 2 | 3 |
| 7 5 3 6 4 2 0 1 | 1 1 1 0 0 0 0 1 | 1 0 1 1 0 1 0 0 | 1 1 0 1 1 0 0 0 | 2 5 3 | 10 | 2 | 5 | 2 3 2 | 7 | 2 | 3 |
| 7 5 3 6 4 2 1 0 | 1 1 1 0 0 0 1 0 | 1 0 1 1 0 1 0 0 | 1 1 0 1 1 0 0 0 | 3 5 3 | 11 | 3 | 5 | 2 3 2 | 7 | 2 | 3 |
| 7 5 3 6 4 0 2 1 | 1 1 1 0 0 0 0 1 | 1 0 1 1 0 0 1 0 | 1 1 0 1 1 0 0 0 | 2 5 3 | 10 | 2 | 5 | 2 3 2 | 7 | 2 | 3 |
| 7 5 3 6 4 0 1 2 | 1 1 1 0 0 0 1 0 | 1 0 1 1 0 0 0 1 | 1 1 0 1 1 0 0 0 | 3 4 3 | 10 | 3 | 4 | 2 3 2 | 7 | 2 | 3 |
| 7 5 3 6 4 1 2 0 | 1 1 1 0 0 1 0 0 | 1 0 1 1 0 0 1 0 | 1 1 0 1 1 0 0 0 | 3 5 3 | 11 | 3 | 5 | 2 3 2 | 7 | 2 | 3 |
| 7 5 3 6 4 1 0 2 | 1 1 1 0 0 1 0 0 | 1 0 1 1 0 0 0 1 | 1 1 0 1 1 0 0 0 | 3 4 3 | 10 | 3 | 4 | 2 3 2 | 7 | 2 | 3 |

APPENDIX A-continued

Evaluation of valid orderings for 3-bit MBC cells

| | | | | | | | | | | |
|---|---|---|---|---|---|---|---|---|---|---|
| 7 5 3 6 1 2 4 0 | 1 1 1 0 1 0 0 0 | 1 0 1 1 0 1 0 0 | 1 1 0 1 0 0 1 0 | 3 5 5 | 13 | 3 | 5 | 2 3 3 | 8 | 2 | 3 |
| 7 5 3 6 1 4 2 0 | 1 1 1 0 1 0 0 0 | 1 0 1 1 0 0 1 0 | 1 1 0 1 0 1 0 0 | 3 5 5 | 13 | 3 | 5 | 2 3 3 | 8 | 2 | 3 |
| 7 5 3 6 1 4 0 2 | 1 1 1 0 1 0 0 0 | 1 0 1 1 0 0 0 1 | 1 1 0 1 0 1 0 0 | 3 4 5 | 12 | 3 | 5 | 2 3 3 | 8 | 2 | 3 |
| 7 5 3 1 6 2 4 0 | 1 1 1 1 0 0 0 0 | 1 0 1 0 1 1 0 0 | 1 1 0 0 1 0 1 0 | 1 5 5 | 11 | 1 | 5 | 1 3 3 | 7 | 1 | 3 |
| 7 5 3 1 6 4 2 0 | 1 1 1 1 0 0 0 0 | 1 0 1 0 1 0 1 0 | 1 1 0 0 1 1 0 0 | 1 7 3 | 11 | 1 | 7 | 1 3 2 | 6 | 1 | 3 |
| 7 5 3 1 6 4 0 2 | 1 1 1 1 0 0 0 0 | 1 0 1 0 1 0 0 1 | 1 1 0 0 1 1 0 0 | 1 6 3 | 10 | 1 | 6 | 1 3 2 | 6 | 1 | 3 |
| 7 3 6 2 4 0 5 1 | 1 1 0 0 0 0 1 1 | 1 1 1 1 0 0 0 0 | 1 0 1 0 1 0 1 0 | 2 1 7 | 10 | 1 | 7 | 2 1 3 | 6 | 1 | 3 |
| 7 3 6 2 4 5 0 1 | 1 1 0 0 0 1 0 1 | 1 1 1 1 0 0 0 0 | 1 0 1 0 1 1 0 0 | 4 1 5 | 10 | 1 | 5 | 3 1 3 | 7 | 1 | 3 |
| 7 3 6 2 4 5 1 0 | 1 1 0 0 0 1 1 0 | 1 1 1 1 0 0 0 0 | 1 0 1 0 1 1 0 0 | 3 1 5 | 9 | 1 | 5 | 2 1 3 | 6 | 1 | 3 |
| 7 3 6 2 5 4 0 1 | 1 1 0 0 1 0 0 1 | 1 1 1 1 0 0 0 0 | 1 0 1 0 1 1 0 0 | 4 1 5 | 10 | 1 | 5 | 3 1 3 | 7 | 1 | 3 |
| 7 3 6 2 5 4 1 0 | 1 1 0 0 1 0 1 0 | 1 1 1 1 0 0 0 0 | 1 0 1 0 1 1 0 0 | 5 1 5 | 11 | 1 | 5 | 3 1 3 | 7 | 1 | 3 |
| 7 3 6 2 5 1 4 0 | 1 1 0 0 1 1 0 0 | 1 1 1 1 0 0 0 0 | 1 0 1 0 1 0 1 0 | 3 1 7 | 11 | 1 | 7 | 2 1 3 | 6 | 1 | 3 |
| 7 3 6 4 2 0 5 1 | 1 1 0 0 0 0 1 1 | 1 1 1 0 1 0 0 0 | 1 0 1 1 0 0 1 0 | 2 3 5 | 10 | 2 | 5 | 2 2 3 | 7 | 2 | 3 |
| 7 3 6 4 2 5 0 1 | 1 1 0 0 0 1 0 1 | 1 1 1 0 1 0 0 0 | 1 0 1 1 0 1 0 0 | 4 3 5 | 12 | 3 | 5 | 3 2 3 | 8 | 2 | 3 |
| 7 3 6 4 2 5 1 0 | 1 1 0 0 0 1 1 0 | 1 1 1 0 1 0 0 0 | 1 0 1 1 0 0 1 0 | 3 3 5 | 11 | 3 | 5 | 2 2 3 | 7 | 2 | 3 |
| 7 3 6 4 0 2 5 1 | 1 1 0 0 0 0 1 1 | 1 1 1 0 0 1 0 0 | 1 0 1 1 0 0 1 0 | 2 3 5 | 10 | 2 | 5 | 2 2 3 | 7 | 2 | 3 |
| 7 3 6 4 0 5 2 1 | 1 1 0 0 0 1 0 1 | 1 1 1 0 0 0 1 0 | 1 0 1 1 0 1 0 0 | 4 3 5 | 12 | 3 | 5 | 3 2 3 | 8 | 2 | 3 |
| 7 3 6 4 0 5 1 2 | 1 1 0 0 0 1 1 0 | 1 1 1 0 0 0 0 1 | 1 0 1 1 0 1 0 0 | 3 2 5 | 10 | 2 | 5 | 2 2 3 | 7 | 2 | 3 |
| 7 3 6 4 5 2 0 1 | 1 1 0 0 1 0 0 1 | 1 1 1 0 1 1 0 0 | 1 0 1 1 1 0 0 0 | 4 3 3 | 10 | 3 | 4 | 3 2 2 | 7 | 2 | 3 |
| 7 3 6 4 5 2 1 0 | 1 1 0 0 1 0 1 0 | 1 1 1 0 1 1 0 0 | 1 0 1 1 1 0 0 0 | 5 3 3 | 11 | 3 | 5 | 3 2 2 | 7 | 2 | 3 |
| 7 3 6 4 5 0 2 1 | 1 1 0 0 1 0 0 1 | 1 1 1 0 0 0 1 0 | 1 0 1 1 1 0 0 0 | 4 3 3 | 10 | 3 | 4 | 3 2 2 | 7 | 2 | 3 |
| 7 3 6 4 5 0 1 2 | 1 1 0 0 1 0 1 0 | 1 1 1 0 0 0 0 1 | 1 0 1 1 1 0 0 0 | 5 2 3 | 10 | 2 | 5 | 3 2 2 | 7 | 2 | 3 |
| 7 3 6 4 5 1 2 0 | 1 1 0 0 1 1 0 0 | 1 1 1 0 1 0 0 0 | 1 0 1 1 1 0 0 0 | 3 3 3 | 9 | 3 | 3 | 2 2 2 | 6 | 2 | 2 |
| 7 3 6 4 5 1 0 2 | 1 1 0 0 1 1 0 0 | 1 1 1 0 0 0 0 1 | 1 0 1 1 1 0 0 0 | 3 2 3 | 8 | 2 | 3 | 2 2 2 | 6 | 2 | 2 |
| 7 3 6 5 2 4 0 1 | 1 1 0 1 0 0 0 1 | 1 1 1 0 1 0 0 0 | 1 0 1 1 0 1 0 0 | 4 3 5 | 12 | 3 | 5 | 3 2 3 | 8 | 2 | 3 |
| 7 3 6 5 2 4 1 0 | 1 1 0 1 0 0 1 0 | 1 1 1 0 1 0 0 0 | 1 0 1 1 0 1 0 0 | 5 3 5 | 13 | 3 | 5 | 3 2 3 | 8 | 2 | 3 |
| 7 3 6 5 2 1 4 0 | 1 1 0 1 0 0 1 0 | 1 1 1 0 0 1 0 0 | 1 0 1 1 0 0 1 0 | 5 3 5 | 13 | 3 | 5 | 3 2 3 | 8 | 2 | 3 |
| 7 3 6 5 4 2 0 1 | 1 1 0 1 0 0 0 1 | 1 1 1 0 0 1 0 0 | 1 0 1 1 1 0 0 0 | 4 3 3 | 10 | 3 | 4 | 3 2 2 | 7 | 2 | 3 |
| 7 3 6 5 4 2 1 0 | 1 1 0 1 0 0 1 0 | 1 1 1 0 0 1 0 0 | 1 0 1 1 1 0 0 0 | 5 3 3 | 11 | 3 | 5 | 3 2 2 | 7 | 2 | 3 |
| 7 3 6 5 4 0 2 1 | 1 1 0 1 0 0 0 1 | 1 1 1 0 0 0 1 0 | 1 0 1 1 1 0 0 0 | 4 3 3 | 10 | 3 | 4 | 3 2 2 | 7 | 2 | 3 |
| 7 3 6 5 4 0 1 2 | 1 1 0 1 0 0 1 0 | 1 1 1 0 0 0 0 1 | 1 0 1 1 1 0 0 0 | 5 2 3 | 10 | 2 | 5 | 3 2 2 | 7 | 2 | 3 |
| 7 3 6 5 4 1 2 0 | 1 1 0 1 0 1 0 0 | 1 1 1 0 0 0 1 0 | 1 0 1 1 1 0 0 0 | 5 3 3 | 11 | 3 | 5 | 3 2 2 | 7 | 2 | 3 |
| 7 3 6 5 4 1 0 2 | 1 1 0 1 0 1 0 0 | 1 1 1 0 0 0 0 1 | 1 0 1 1 1 0 0 0 | 5 2 3 | 10 | 2 | 5 | 3 2 2 | 7 | 2 | 3 |
| 7 3 6 5 1 2 4 0 | 1 1 0 1 1 0 0 0 | 1 1 1 0 0 1 0 0 | 1 0 1 1 0 0 1 0 | 3 3 5 | 11 | 3 | 5 | 2 2 3 | 7 | 2 | 3 |
| 7 3 6 5 1 4 2 0 | 1 1 0 1 1 0 0 0 | 1 1 1 0 0 0 1 0 | 1 0 1 1 0 1 0 0 | 3 3 5 | 11 | 3 | 5 | 2 2 3 | 7 | 2 | 3 |
| 7 3 6 5 1 4 0 2 | 1 1 0 1 1 0 0 0 | 1 1 1 0 0 0 0 1 | 1 0 1 1 0 1 0 0 | 3 2 5 | 10 | 2 | 5 | 2 2 3 | 7 | 2 | 3 |
| 7 3 5 6 2 4 0 1 | 1 1 1 0 0 0 0 1 | 1 1 0 1 1 0 0 0 | 1 0 1 1 0 1 0 0 | 2 3 5 | 10 | 2 | 5 | 2 2 3 | 7 | 2 | 3 |
| 7 3 5 6 2 4 1 0 | 1 1 1 0 0 0 1 0 | 1 1 0 1 1 0 0 0 | 1 0 1 1 0 1 0 0 | 3 3 5 | 11 | 3 | 5 | 2 2 3 | 7 | 2 | 3 |
| 7 3 5 6 2 1 4 0 | 1 1 1 0 0 1 0 0 | 1 1 0 1 1 0 0 0 | 1 0 1 1 0 0 1 0 | 3 3 5 | 11 | 3 | 5 | 2 2 3 | 7 | 2 | 3 |
| 7 3 5 6 4 2 0 1 | 1 1 1 0 0 0 0 1 | 1 1 0 1 0 1 0 0 | 1 0 1 1 1 0 0 0 | 2 5 3 | 10 | 2 | 5 | 2 3 2 | 7 | 2 | 3 |
| 7 3 5 6 4 2 1 0 | 1 1 1 0 0 0 1 0 | 1 1 0 1 0 1 0 0 | 1 0 1 1 1 0 0 0 | 3 5 3 | 11 | 3 | 5 | 2 3 2 | 7 | 2 | 3 |
| 7 3 5 6 4 0 2 1 | 1 1 1 0 0 0 0 1 | 1 1 0 1 0 0 1 0 | 1 0 1 1 1 0 0 0 | 2 5 3 | 10 | 2 | 5 | 2 3 2 | 7 | 2 | 3 |
| 7 3 5 6 4 0 1 2 | 1 1 1 0 0 0 1 0 | 1 1 0 1 0 0 0 1 | 1 0 1 1 1 0 0 0 | 3 4 3 | 10 | 3 | 4 | 2 3 2 | 7 | 2 | 3 |
| 7 3 5 6 4 1 2 0 | 1 1 1 0 0 1 0 0 | 1 1 0 1 0 0 1 0 | 1 0 1 1 1 0 0 0 | 3 5 3 | 11 | 3 | 5 | 2 3 2 | 7 | 2 | 3 |
| 7 3 5 6 4 1 0 2 | 1 1 1 0 0 1 0 0 | 1 1 0 1 0 0 0 1 | 1 0 1 1 1 0 0 0 | 3 4 3 | 10 | 3 | 4 | 2 3 2 | 7 | 2 | 3 |
| 7 3 5 6 1 2 4 0 | 1 1 1 0 1 0 0 0 | 1 1 0 1 0 1 0 0 | 1 0 1 1 0 0 1 0 | 3 5 5 | 13 | 3 | 5 | 2 3 3 | 8 | 2 | 3 |
| 7 3 5 6 1 4 2 0 | 1 1 1 0 1 0 0 0 | 1 1 0 1 0 0 1 0 | 1 0 1 1 0 1 0 0 | 3 5 5 | 13 | 3 | 5 | 2 3 3 | 8 | 2 | 3 |
| 7 3 5 6 1 4 0 2 | 1 1 1 0 1 0 0 0 | 1 1 0 1 0 0 0 1 | 1 0 1 1 0 1 0 0 | 3 4 5 | 12 | 3 | 5 | 2 3 3 | 8 | 2 | 3 |
| 7 3 5 1 6 2 4 0 | 1 1 1 1 0 0 0 0 | 1 1 0 0 1 1 0 0 | 1 0 1 0 1 0 1 0 | 1 3 7 | 11 | 1 | 7 | 1 2 3 | 6 | 1 | 3 |
| 7 3 5 1 6 4 2 0 | 1 1 1 1 0 0 0 0 | 1 1 0 0 1 0 1 0 | 1 0 1 0 1 1 0 0 | 1 5 5 | 11 | 1 | 5 | 1 3 3 | 7 | 1 | 3 |
| 7 3 5 1 6 4 0 2 | 1 1 1 1 0 0 0 0 | 1 1 0 0 1 0 0 1 | 1 0 1 0 1 1 0 0 | 1 4 5 | 10 | 1 | 5 | 1 3 3 | 7 | 1 | 3 |
| | | | | MIN | 7 | 1 | 3 | | 5 | 1 | 2 |
| | | | | MAX | 15 | 3 | 7 | | 8 | 2 | 3 |
| | | | | Average | 11 | 2.2 | 5 | | 7 | 1.7 | 3 |

APPENDIX B

Evaluation of valid orderings for 4-bit MBC cells

| States Order | | | | | | | | | | | | | | | | static comp | T | Min | Max | dynamic comp | T | Min | Max |
|---|---|---|---|---|---|---|---|---|---|---|---|---|---|---|---|---|---|---|---|---|---|---|---|
| 15 | 14 | 12 | 13 | 9 | 8 | 10 | 11 | 3 | 2 | 0 | 4 | 6 | 7 | 5 1 | 6 5 3 1 | 15 | 1 | 6 | 3 3 2 1 | 9 | 1 | 3 |
| 15 | 14 | 12 | 13 | 9 | 8 | 10 | 11 | 3 | 2 | 0 | 1 | 5 | 4 | 6 7 | 8 4 2 1 | 15 | 1 | 8 | 4 3 2 1 | 10 | 1 | 4 |
| 15 | 14 | 12 | 13 | 9 | 8 | 10 | 11 | 3 | 2 | 0 | 1 | 5 | 7 | 6 4 | 7 5 2 1 | 15 | 1 | 7 | 3 3 2 1 | 9 | 1 | 3 |
| 15 | 14 | 12 | 13 | 9 | 8 | 10 | 11 | 3 | 2 | 6 | 4 | 0 | 1 | 5 7 | 6 4 4 1 | 15 | 1 | 6 | 3 3 3 1 | 10 | 1 | 3 |
| 15 | 14 | 12 | 13 | 9 | 8 | 10 | 11 | 3 | 2 | 6 | 7 | 5 | 4 | 0 1 | 8 3 3 1 | 15 | 1 | 8 | 4 2 2 1 | 9 | 1 | 4 |
| 15 | 14 | 12 | 13 | 9 | 8 | 10 | 11 | 3 | 2 | 6 | 7 | 5 | 1 | 0 4 | 7 3 4 1 | 15 | 1 | 7 | 3 2 3 1 | 9 | 1 | 3 |
| 15 | 14 | 12 | 13 | 9 | 8 | 10 | 11 | 3 | 1 | 0 | 4 | 5 | 7 | 6 2 | 7 4 3 1 | 15 | 1 | 7 | 3 3 2 1 | 9 | 1 | 3 |
| 15 | 14 | 12 | 13 | 9 | 8 | 10 | 11 | 3 | 1 | 0 | 2 | 6 | 4 | 5 7 | 6 6 2 1 | 15 | 1 | 6 | 3 3 2 1 | 9 | 1 | 3 |
| 15 | 14 | 12 | 13 | 9 | 8 | 10 | 11 | 3 | 1 | 0 | 2 | 6 | 7 | 5 4 | 7 5 2 1 | 15 | 1 | 7 | 3 3 2 1 | 9 | 1 | 3 |
| 15 | 14 | 12 | 13 | 9 | 8 | 10 | 11 | 3 | 1 | 5 | 4 | 0 | 2 | 6 7 | 6 4 4 1 | 15 | 1 | 6 | 3 3 3 1 | 10 | 1 | 3 |
| 15 | 14 | 12 | 13 | 9 | 8 | 10 | 11 | 3 | 1 | 5 | 7 | 6 | 4 | 0 2 | 5 6 3 1 | 15 | 1 | 6 | 3 3 2 1 | 9 | 1 | 3 |
| 15 | 14 | 12 | 13 | 9 | 8 | 10 | 11 | 3 | 1 | 5 | 7 | 6 | 2 | 0 4 | 5 5 4 1 | 15 | 1 | 5 | 3 3 3 1 | 10 | 1 | 3 |
| 15 | 14 | 12 | 13 | 9 | 8 | 10 | 11 | 3 | 7 | 6 | 4 | 5 | 1 | 0 2 | 7 4 3 1 | 15 | 1 | 7 | 3 3 2 1 | 9 | 1 | 3 |

APPENDIX B-continued

Evaluation of valid orderings for 4-bit MBC cells

| States Order | | | | | | | | | | | | | | | | static comp | | | T | Min | Max | dynamic comp | | | | T | Min | Max |
|---|---|---|---|---|---|---|---|---|---|---|---|---|---|---|---|---|---|---|---|---|---|---|---|---|---|---|---|---|
| 15 | 14 | 12 | 13 | 9 | 8 | 10 | 11 | 3 | 7 | 6 | 2 | 0 | 4 | 5 | 1 | 6 | 3 | 5 | 1 | 15 | 1 | 6 | 3 | 2 | 3 | 1 | 9 | 1 | 3 |
| 15 | 14 | 12 | 13 | 9 | 8 | 10 | 11 | 3 | 7 | 6 | 2 | 0 | 1 | 5 | 4 | 7 | 3 | 4 | 1 | 15 | 1 | 7 | 3 | 2 | 3 | 1 | 9 | 1 | 3 |
| 15 | 14 | 12 | 13 | 9 | 8 | 10 | 11 | 3 | 7 | 5 | 4 | 6 | 2 | 0 | 1 | 6 | 5 | 3 | 1 | 15 | 1 | 6 | 3 | 3 | 2 | 1 | 9 | 1 | 3 |
| 15 | 14 | 12 | 13 | 9 | 8 | 10 | 11 | 3 | 7 | 5 | 1 | 0 | 4 | 6 | 2 | 5 | 5 | 4 | 1 | 15 | 1 | 5 | 3 | 3 | 3 | 1 | 10 | 1 | 3 |
| 15 | 14 | 12 | 13 | 9 | 8 | 10 | 11 | 3 | 7 | 5 | 1 | 0 | 2 | 6 | 4 | 5 | 5 | 4 | 1 | 15 | 1 | 5 | 3 | 3 | 3 | 1 | 10 | 1 | 3 |
| 15 | 14 | 12 | 13 | 9 | 11 | 10 | 8 | 0 | 4 | 6 | 2 | 3 | 1 | 5 | 7 | 4 | 6 | 4 | 1 | 15 | 1 | 6 | 3 | 3 | 3 | 1 | 10 | 1 | 3 |
| 15 | 14 | 12 | 13 | 9 | 11 | 10 | 8 | 0 | 4 | 6 | 2 | 3 | 7 | 5 | 1 | 4 | 5 | 5 | 1 | 15 | 1 | 5 | 3 | 3 | 3 | 1 | 10 | 1 | 3 |
| 15 | 14 | 12 | 13 | 9 | 11 | 10 | 8 | 0 | 4 | 6 | 7 | 5 | 1 | 3 | 2 | 5 | 6 | 3 | 1 | 15 | 1 | 6 | 3 | 3 | 2 | 1 | 9 | 1 | 3 |
| 15 | 14 | 12 | 13 | 9 | 11 | 10 | 8 | 0 | 4 | 5 | 1 | 3 | 2 | 6 | 7 | 6 | 4 | 4 | 1 | 15 | 1 | 6 | 3 | 3 | 3 | 1 | 10 | 1 | 3 |
| 15 | 14 | 12 | 13 | 9 | 11 | 10 | 8 | 0 | 4 | 5 | 1 | 3 | 7 | 6 | 2 | 5 | 4 | 5 | 1 | 15 | 1 | 5 | 3 | 3 | 3 | 1 | 10 | 1 | 3 |
| 15 | 14 | 12 | 13 | 9 | 11 | 10 | 8 | 0 | 4 | 5 | 7 | 6 | 2 | 3 | 1 | 6 | 5 | 3 | 1 | 15 | 1 | 6 | 3 | 3 | 2 | 1 | 9 | 1 | 3 |
| 15 | 14 | 12 | 13 | 9 | 11 | 10 | 8 | 0 | 2 | 6 | 4 | 5 | 1 | 3 | 7 | 4 | 6 | 4 | 1 | 15 | 1 | 6 | 3 | 3 | 3 | 1 | 10 | 1 | 3 |
| 15 | 14 | 12 | 13 | 9 | 11 | 10 | 8 | 0 | 2 | 6 | 4 | 5 | 7 | 3 | 1 | 4 | 7 | 3 | 1 | 15 | 1 | 7 | 3 | 3 | 2 | 1 | 9 | 1 | 3 |
| 15 | 14 | 12 | 13 | 9 | 11 | 10 | 8 | 0 | 2 | 6 | 7 | 3 | 1 | 5 | 4 | 5 | 5 | 4 | 1 | 15 | 1 | 5 | 3 | 3 | 3 | 1 | 10 | 1 | 3 |
| 15 | 14 | 12 | 13 | 9 | 11 | 10 | 8 | 0 | 2 | 3 | 1 | 5 | 4 | 6 | 7 | 6 | 6 | 2 | 1 | 15 | 1 | 6 | 3 | 3 | 2 | 1 | 9 | 1 | 3 |
| 15 | 14 | 12 | 13 | 9 | 11 | 10 | 8 | 0 | 2 | 3 | 1 | 5 | 7 | 6 | 4 | 5 | 7 | 2 | 1 | 15 | 1 | 7 | 3 | 3 | 2 | 1 | 9 | 1 | 3 |
| 15 | 14 | 12 | 13 | 9 | 11 | 10 | 8 | 0 | 2 | 3 | 7 | 6 | 4 | 5 | 1 | 6 | 5 | 3 | 1 | 15 | 1 | 6 | 3 | 3 | 2 | 1 | 9 | 1 | 3 |
| 15 | 14 | 12 | 13 | 9 | 11 | 10 | 8 | 0 | 1 | 5 | 4 | 6 | 2 | 3 | 7 | 6 | 4 | 4 | 1 | 15 | 1 | 6 | 3 | 3 | 3 | 1 | 10 | 1 | 3 |
| 15 | 14 | 12 | 13 | 9 | 11 | 10 | 8 | 0 | 1 | 5 | 4 | 6 | 7 | 3 | 2 | 7 | 4 | 3 | 1 | 15 | 1 | 7 | 3 | 3 | 2 | 1 | 9 | 1 | 3 |
| 15 | 14 | 12 | 13 | 9 | 11 | 10 | 8 | 0 | 1 | 5 | 7 | 3 | 2 | 6 | 4 | 5 | 5 | 4 | 1 | 15 | 1 | 5 | 3 | 3 | 3 | 1 | 10 | 1 | 3 |
| 15 | 14 | 12 | 13 | 9 | 11 | 10 | 8 | 0 | 1 | 3 | 2 | 6 | 4 | 5 | 7 | 6 | 6 | 2 | 1 | 15 | 1 | 6 | 3 | 3 | 2 | 1 | 9 | 1 | 3 |
| 15 | 14 | 12 | 13 | 9 | 11 | 10 | 8 | 0 | 1 | 3 | 2 | 6 | 7 | 5 | 4 | 7 | 5 | 2 | 1 | 15 | 1 | 7 | 3 | 3 | 2 | 1 | 9 | 1 | 3 |
| 15 | 14 | 12 | 13 | 9 | 11 | 10 | 8 | 0 | 1 | 3 | 7 | 5 | 4 | 6 | 2 | 5 | 6 | 3 | 1 | 15 | 1 | 6 | 3 | 3 | 2 | 1 | 9 | 1 | 3 |

APPENDIX C

4-bit, 6-comparisons, almost equal spread

| States Order | | | | | | | | | | | | | | | | Static comp | | | | T | Min | Max |
|---|---|---|---|---|---|---|---|---|---|---|---|---|---|---|---|---|---|---|---|---|---|---|
| 15 | 14 | 12 | 8 | 0 | 4 | 6 | 7 | 13 | 9 | 11 | 10 | 2 | 3 | 1 | 5 | 4 | 5 | 4 | 3 | 16 | 3 | 5 |
| 15 | 14 | 12 | 8 | 0 | 4 | 13 | 9 | 11 | 10 | 2 | 6 | 7 | 5 | 1 | 3 | 4 | 4 | 5 | 3 | 16 | 3 | 5 |
| 15 | 14 | 12 | 8 | 0 | 4 | 13 | 9 | 11 | 10 | 2 | 3 | 1 | 5 | 7 | 6 | 3 | 5 | 4 | 3 | 16 | 3 | 5 |
| 15 | 14 | 12 | 8 | 10 | 2 | 6 | 4 | 13 | 9 | 11 | 3 | 7 | 5 | 1 | 0 | 3 | 5 | 5 | 3 | 16 | 3 | 5 |
| 15 | 14 | 12 | 8 | 10 | 2 | 6 | 7 | 13 | 9 | 11 | 3 | 1 | 0 | 4 | 5 | 4 | 5 | 4 | 3 | 16 | 3 | 5 |
| 15 | 14 | 12 | 8 | 10 | 2 | 6 | 7 | 13 | 9 | 11 | 3 | 1 | 5 | 4 | 0 | 3 | 5 | 5 | 3 | 16 | 3 | 5 |
| 15 | 14 | 12 | 8 | 10 | 11 | 3 | 2 | 0 | 4 | 6 | 7 | 13 | 9 | 1 | 5 | 4 | 5 | 4 | 3 | 16 | 3 | 5 |
| 15 | 14 | 12 | 8 | 10 | 11 | 3 | 2 | 0 | 4 | 13 | 9 | 1 | 5 | 7 | 6 | 5 | 4 | 4 | 3 | 16 | 3 | 5 |
| 15 | 14 | 12 | 8 | 10 | 11 | 3 | 2 | 6 | 7 | 13 | 9 | 1 | 5 | 4 | 0 | 5 | 3 | 5 | 3 | 16 | 3 | 5 |
| 15 | 14 | 12 | 8 | 10 | 11 | 3 | 7 | 13 | 9 | 1 | 0 | 2 | 6 | 4 | 5 | 4 | 5 | 4 | 3 | 16 | 3 | 5 |
| 15 | 14 | 12 | 8 | 10 | 11 | 3 | 7 | 13 | 9 | 1 | 5 | 4 | 6 | 2 | 0 | 3 | 5 | 5 | 3 | 16 | 3 | 5 |
| 15 | 14 | 12 | 4 | 13 | 9 | 8 | 10 | 11 | 3 | 1 | 5 | 7 | 6 | 2 | 0 | 5 | 5 | 3 | 3 | 16 | 3 | 5 |
| 15 | 14 | 12 | 4 | 13 | 9 | 8 | 10 | 11 | 3 | 7 | 5 | 1 | 0 | 2 | 6 | 5 | 4 | 4 | 3 | 16 | 3 | 5 |
| 15 | 14 | 12 | 4 | 13 | 9 | 11 | 10 | 8 | 0 | 2 | 6 | 7 | 3 | 1 | 5 | 4 | 5 | 4 | 3 | 16 | 3 | 5 |
| 15 | 14 | 12 | 4 | 13 | 9 | 11 | 10 | 8 | 0 | 1 | 5 | 7 | 3 | 2 | 6 | 5 | 4 | 4 | 3 | 16 | 3 | 5 |
| 15 | 14 | 12 | 13 | 9 | 8 | 10 | 2 | 0 | 4 | 6 | 7 | 11 | 3 | 1 | 5 | 4 | 5 | 4 | 3 | 16 | 3 | 5 |
| 15 | 14 | 12 | 13 | 9 | 8 | 10 | 2 | 0 | 4 | 5 | 1 | 11 | 3 | 7 | 6 | 5 | 4 | 4 | 3 | 16 | 3 | 5 |
| 15 | 14 | 12 | 13 | 9 | 8 | 10 | 2 | 6 | 4 | 0 | 1 | 5 | 7 | 11 | 3 | 4 | 4 | 5 | 3 | 16 | 3 | 5 |
| 15 | 14 | 12 | 13 | 9 | 8 | 10 | 2 | 6 | 4 | 0 | 1 | 11 | 3 | 7 | 5 | 4 | 5 | 4 | 3 | 16 | 3 | 5 |
| 15 | 14 | 12 | 13 | 9 | 8 | 10 | 2 | 6 | 4 | 5 | 7 | 11 | 3 | 1 | 0 | 5 | 3 | 5 | 3 | 16 | 3 | 5 |
| 15 | 14 | 12 | 13 | 9 | 8 | 10 | 2 | 6 | 7 | 11 | 3 | 1 | 5 | 4 | 0 | 5 | 3 | 5 | 3 | 16 | 3 | 5 |
| 15 | 14 | 12 | 13 | 9 | 8 | 10 | 2 | 11 | 3 | 1 | 5 | 7 | 6 | 4 | 0 | 5 | 5 | 3 | 3 | 16 | 3 | 5 |
| 15 | 14 | 12 | 13 | 9 | 8 | 10 | 2 | 11 | 3 | 7 | 5 | 1 | 0 | 4 | 6 | 5 | 4 | 4 | 3 | 16 | 3 | 5 |
| 15 | 14 | 12 | 13 | 9 | 1 | 8 | 10 | 11 | 3 | 7 | 5 | 4 | 0 | 2 | 6 | 5 | 4 | 4 | 3 | 16 | 3 | 5 |
| 15 | 14 | 12 | 13 | 9 | 1 | 8 | 10 | 11 | 3 | 7 | 5 | 4 | 6 | 2 | 0 | 5 | 5 | 3 | 3 | 16 | 3 | 5 |
| 15 | 14 | 12 | 13 | 9 | 1 | 5 | 4 | 8 | 10 | 11 | 3 | 7 | 6 | 2 | 0 | 5 | 3 | 5 | 3 | 16 | 3 | 5 |
| 15 | 14 | 12 | 13 | 9 | 1 | 5 | 7 | 6 | 4 | 8 | 10 | 11 | 3 | 2 | 0 | 5 | 5 | 3 | 3 | 16 | 3 | 5 |
| 15 | 14 | 12 | 13 | 9 | 1 | 5 | 7 | 11 | 10 | 8 | 0 | 4 | 6 | 2 | 3 | 4 | 4 | 5 | 3 | 16 | 3 | 5 |
| 15 | 14 | 12 | 13 | 9 | 1 | 11 | 10 | 8 | 0 | 4 | 6 | 2 | 3 | 7 | 5 | 4 | 4 | 5 | 3 | 16 | 3 | 5 |
| 15 | 14 | 12 | 13 | 9 | 1 | 11 | 10 | 8 | 0 | 4 | 5 | 7 | 3 | 2 | 6 | 5 | 4 | 4 | 3 | 16 | 3 | 5 |
| 15 | 14 | 12 | 13 | 9 | 11 | 10 | 2 | 8 | 0 | 4 | 6 | 7 | 3 | 1 | 5 | 4 | 5 | 4 | 3 | 16 | 3 | 5 |
| 15 | 14 | 12 | 13 | 9 | 11 | 10 | 2 | 8 | 0 | 4 | 5 | 1 | 3 | 7 | 6 | 5 | 4 | 4 | 3 | 16 | 3 | 5 |
| 15 | 14 | 12 | 13 | 9 | 11 | 10 | 2 | 6 | 4 | 8 | 0 | 1 | 5 | 7 | 3 | 4 | 4 | 5 | 3 | 16 | 3 | 5 |
| 15 | 14 | 12 | 13 | 9 | 11 | 10 | 2 | 6 | 4 | 8 | 0 | 1 | 3 | 7 | 5 | 4 | 5 | 4 | 3 | 16 | 3 | 5 |
| 15 | 14 | 12 | 13 | 9 | 11 | 10 | 2 | 6 | 4 | 5 | 7 | 3 | 1 | 8 | 0 | 5 | 5 | 3 | 3 | 16 | 3 | 5 |
| 15 | 14 | 12 | 13 | 9 | 11 | 10 | 2 | 6 | 7 | 3 | 1 | 5 | 4 | 8 | 0 | 5 | 3 | 5 | 3 | 16 | 3 | 5 |
| 15 | 14 | 12 | 13 | 9 | 11 | 10 | 2 | 3 | 1 | 5 | 7 | 6 | 4 | 8 | 0 | 5 | 5 | 3 | 3 | 16 | 3 | 5 |
| 15 | 14 | 12 | 13 | 9 | 11 | 10 | 2 | 3 | 7 | 5 | 1 | 8 | 0 | 4 | 6 | 5 | 4 | 4 | 3 | 16 | 3 | 5 |
| 15 | 14 | 12 | 13 | 9 | 11 | 3 | 1 | 8 | 10 | 2 | 6 | 7 | 5 | 4 | 0 | 5 | 5 | 3 | 3 | 16 | 3 | 5 |
| 15 | 14 | 12 | 13 | 9 | 11 | 3 | 7 | 6 | 4 | 8 | 10 | 2 | 0 | 1 | 5 | 4 | 5 | 4 | 3 | 16 | 3 | 5 |
| 15 | 14 | 12 | 13 | 9 | 11 | 3 | 7 | 6 | 4 | 5 | 1 | 8 | 10 | 2 | 0 | 5 | 5 | 3 | 3 | 16 | 3 | 5 |

APPENDIX C-continued

| 4-bit, 6-comparisons, almost equal spread | | | | | | | | | | | | | | | | | | | | | | |
|---|---|---|---|---|---|---|---|---|---|---|---|---|---|---|---|---|---|---|---|---|---|---|
| States Order | | | | | | | | | | | | | | | | | | | | T | Min | Max |
| 15 | 14 | 12 | 13 | 9 | 11 | 3 | 7 | 5 | 1 | 8 | 10 | 2 | 6 | 4 | 0 | 3 | 5 | 5 | 3 | 16 | 3 | 5 |
| 15 | 14 | 12 | 13 | 5 | 4 | 8 | 10 | 11 | 9 | 1 | 3 | 7 | 6 | 2 | 0 | 5 | 5 | 3 | 3 | 16 | 3 | 5 |
| 15 | 14 | 12 | 13 | 5 | 7 | 11 | 10 | 8 | 9 | 1 | 3 | 2 | 6 | 4 | 0 | 5 | 5 | 3 | 3 | 16 | 3 | 5 |
| 15 | 14 | 10 | 2 | 6 | 7 | 13 | 12 | 8 | 9 | 11 | 3 | 1 | 5 | 4 | 0 | 5 | 3 | 5 | 3 | 16 | 3 | 5 |
| 15 | 14 | 10 | 11 | 3 | 7 | 13 | 12 | 8 | 9 | 1 | 5 | 4 | 6 | 2 | 0 | 5 | 3 | 5 | 3 | 16 | 3 | 5 |
| 15 | 13 | 9 | 1 | 5 | 7 | 14 | 12 | 8 | 10 | 11 | 3 | 2 | 6 | 4 | 0 | 3 | 5 | 5 | 3 | 16 | 3 | 5 |
| 15 | 13 | 9 | 11 | 3 | 7 | 14 | 12 | 8 | 10 | 2 | 6 | 4 | 5 | 1 | 0 | 3 | 5 | 5 | 3 | 16 | 3 | 5 |
| 15 | 11 | 3 | 7 | 14 | 12 | 13 | 9 | 8 | 10 | 2 | 0 | 1 | 5 | 4 | 6 | 5 | 4 | 4 | 3 | 16 | 3 | 5 |
| 15 | 11 | 3 | 7 | 14 | 12 | 13 | 9 | 8 | 10 | 2 | 6 | 4 | 5 | 1 | 0 | 5 | 3 | 5 | 3 | 16 | 3 | 5 |
| 15 | 7 | 14 | 12 | 13 | 9 | 8 | 10 | 11 | 3 | 1 | 5 | 4 | 0 | 2 | 6 | 5 | 4 | 4 | 3 | 16 | 3 | 5 |
| 15 | 7 | 14 | 12 | 13 | 9 | 8 | 10 | 11 | 3 | 1 | 5 | 4 | 6 | 2 | 0 | 5 | 5 | 3 | 3 | 16 | 3 | 5 |
| 15 | 7 | 14 | 12 | 13 | 9 | 11 | 10 | 8 | 0 | 4 | 6 | 2 | 3 | 1 | 5 | 5 | 4 | 3 | 3 | 16 | 3 | 5 |
| 15 | 7 | 14 | 12 | 13 | 9 | 11 | 10 | 8 | 0 | 4 | 5 | 1 | 3 | 2 | 6 | 5 | 4 | 4 | 3 | 16 | 3 | 5 |
| Dynamic comp | | | | | | | | | | | | | | | | | | | | | | |
| 15 | 14 | 12 | 8 | 0 | 4 | 6 | 7 | 13 | 9 | 11 | 10 | 2 | 3 | 1 | 5 | 3 | 3 | 3 | 2 | 11 | 2 | 3 |
| 15 | 14 | 12 | 8 | 0 | 4 | 13 | 9 | 11 | 10 | 2 | 6 | 7 | 5 | 1 | 3 | 3 | 3 | 3 | 2 | 11 | 2 | 3 |
| 15 | 14 | 12 | 8 | 0 | 4 | 13 | 9 | 11 | 10 | 2 | 3 | 1 | 5 | 7 | 6 | 3 | 3 | 3 | 2 | 11 | 2 | 3 |
| 15 | 14 | 12 | 8 | 10 | 2 | 6 | 4 | 13 | 9 | 11 | 3 | 7 | 5 | 1 | 0 | 2 | 3 | 3 | 2 | 10 | 2 | 3 |
| 15 | 14 | 12 | 8 | 10 | 2 | 6 | 7 | 13 | 9 | 11 | 3 | 1 | 0 | 4 | 5 | 3 | 3 | 3 | 2 | 11 | 2 | 3 |
| 15 | 14 | 12 | 8 | 10 | 2 | 6 | 7 | 13 | 9 | 11 | 3 | 1 | 5 | 4 | 0 | 2 | 3 | 3 | 2 | 10 | 2 | 3 |
| 15 | 14 | 12 | 8 | 10 | 11 | 3 | 2 | 0 | 4 | 6 | 7 | 13 | 9 | 1 | 5 | 3 | 3 | 3 | 2 | 11 | 2 | 3 |
| 15 | 14 | 12 | 8 | 10 | 11 | 3 | 2 | 0 | 4 | 13 | 9 | 1 | 5 | 7 | 6 | 3 | 3 | 3 | 2 | 11 | 2 | 3 |
| 15 | 14 | 12 | 8 | 10 | 11 | 3 | 2 | 6 | 7 | 13 | 9 | 1 | 5 | 4 | 0 | 3 | 2 | 3 | 2 | 10 | 2 | 3 |
| 15 | 14 | 12 | 8 | 10 | 11 | 3 | 7 | 13 | 9 | 1 | 0 | 2 | 6 | 4 | 5 | 3 | 3 | 3 | 2 | 11 | 2 | 3 |
| 15 | 14 | 12 | 8 | 10 | 11 | 3 | 7 | 13 | 9 | 1 | 5 | 4 | 6 | 2 | 0 | 2 | 3 | 3 | 2 | 10 | 2 | 3 |
| 15 | 14 | 12 | 4 | 13 | 9 | 8 | 10 | 11 | 3 | 1 | 5 | 7 | 6 | 2 | 0 | 3 | 3 | 2 | 2 | 10 | 2 | 3 |
| 15 | 14 | 12 | 4 | 13 | 9 | 8 | 10 | 11 | 3 | 7 | 5 | 1 | 0 | 2 | 6 | 3 | 3 | 3 | 2 | 11 | 2 | 3 |
| 15 | 14 | 12 | 4 | 13 | 9 | 11 | 10 | 8 | 0 | 2 | 6 | 7 | 3 | 1 | 5 | 3 | 3 | 3 | 2 | 11 | 2 | 3 |
| 15 | 14 | 12 | 4 | 13 | 9 | 11 | 10 | 8 | 0 | 1 | 5 | 7 | 3 | 2 | 6 | 3 | 3 | 3 | 2 | 11 | 2 | 3 |
| 15 | 14 | 12 | 13 | 9 | 8 | 10 | 2 | 0 | 4 | 6 | 7 | 11 | 3 | 1 | 5 | 3 | 3 | 3 | 2 | 11 | 2 | 3 |
| 15 | 14 | 12 | 13 | 9 | 8 | 10 | 2 | 0 | 4 | 5 | 1 | 11 | 3 | 7 | 6 | 3 | 3 | 3 | 2 | 11 | 2 | 3 |
| 15 | 14 | 12 | 13 | 9 | 8 | 10 | 2 | 6 | 4 | 0 | 1 | 5 | 7 | 11 | 3 | 3 | 3 | 3 | 2 | 11 | 2 | 3 |
| 15 | 14 | 12 | 13 | 9 | 8 | 10 | 2 | 6 | 4 | 0 | 1 | 11 | 3 | 7 | 5 | 3 | 3 | 3 | 2 | 11 | 2 | 3 |
| 15 | 14 | 12 | 13 | 9 | 8 | 10 | 2 | 6 | 4 | 5 | 7 | 11 | 3 | 1 | 0 | 3 | 3 | 2 | 2 | 10 | 2 | 3 |
| 15 | 14 | 12 | 13 | 9 | 8 | 10 | 2 | 6 | 7 | 11 | 3 | 1 | 5 | 4 | 0 | 3 | 2 | 3 | 2 | 10 | 2 | 3 |
| 15 | 14 | 12 | 13 | 9 | 8 | 10 | 2 | 11 | 3 | 1 | 5 | 7 | 6 | 4 | 0 | 3 | 3 | 2 | 2 | 10 | 2 | 3 |
| 15 | 14 | 12 | 13 | 9 | 8 | 10 | 2 | 11 | 3 | 7 | 5 | 1 | 0 | 4 | 6 | 3 | 3 | 3 | 2 | 11 | 2 | 3 |
| 15 | 14 | 12 | 13 | 9 | 1 | 8 | 10 | 11 | 3 | 7 | 5 | 4 | 0 | 2 | 6 | 3 | 3 | 3 | 2 | 11 | 2 | 3 |
| 15 | 14 | 12 | 13 | 9 | 1 | 8 | 10 | 11 | 3 | 7 | 5 | 4 | 6 | 2 | 0 | 3 | 3 | 2 | 2 | 10 | 2 | 3 |
| 15 | 14 | 12 | 13 | 9 | 1 | 5 | 4 | 8 | 10 | 11 | 3 | 7 | 6 | 2 | 0 | 3 | 2 | 3 | 2 | 10 | 2 | 3 |
| 15 | 14 | 12 | 13 | 9 | 1 | 5 | 7 | 6 | 4 | 8 | 10 | 11 | 3 | 2 | 0 | 3 | 3 | 2 | 2 | 10 | 2 | 3 |
| 15 | 14 | 12 | 13 | 9 | 1 | 5 | 7 | 11 | 10 | 8 | 0 | 4 | 6 | 2 | 3 | 3 | 3 | 3 | 2 | 11 | 2 | 3 |
| 15 | 14 | 12 | 13 | 9 | 1 | 11 | 10 | 8 | 0 | 4 | 6 | 2 | 3 | 7 | 5 | 3 | 3 | 3 | 2 | 11 | 2 | 3 |
| 15 | 14 | 12 | 13 | 9 | 1 | 11 | 10 | 8 | 0 | 4 | 5 | 7 | 3 | 2 | 6 | 3 | 3 | 3 | 2 | 11 | 2 | 3 |
| 15 | 14 | 12 | 13 | 9 | 11 | 10 | 2 | 8 | 0 | 4 | 6 | 7 | 3 | 1 | 5 | 3 | 3 | 3 | 2 | 11 | 2 | 3 |
| 15 | 14 | 12 | 13 | 9 | 11 | 10 | 2 | 8 | 0 | 4 | 5 | 1 | 3 | 7 | 6 | 3 | 3 | 3 | 2 | 11 | 2 | 3 |
| 15 | 14 | 12 | 13 | 9 | 11 | 10 | 2 | 6 | 4 | 8 | 0 | 1 | 5 | 7 | 3 | 3 | 3 | 3 | 2 | 11 | 2 | 3 |
| 15 | 14 | 12 | 13 | 9 | 11 | 10 | 2 | 6 | 4 | 8 | 0 | 1 | 3 | 7 | 5 | 3 | 3 | 3 | 2 | 11 | 2 | 3 |
| 15 | 14 | 12 | 13 | 9 | 11 | 10 | 2 | 6 | 4 | 5 | 7 | 3 | 1 | 8 | 0 | 3 | 3 | 2 | 2 | 10 | 2 | 3 |
| 15 | 14 | 12 | 13 | 9 | 11 | 10 | 2 | 6 | 7 | 3 | 1 | 5 | 4 | 8 | 0 | 3 | 2 | 3 | 2 | 10 | 2 | 3 |
| 15 | 14 | 12 | 13 | 9 | 11 | 10 | 2 | 3 | 1 | 5 | 7 | 6 | 4 | 8 | 0 | 3 | 3 | 2 | 2 | 10 | 2 | 3 |
| 15 | 14 | 12 | 13 | 9 | 11 | 10 | 2 | 3 | 7 | 5 | 1 | 8 | 0 | 4 | 6 | 3 | 3 | 3 | 2 | 11 | 2 | 3 |
| 15 | 14 | 12 | 13 | 9 | 11 | 3 | 1 | 8 | 10 | 2 | 6 | 7 | 5 | 4 | 0 | 3 | 3 | 3 | 2 | 11 | 2 | 3 |
| 15 | 14 | 12 | 13 | 9 | 11 | 3 | 7 | 6 | 4 | 8 | 10 | 2 | 0 | 1 | 5 | 3 | 3 | 3 | 2 | 11 | 2 | 3 |
| 15 | 14 | 12 | 13 | 9 | 11 | 3 | 7 | 6 | 4 | 5 | 1 | 8 | 10 | 2 | 0 | 3 | 3 | 2 | 2 | 10 | 2 | 3 |
| 15 | 14 | 12 | 13 | 9 | 11 | 3 | 7 | 5 | 1 | 8 | 10 | 2 | 6 | 4 | 0 | 2 | 3 | 3 | 2 | 10 | 2 | 3 |
| 15 | 14 | 12 | 13 | 5 | 4 | 8 | 10 | 11 | 9 | 1 | 3 | 7 | 6 | 2 | 0 | 3 | 3 | 2 | 2 | 10 | 2 | 3 |
| 15 | 14 | 12 | 13 | 5 | 7 | 11 | 10 | 8 | 9 | 1 | 3 | 2 | 6 | 4 | 0 | 3 | 3 | 2 | 2 | 10 | 2 | 3 |
| 15 | 14 | 10 | 2 | 6 | 7 | 13 | 12 | 8 | 9 | 11 | 3 | 1 | 5 | 4 | 0 | 3 | 2 | 3 | 2 | 10 | 2 | 3 |
| 15 | 14 | 10 | 11 | 3 | 7 | 13 | 12 | 8 | 9 | 1 | 5 | 4 | 6 | 2 | 0 | 3 | 2 | 3 | 2 | 10 | 2 | 3 |
| 15 | 13 | 9 | 1 | 5 | 7 | 14 | 12 | 8 | 10 | 11 | 3 | 2 | 6 | 4 | 0 | 2 | 3 | 3 | 2 | 10 | 2 | 3 |
| 15 | 13 | 9 | 11 | 3 | 7 | 14 | 12 | 8 | 10 | 2 | 6 | 4 | 5 | 1 | 0 | 2 | 3 | 3 | 2 | 10 | 2 | 3 |
| 15 | 11 | 3 | 7 | 14 | 12 | 13 | 9 | 8 | 10 | 2 | 0 | 1 | 5 | 4 | 6 | 3 | 3 | 3 | 2 | 11 | 2 | 3 |
| 15 | 11 | 3 | 7 | 14 | 12 | 13 | 9 | 8 | 10 | 2 | 6 | 4 | 5 | 1 | 0 | 2 | 3 | 3 | 2 | 10 | 2 | 3 |
| 15 | 7 | 14 | 12 | 13 | 9 | 8 | 10 | 11 | 3 | 1 | 5 | 4 | 0 | 2 | 6 | 3 | 3 | 3 | 2 | 11 | 2 | 3 |
| 15 | 7 | 14 | 12 | 13 | 9 | 8 | 10 | 11 | 3 | 1 | 5 | 4 | 6 | 2 | 0 | 3 | 3 | 2 | 2 | 10 | 2 | 3 |
| 15 | 7 | 14 | 12 | 13 | 9 | 11 | 10 | 8 | 0 | 4 | 6 | 2 | 3 | 1 | 5 | 3 | 3 | 3 | 2 | 11 | 2 | 3 |
| 15 | 7 | 14 | 12 | 13 | 9 | 11 | 10 | 8 | 0 | 4 | 5 | 1 | 3 | 2 | 6 | 3 | 3 | 3 | 2 | 11 | 2 | 3 |

APPENDIX D

4-bit, 17 transitions, almost equal spread

| States Order | | | | | | | | | | | | | | | | Static comp | | | | T | Min | Max |
|---|---|---|---|---|---|---|---|---|---|---|---|---|---|---|---|---|---|---|---|---|---|---|
| 15 | 14 | 12 | 8 | 0 | 10 | 11 | 3 | 2 | 6 | 4 | 13 | 9 | 1 | 5 | 7 | 4 | 4 | 4 | 5 | 17 | 4 | 5 |
| 15 | 14 | 12 | 13 | 9 | 8 | 0 | 4 | 6 | 10 | 2 | 11 | 3 | 1 | 5 | 7 | 4 | 4 | 4 | 5 | 17 | 4 | 5 |
| 15 | 14 | 12 | 13 | 9 | 8 | 0 | 10 | 2 | 6 | 4 | 5 | 1 | 11 | 3 | 7 | 4 | 4 | 4 | 5 | 17 | 4 | 5 |
| 15 | 14 | 12 | 13 | 9 | 1 | 5 | 4 | 6 | 10 | 8 | 0 | 2 | 11 | 3 | 7 | 4 | 4 | 4 | 5 | 17 | 4 | 5 |
| 15 | 14 | 12 | 13 | 9 | 11 | 3 | 10 | 2 | 6 | 4 | 8 | 0 | 1 | 5 | 7 | 4 | 4 | 4 | 5 | 17 | 4 | 5 |
| 15 | 14 | 12 | 13 | 9 | 11 | 3 | 1 | 5 | 4 | 8 | 0 | 10 | 2 | 6 | 7 | 4 | 4 | 4 | 5 | 17 | 4 | 5 |
| 15 | 14 | 12 | 13 | 5 | 9 | 8 | 10 | 2 | 6 | 4 | 0 | 1 | 11 | 3 | 7 | 4 | 4 | 4 | 5 | 17 | 4 | 5 |
| 15 | 14 | 12 | 13 | 5 | 9 | 1 | 11 | 10 | 8 | 0 | 4 | 6 | 2 | 3 | 7 | 4 | 4 | 4 | 5 | 17 | 4 | 5 |
| 15 | 14 | 12 | 13 | 5 | 9 | 11 | 10 | 2 | 6 | 4 | 8 | 0 | 1 | 3 | 7 | 4 | 4 | 4 | 5 | 17 | 4 | 5 |
| 15 | 14 | 10 | 2 | 6 | 12 | 13 | 9 | 11 | 3 | 1 | 8 | 0 | 4 | 5 | 7 | 4 | 4 | 4 | 5 | 17 | 4 | 5 |
| 15 | 14 | 6 | 12 | 8 | 0 | 4 | 13 | 9 | 11 | 10 | 2 | 3 | 1 | 5 | 7 | 4 | 4 | 4 | 5 | 17 | 4 | 5 |
| 15 | 14 | 6 | 12 | 8 | 10 | 11 | 3 | 2 | 0 | 4 | 13 | 9 | 1 | 5 | 7 | 4 | 4 | 4 | 5 | 17 | 4 | 5 |
| 15 | 14 | 6 | 12 | 13 | 9 | 8 | 10 | 2 | 0 | 4 | 5 | 1 | 11 | 3 | 7 | 4 | 4 | 4 | 5 | 17 | 4 | 5 |
| 15 | 14 | 6 | 12 | 13 | 9 | 11 | 10 | 2 | 8 | 0 | 4 | 5 | 1 | 3 | 7 | 4 | 4 | 4 | 5 | 17 | 4 | 5 |
| | | | | | | | | | | | | | | | | Dynamic comp | | | | | | |
| 15 | 14 | 12 | 8 | 0 | 10 | 11 | 3 | 2 | 6 | 4 | 13 | 9 | 1 | 5 | 7 | 3 | 3 | 3 | 3 | 12 | 3 | 3 |
| 15 | 14 | 12 | 13 | 9 | 8 | 0 | 4 | 6 | 10 | 2 | 11 | 3 | 1 | 5 | 7 | 3 | 3 | 3 | 3 | 12 | 3 | 3 |
| 15 | 14 | 12 | 13 | 9 | 8 | 0 | 10 | 2 | 6 | 4 | 5 | 1 | 11 | 3 | 7 | 3 | 3 | 3 | 3 | 12 | 3 | 3 |
| 15 | 14 | 12 | 13 | 9 | 1 | 5 | 4 | 6 | 10 | 8 | 0 | 2 | 11 | 3 | 7 | 3 | 3 | 3 | 3 | 12 | 3 | 3 |
| 15 | 14 | 12 | 13 | 9 | 11 | 3 | 10 | 2 | 6 | 4 | 8 | 0 | 1 | 5 | 7 | 3 | 3 | 3 | 3 | 12 | 3 | 3 |
| 15 | 14 | 12 | 13 | 9 | 11 | 3 | 1 | 5 | 4 | 8 | 0 | 10 | 2 | 6 | 7 | 3 | 3 | 3 | 3 | 12 | 3 | 3 |
| 15 | 14 | 12 | 13 | 5 | 9 | 8 | 10 | 2 | 6 | 4 | 0 | 1 | 11 | 3 | 7 | 3 | 3 | 3 | 3 | 12 | 3 | 3 |
| 15 | 14 | 12 | 13 | 5 | 9 | 1 | 11 | 10 | 8 | 0 | 4 | 6 | 2 | 3 | 7 | 3 | 3 | 3 | 3 | 12 | 3 | 3 |
| 15 | 14 | 12 | 13 | 5 | 9 | 11 | 10 | 2 | 6 | 4 | 8 | 0 | 1 | 3 | 7 | 3 | 3 | 3 | 3 | 12 | 3 | 3 |
| 15 | 14 | 10 | 2 | 6 | 12 | 13 | 9 | 11 | 3 | 1 | 8 | 0 | 4 | 5 | 7 | 3 | 3 | 3 | 3 | 12 | 3 | 3 |
| 15 | 14 | 6 | 12 | 8 | 0 | 4 | 13 | 9 | 11 | 10 | 2 | 3 | 1 | 5 | 7 | 3 | 3 | 3 | 3 | 12 | 3 | 3 |
| 15 | 14 | 6 | 12 | 8 | 10 | 11 | 3 | 2 | 0 | 4 | 13 | 9 | 1 | 5 | 7 | 3 | 3 | 3 | 3 | 12 | 3 | 3 |
| 15 | 14 | 6 | 12 | 13 | 9 | 8 | 10 | 2 | 0 | 4 | 5 | 1 | 11 | 3 | 7 | 3 | 3 | 3 | 3 | 12 | 3 | 3 |
| 15 | 14 | 6 | 12 | 13 | 9 | 11 | 10 | 2 | 8 | 0 | 4 | 5 | 1 | 3 | 7 | 3 | 3 | 3 | 3 | 12 | 3 | 3 |

APPENDIX E

4-bits, 16 comparisons, almost equal spread for dynamic reading

| States Order | | | | | | | | | | | | | | | | Static comp | | | | T | Min | Max |
|---|---|---|---|---|---|---|---|---|---|---|---|---|---|---|---|---|---|---|---|---|---|---|
| 15 | 14 | 12 | 4 | 13 | 9 | 8 | 10 | 11 | 3 | 2 | 6 | 7 | 5 | 1 | 0 | 7 | 3 | 3 | 3 | 16 | 3 | 7 |
| 15 | 14 | 12 | 13 | 9 | 8 | 10 | 2 | 11 | 3 | 7 | 6 | 4 | 5 | 1 | 0 | 7 | 3 | 3 | 3 | 16 | 3 | 7 |
| 15 | 14 | 12 | 13 | 9 | 1 | 8 | 10 | 11 | 3 | 2 | 6 | 7 | 5 | 4 | 0 | 7 | 3 | 3 | 3 | 16 | 3 | 7 |
| 15 | 14 | 12 | 13 | 9 | 11 | 10 | 2 | 3 | 7 | 6 | 4 | 5 | 1 | 8 | 0 | 7 | 3 | 3 | 3 | 16 | 3 | 7 |
| 15 | 14 | 12 | 13 | 9 | 11 | 3 | 1 | 5 | 7 | 6 | 4 | 8 | 10 | 2 | 0 | 3 | 7 | 3 | 3 | 16 | 3 | 7 |
| 15 | 14 | 12 | 13 | 5 | 4 | 8 | 9 | 11 | 10 | 2 | 6 | 7 | 3 | 1 | 0 | 7 | 3 | 3 | 3 | 16 | 3 | 7 |
| 15 | 14 | 6 | 7 | 13 | 12 | 8 | 9 | 11 | 10 | 2 | 3 | 1 | 5 | 4 | 0 | 7 | 3 | 3 | 3 | 16 | 3 | 7 |
| 15 | 13 | 5 | 7 | 14 | 12 | 8 | 10 | 11 | 9 | 1 | 3 | 2 | 6 | 4 | 0 | 3 | 7 | 3 | 3 | 16 | 3 | 7 |
| 15 | 7 | 14 | 12 | 13 | 9 | 8 | 10 | 11 | 3 | 2 | 6 | 4 | 5 | 1 | 0 | 7 | 3 | 3 | 3 | 16 | 3 | 7 |
| | | | | | | | | | | | | | | | | Dynamic comp | | | | | | |
| 15 | 14 | 12 | 4 | 13 | 9 | 8 | 10 | 11 | 3 | 2 | 6 | 7 | 5 | 1 | 0 | 3 | 2 | 2 | 2 | 9 | 2 | 3 |
| 15 | 14 | 12 | 13 | 9 | 8 | 10 | 2 | 11 | 3 | 7 | 6 | 4 | 5 | 1 | 0 | 3 | 2 | 2 | 2 | 9 | 2 | 3 |
| 15 | 14 | 12 | 13 | 9 | 1 | 8 | 10 | 11 | 3 | 2 | 6 | 7 | 5 | 4 | 0 | 3 | 2 | 2 | 2 | 9 | 2 | 3 |
| 15 | 14 | 12 | 13 | 9 | 11 | 10 | 2 | 3 | 7 | 6 | 4 | 5 | 1 | 8 | 0 | 3 | 2 | 2 | 2 | 9 | 2 | 3 |
| 15 | 14 | 12 | 13 | 9 | 11 | 3 | 1 | 5 | 7 | 6 | 4 | 8 | 10 | 2 | 0 | 2 | 3 | 2 | 2 | 9 | 2 | 3 |
| 15 | 14 | 12 | 13 | 5 | 4 | 8 | 9 | 11 | 10 | 2 | 6 | 7 | 3 | 1 | 0 | 3 | 2 | 2 | 2 | 9 | 2 | 3 |
| 15 | 14 | 6 | 7 | 13 | 12 | 8 | 9 | 11 | 10 | 2 | 3 | 1 | 5 | 4 | 0 | 3 | 2 | 2 | 2 | 9 | 2 | 3 |
| 15 | 13 | 5 | 7 | 14 | 12 | 8 | 10 | 11 | 9 | 1 | 3 | 2 | 6 | 4 | 0 | 2 | 3 | 2 | 2 | 9 | 2 | 3 |
| 15 | 7 | 14 | 12 | 13 | 9 | 8 | 10 | 11 | 3 | 2 | 6 | 4 | 5 | 1 | 0 | 3 | 2 | 2 | 2 | 9 | 2 | 3 |

APPENDIX F

3-bit even distributed Gray codes

| States Order | | | | | | | Static comp | T | Min | Max | Dynamic comp | T | Min | Max |
|---|---|---|---|---|---|---|---|---|---|---|---|---|---|---|
| 7 | 3 | 2 | 0 | 1 | 5 | 4 | 6 | 3 2 2 | 7 | 2 | 3 | 2 2 2 | 6 | 2 | 2 |
| 7 | 5 | 4 | 0 | 1 | 3 | 2 | 6 | 3 2 2 | 7 | 2 | 3 | 2 2 2 | 6 | 2 | 2 |

APPENDIX G

4-bit even distribution Gray codes

| States Order | | | | | | | | | | | | | | Static comp | T | Min | Max | Dynamic comp | T | Min | Max |
|---|---|---|---|---|---|---|---|---|---|---|---|---|---|---|---|---|---|---|---|---|---|
| 15 | 11 | 3 | 1 | 0 | 2 | 5 | 14 | 10 | 8 | 9 | 13 | 12 | 4 | 5 7 4 4 4 | 3 | 15 | 3 | 4 | 3 3 3 2 | 11 | 2 | 3 |
| 15 | 11 | 3 | 1 | 0 | 2 | 10 | 14 | 12 | 8 | 9 | 13 | 5 | 4 | 6 7 4 4 4 | 3 | 15 | 3 | 4 | 3 3 3 2 | 11 | 2 | 3 |
| 15 | 11 | 3 | 1 | 0 | 8 | 9 | 13 | 12 | 14 | 10 | 2 | 6 | 4 | 5 7 4 4 4 | 3 | 15 | 3 | 4 | 3 3 3 2 | 11 | 2 | 3 |
| 15 | 11 | 3 | 1 | 5 | 4 | 0 | 2 | 10 | 8 | 9 | 13 | 12 | 14 | 6 7 4 4 4 | 3 | 15 | 3 | 4 | 3 3 3 2 | 11 | 2 | 3 |
| 15 | 11 | 3 | 1 | 9 | 8 | 10 | 14 | 12 | 13 | 5 | 4 | 0 | 2 | 6 7 4 4 4 | 3 | 15 | 3 | 4 | 3 3 3 2 | 11 | 2 | 3 |
| 15 | 11 | 3 | 2 | 0 | 1 | 5 | 13 | 9 | 8 | 10 | 14 | 12 | 4 | 6 7 4 4 4 | 3 | 15 | 3 | 4 | 3 3 3 2 | 11 | 2 | 3 |
| 15 | 11 | 3 | 2 | 0 | 1 | 9 | 13 | 12 | 8 | 10 | 14 | 6 | 4 | 5 7 4 4 4 | 3 | 15 | 3 | 4 | 3 3 3 2 | 11 | 2 | 3 |
| 15 | 11 | 3 | 2 | 0 | 8 | 10 | 14 | 12 | 13 | 9 | 1 | 5 | 4 | 6 7 4 4 4 | 3 | 15 | 3 | 4 | 3 3 3 2 | 11 | 2 | 3 |
| 15 | 11 | 3 | 2 | 6 | 4 | 0 | 1 | 9 | 8 | 10 | 14 | 12 | 13 | 5 7 4 4 4 | 3 | 15 | 3 | 4 | 3 3 3 2 | 11 | 2 | 3 |
| 15 | 11 | 3 | 2 | 10 | 8 | 9 | 13 | 12 | 14 | 6 | 4 | 0 | 1 | 5 7 4 4 4 | 3 | 15 | 3 | 4 | 3 3 3 2 | 11 | 2 | 3 |
| 15 | 11 | 9 | 1 | 0 | 8 | 10 | 14 | 12 | 13 | 5 | 4 | 6 | 2 | 3 7 4 4 4 | 3 | 15 | 3 | 4 | 3 3 3 2 | 11 | 2 | 3 |
| 15 | 11 | 9 | 1 | 3 | 2 | 0 | 4 | 5 | 13 | 12 | 8 | 10 | 14 | 6 7 4 4 4 | 3 | 15 | 3 | 4 | 3 3 3 2 | 11 | 2 | 3 |
| 15 | 11 | 9 | 8 | 10 | 2 | 6 | 14 | 12 | 13 | 5 | 4 | 0 | 1 | 3 7 4 4 4 | 3 | 15 | 3 | 4 | 3 3 3 2 | 11 | 2 | 3 |
| 15 | 11 | 9 | 8 | 10 | 14 | 6 | 2 | 3 | 1 | 0 | 4 | 12 | 13 | 5 7 4 4 4 | 3 | 15 | 3 | 4 | 3 3 3 2 | 11 | 2 | 3 |
| 15 | 11 | 9 | 8 | 10 | 14 | 6 | 4 | 12 | 13 | 5 | 1 | 0 | 2 | 3 7 4 4 4 | 3 | 15 | 3 | 4 | 3 3 3 2 | 11 | 2 | 3 |
| 15 | 11 | 9 | 8 | 12 | 13 | 5 | 4 | 6 | 14 | 10 | 2 | 0 | 1 | 3 7 4 4 4 | 3 | 15 | 3 | 4 | 3 3 3 2 | 11 | 2 | 3 |
| 15 | 11 | 9 | 13 | 5 | 4 | 0 | 1 | 3 | 2 | 10 | 8 | 12 | 14 | 6 7 4 4 4 | 3 | 15 | 3 | 4 | 3 3 3 2 | 11 | 2 | 3 |
| 15 | 11 | 9 | 13 | 5 | 4 | 12 | 14 | 10 | 8 | 0 | 1 | 3 | 2 | 6 7 4 4 4 | 3 | 15 | 3 | 4 | 3 3 3 2 | 11 | 2 | 3 |
| 15 | 11 | 9 | 13 | 12 | 4 | 5 | 1 | 3 | 2 | 0 | 8 | 10 | 14 | 6 7 4 4 4 | 3 | 15 | 3 | 4 | 3 3 3 2 | 11 | 2 | 3 |
| 15 | 11 | 9 | 13 | 12 | 8 | 0 | 1 | 3 | 2 | 10 | 14 | 6 | 4 | 5 7 4 4 4 | 3 | 15 | 3 | 4 | 3 3 3 2 | 11 | 2 | 3 |
| 15 | 11 | 9 | 13 | 12 | 14 | 6 | 4 | 5 | 1 | 0 | 8 | 10 | 2 | 3 7 4 4 4 | 3 | 15 | 3 | 4 | 3 3 3 2 | 11 | 2 | 3 |
| 15 | 11 | 10 | 2 | 0 | 8 | 9 | 13 | 12 | 14 | 6 | 4 | 5 | 1 | 3 7 4 4 4 | 3 | 15 | 3 | 4 | 3 3 3 2 | 11 | 2 | 3 |
| 15 | 11 | 10 | 2 | 3 | 1 | 0 | 4 | 6 | 14 | 12 | 8 | 9 | 13 | 5 7 4 4 4 | 3 | 15 | 3 | 4 | 3 3 3 2 | 11 | 2 | 3 |
| 15 | 11 | 10 | 8 | 9 | 1 | 5 | 13 | 12 | 14 | 6 | 4 | 0 | 2 | 3 7 4 4 4 | 3 | 15 | 3 | 4 | 3 3 3 2 | 11 | 2 | 3 |
| 15 | 11 | 10 | 8 | 9 | 13 | 5 | 1 | 3 | 2 | 0 | 4 | 12 | 14 | 6 7 4 4 4 | 3 | 15 | 3 | 4 | 3 3 3 2 | 11 | 2 | 3 |
| 15 | 11 | 10 | 8 | 9 | 13 | 5 | 4 | 12 | 14 | 6 | 2 | 0 | 1 | 3 7 4 4 4 | 3 | 15 | 3 | 4 | 3 3 3 2 | 11 | 2 | 3 |
| 15 | 11 | 10 | 8 | 12 | 14 | 6 | 4 | 5 | 13 | 9 | 1 | 0 | 2 | 3 7 4 4 4 | 3 | 15 | 3 | 4 | 3 3 3 2 | 11 | 2 | 3 |
| 15 | 11 | 10 | 14 | 6 | 4 | 0 | 2 | 3 | 1 | 9 | 8 | 12 | 13 | 5 7 4 4 4 | 3 | 15 | 3 | 4 | 3 3 3 2 | 11 | 2 | 3 |
| 15 | 11 | 10 | 14 | 6 | 4 | 12 | 13 | 9 | 8 | 0 | 2 | 3 | 1 | 5 7 4 4 4 | 3 | 15 | 3 | 4 | 3 3 3 2 | 11 | 2 | 3 |
| 15 | 11 | 10 | 14 | 12 | 4 | 6 | 2 | 3 | 1 | 0 | 8 | 9 | 13 | 5 7 4 4 4 | 3 | 15 | 3 | 4 | 3 3 3 2 | 11 | 2 | 3 |
| 15 | 11 | 10 | 14 | 12 | 8 | 0 | 2 | 3 | 1 | 9 | 13 | 5 | 4 | 6 7 4 4 4 | 3 | 15 | 3 | 4 | 3 3 3 2 | 11 | 2 | 3 |
| 15 | 11 | 10 | 14 | 12 | 13 | 5 | 4 | 6 | 2 | 0 | 8 | 9 | 1 | 3 7 4 4 4 | 3 | 15 | 3 | 4 | 3 3 3 2 | 11 | 2 | 3 |
| 15 | 13 | 5 | 1 | 0 | 4 | 6 | 14 | 12 | 8 | 9 | 11 | 10 | 2 | 3 7 4 4 4 | 3 | 15 | 3 | 4 | 3 3 3 2 | 11 | 2 | 3 |
| 15 | 13 | 5 | 1 | 0 | 4 | 12 | 14 | 10 | 8 | 9 | 11 | 3 | 2 | 6 7 4 4 4 | 3 | 15 | 3 | 4 | 3 3 3 2 | 11 | 2 | 3 |
| 15 | 13 | 5 | 1 | 0 | 8 | 9 | 11 | 10 | 14 | 12 | 4 | 6 | 2 | 3 7 4 4 4 | 3 | 15 | 3 | 4 | 3 3 3 2 | 11 | 2 | 3 |
| 15 | 13 | 5 | 1 | 3 | 2 | 0 | 4 | 12 | 8 | 9 | 11 | 10 | 14 | 6 7 4 4 4 | 3 | 15 | 3 | 4 | 3 3 3 2 | 11 | 2 | 3 |
| 15 | 13 | 5 | 1 | 9 | 8 | 12 | 14 | 10 | 11 | 3 | 2 | 0 | 4 | 6 7 4 4 4 | 3 | 15 | 3 | 4 | 3 3 3 2 | 11 | 2 | 3 |
| 15 | 13 | 5 | 4 | 0 | 1 | 3 | 11 | 9 | 8 | 12 | 14 | 6 | 2 | 3 7 4 4 4 | 3 | 15 | 3 | 4 | 3 3 3 2 | 11 | 2 | 3 |
| 15 | 13 | 5 | 4 | 0 | 1 | 9 | 11 | 10 | 8 | 12 | 14 | 6 | 2 | 3 7 4 4 4 | 3 | 15 | 3 | 4 | 3 3 3 2 | 11 | 2 | 3 |
| 15 | 13 | 5 | 4 | 0 | 8 | 12 | 14 | 10 | 11 | 9 | 1 | 3 | 2 | 6 7 4 4 4 | 3 | 15 | 3 | 4 | 3 3 3 2 | 11 | 2 | 3 |
| 15 | 13 | 5 | 4 | 6 | 2 | 0 | 1 | 9 | 8 | 12 | 14 | 10 | 11 | 3 7 4 4 4 | 3 | 15 | 3 | 4 | 3 3 3 2 | 11 | 2 | 3 |
| 15 | 13 | 5 | 4 | 12 | 8 | 9 | 11 | 10 | 14 | 6 | 2 | 0 | 1 | 3 7 4 4 4 | 3 | 15 | 3 | 4 | 3 3 3 2 | 11 | 2 | 3 |
| 15 | 13 | 9 | 1 | 0 | 8 | 12 | 14 | 10 | 11 | 3 | 2 | 6 | 4 | 5 7 4 4 4 | 3 | 15 | 3 | 4 | 3 3 3 2 | 11 | 2 | 3 |
| 15 | 13 | 9 | 1 | 5 | 4 | 0 | 2 | 3 | 11 | 10 | 8 | 12 | 14 | 6 7 4 4 4 | 3 | 15 | 3 | 4 | 3 3 3 2 | 11 | 2 | 3 |
| 15 | 13 | 9 | 8 | 10 | 11 | 3 | 2 | 6 | 14 | 12 | 4 | 0 | 1 | 5 7 4 4 4 | 3 | 15 | 3 | 4 | 3 3 3 2 | 11 | 2 | 3 |
| 15 | 13 | 9 | 8 | 12 | 4 | 6 | 14 | 10 | 11 | 3 | 2 | 0 | 1 | 5 7 4 4 4 | 3 | 15 | 3 | 4 | 3 3 3 2 | 11 | 2 | 3 |
| 15 | 13 | 9 | 8 | 12 | 14 | 6 | 2 | 10 | 11 | 3 | 1 | 0 | 4 | 5 7 4 4 4 | 3 | 15 | 3 | 4 | 3 3 3 2 | 11 | 2 | 3 |
| 15 | 13 | 9 | 8 | 12 | 14 | 6 | 4 | 5 | 1 | 0 | 2 | 10 | 11 | 3 7 4 4 4 | 3 | 15 | 3 | 4 | 3 3 3 2 | 11 | 2 | 3 |
| 15 | 13 | 9 | 11 | 3 | 2 | 0 | 1 | 5 | 4 | 12 | 8 | 10 | 14 | 6 7 4 4 4 | 3 | 15 | 3 | 4 | 3 3 3 2 | 11 | 2 | 3 |
| 15 | 13 | 9 | 11 | 3 | 2 | 10 | 14 | 12 | 8 | 0 | 1 | 5 | 4 | 6 7 4 4 4 | 3 | 15 | 3 | 4 | 3 3 3 2 | 11 | 2 | 3 |
| 15 | 13 | 9 | 11 | 10 | 2 | 3 | 1 | 5 | 4 | 0 | 8 | 12 | 14 | 6 7 4 4 4 | 3 | 15 | 3 | 4 | 3 3 3 2 | 11 | 2 | 3 |
| 15 | 13 | 9 | 11 | 10 | 8 | 0 | 1 | 5 | 4 | 12 | 14 | 6 | 2 | 3 7 4 4 4 | 3 | 15 | 3 | 4 | 3 3 3 2 | 11 | 2 | 3 |
| 15 | 13 | 9 | 11 | 10 | 14 | 6 | 2 | 3 | 1 | 0 | 8 | 12 | 4 | 5 7 4 4 4 | 3 | 15 | 3 | 4 | 3 3 3 2 | 11 | 2 | 3 |
| 15 | 13 | 12 | 4 | 0 | 8 | 9 | 11 | 10 | 14 | 5 | 2 | 3 | 1 | 5 7 4 4 4 | 3 | 15 | 3 | 4 | 3 3 3 2 | 11 | 2 | 3 |
| 15 | 13 | 12 | 4 | 5 | 1 | 0 | 2 | 6 | 14 | 10 | 8 | 9 | 11 | 3 7 4 4 4 | 3 | 15 | 3 | 4 | 3 3 3 2 | 11 | 2 | 3 |
| 15 | 13 | 12 | 8 | 9 | 1 | 3 | 11 | 10 | 14 | 6 | 2 | 0 | 4 | 5 7 4 4 4 | 3 | 15 | 3 | 4 | 3 3 3 2 | 11 | 2 | 3 |
| 15 | 13 | 12 | 8 | 9 | 11 | 3 | 1 | 5 | 4 | 0 | 2 | 10 | 14 | 6 7 4 4 4 | 3 | 15 | 3 | 4 | 3 3 3 2 | 11 | 2 | 3 |
| 15 | 13 | 12 | 8 | 9 | 11 | 3 | 2 | 10 | 14 | 6 | 4 | 0 | 1 | 5 7 4 4 4 | 3 | 15 | 3 | 4 | 3 3 3 2 | 11 | 2 | 3 |
| 15 | 13 | 12 | 8 | 10 | 14 | 6 | 2 | 3 | 11 | 9 | 1 | 0 | 4 | 5 7 4 4 4 | 3 | 15 | 3 | 4 | 3 3 3 2 | 11 | 2 | 3 |
| 15 | 13 | 12 | 14 | 6 | 2 | 0 | 4 | 5 | 1 | 9 | 8 | 10 | 11 | 3 7 4 4 4 | 3 | 15 | 3 | 4 | 3 3 3 2 | 11 | 2 | 3 |
| 15 | 13 | 12 | 14 | 6 | 2 | 10 | 11 | 9 | 8 | 0 | 4 | 5 | 1 | 3 7 4 4 4 | 3 | 15 | 3 | 4 | 3 3 3 2 | 11 | 2 | 3 |
| 15 | 13 | 12 | 14 | 10 | 2 | 6 | 4 | 5 | 1 | 0 | 8 | 9 | 11 | 3 7 4 4 4 | 3 | 15 | 3 | 4 | 3 3 3 2 | 11 | 2 | 3 |
| 15 | 13 | 12 | 14 | 10 | 8 | 0 | 4 | 5 | 1 | 9 | 11 | 3 | 2 | 6 7 4 4 4 | 3 | 15 | 3 | 4 | 3 3 3 2 | 11 | 2 | 3 |

APPENDIX G-continued 4-bit even distribution Gray codes

| States Order | | | | | | | | | | | | | | | | Static comp | | | | T | Min | Max | Dynamic comp | | | | T | Min | Max |
|---|---|---|---|---|---|---|---|---|---|---|---|---|---|---|---|---|---|---|---|---|---|---|---|---|---|---|---|---|---|
| 15 | 13 | 12 | 14 | 10 | 11 | 3 | 2 | 6 | 4 | 0 | 8 | 9 | 1 | 5 | 7 | 4 | 4 | 4 | 3 | 15 | 3 | 4 | 3 | 3 | 3 | 2 | 11 | 2 | 3 |
| 15 | 14 | 6 | 2 | 0 | 4 | 5 | 13 | 12 | 8 | 10 | 11 | 9 | 1 | 3 | 7 | 4 | 4 | 4 | 3 | 15 | 3 | 4 | 3 | 3 | 3 | 2 | 11 | 2 | 3 |
| 15 | 14 | 6 | 2 | 0 | 4 | 12 | 13 | 9 | 8 | 10 | 11 | 3 | 1 | 5 | 7 | 4 | 4 | 4 | 3 | 15 | 3 | 4 | 3 | 3 | 3 | 2 | 11 | 2 | 3 |
| 15 | 14 | 6 | 2 | 0 | 8 | 10 | 11 | 9 | 13 | 12 | 4 | 5 | 1 | 3 | 7 | 4 | 4 | 4 | 3 | 15 | 3 | 4 | 3 | 3 | 3 | 2 | 11 | 2 | 3 |
| 15 | 14 | 6 | 2 | 3 | 1 | 0 | 4 | 12 | 8 | 10 | 11 | 9 | 13 | 5 | 7 | 4 | 4 | 4 | 3 | 15 | 3 | 4 | 3 | 3 | 3 | 2 | 11 | 2 | 3 |
| 15 | 14 | 6 | 2 | 10 | 8 | 12 | 13 | 9 | 11 | 3 | 1 | 0 | 4 | 5 | 7 | 4 | 4 | 4 | 3 | 15 | 3 | 4 | 3 | 3 | 3 | 2 | 11 | 2 | 3 |
| 15 | 14 | 6 | 4 | 0 | 2 | 3 | 11 | 10 | 8 | 12 | 13 | 9 | 1 | 5 | 7 | 4 | 4 | 4 | 3 | 15 | 3 | 4 | 3 | 3 | 3 | 2 | 11 | 2 | 3 |
| 15 | 14 | 6 | 4 | 0 | 2 | 10 | 11 | 9 | 8 | 12 | 13 | 5 | 1 | 3 | 7 | 4 | 4 | 4 | 3 | 15 | 3 | 4 | 3 | 3 | 3 | 2 | 11 | 2 | 3 |
| 15 | 14 | 6 | 4 | 0 | 8 | 12 | 13 | 9 | 11 | 10 | 2 | 3 | 1 | 5 | 7 | 4 | 4 | 4 | 3 | 15 | 3 | 4 | 3 | 3 | 3 | 2 | 11 | 2 | 3 |
| 15 | 14 | 6 | 4 | 5 | 1 | 0 | 2 | 10 | 8 | 12 | 13 | 9 | 11 | 3 | 7 | 4 | 4 | 4 | 3 | 15 | 3 | 4 | 3 | 3 | 3 | 2 | 11 | 2 | 3 |
| 15 | 14 | 6 | 4 | 12 | 8 | 10 | 11 | 9 | 13 | 5 | 1 | 0 | 2 | 3 | 7 | 4 | 4 | 4 | 3 | 15 | 3 | 4 | 3 | 3 | 3 | 2 | 11 | 2 | 3 |
| 15 | 14 | 10 | 2 | 0 | 8 | 12 | 13 | 9 | 11 | 3 | 1 | 5 | 4 | 6 | 7 | 4 | 4 | 4 | 3 | 15 | 3 | 4 | 3 | 3 | 3 | 2 | 11 | 2 | 3 |
| 15 | 14 | 10 | 2 | 6 | 4 | 0 | 1 | 3 | 11 | 9 | 8 | 12 | 13 | 5 | 7 | 4 | 4 | 4 | 3 | 15 | 3 | 4 | 3 | 3 | 3 | 2 | 11 | 2 | 3 |
| 15 | 14 | 10 | 8 | 9 | 11 | 3 | 1 | 5 | 13 | 12 | 4 | 0 | 2 | 6 | 7 | 4 | 4 | 4 | 3 | 15 | 3 | 4 | 3 | 3 | 3 | 2 | 11 | 2 | 3 |
| 15 | 14 | 10 | 8 | 12 | 4 | 5 | 13 | 9 | 11 | 3 | 1 | 0 | 2 | 6 | 7 | 4 | 4 | 4 | 3 | 15 | 3 | 4 | 3 | 3 | 3 | 2 | 11 | 2 | 3 |
| 15 | 14 | 10 | 8 | 12 | 13 | 5 | 1 | 9 | 11 | 3 | 2 | 0 | 4 | 6 | 7 | 4 | 4 | 4 | 3 | 15 | 3 | 4 | 3 | 3 | 3 | 2 | 11 | 2 | 3 |
| 15 | 14 | 10 | 8 | 12 | 13 | 5 | 4 | 5 | 2 | 0 | 1 | 9 | 11 | 3 | 7 | 4 | 4 | 4 | 3 | 15 | 3 | 4 | 3 | 3 | 3 | 2 | 11 | 2 | 3 |
| 15 | 14 | 10 | 11 | 3 | 1 | 0 | 2 | 6 | 4 | 12 | 8 | 9 | 13 | 5 | 7 | 4 | 4 | 4 | 3 | 15 | 3 | 4 | 3 | 3 | 3 | 2 | 11 | 2 | 3 |
| 15 | 14 | 10 | 11 | 3 | 1 | 9 | 13 | 12 | 8 | 0 | 2 | 6 | 4 | 5 | 7 | 4 | 4 | 4 | 3 | 15 | 3 | 4 | 3 | 3 | 3 | 2 | 11 | 2 | 3 |
| 15 | 14 | 10 | 11 | 9 | 1 | 3 | 2 | 6 | 4 | 0 | 8 | 12 | 13 | 5 | 7 | 4 | 4 | 4 | 3 | 15 | 3 | 4 | 3 | 3 | 3 | 2 | 11 | 2 | 3 |
| 15 | 14 | 10 | 11 | 9 | 8 | 0 | 2 | 6 | 4 | 12 | 13 | 5 | 1 | 3 | 7 | 4 | 4 | 4 | 3 | 15 | 3 | 4 | 3 | 3 | 3 | 2 | 11 | 2 | 3 |
| 15 | 14 | 10 | 11 | 9 | 13 | 5 | 1 | 3 | 2 | 0 | 8 | 12 | 4 | 6 | 7 | 4 | 4 | 4 | 3 | 15 | 3 | 4 | 3 | 3 | 3 | 2 | 11 | 2 | 3 |
| 15 | 14 | 12 | 4 | 0 | 8 | 10 | 11 | 9 | 13 | 5 | 1 | 3 | 2 | 6 | 7 | 4 | 4 | 4 | 3 | 15 | 3 | 4 | 3 | 3 | 3 | 2 | 11 | 2 | 3 |
| 15 | 14 | 12 | 4 | 6 | 2 | 0 | 1 | 5 | 13 | 9 | 8 | 10 | 11 | 3 | 7 | 4 | 4 | 4 | 3 | 15 | 3 | 4 | 3 | 3 | 3 | 2 | 11 | 2 | 3 |
| 15 | 14 | 12 | 8 | 9 | 13 | 5 | 1 | 3 | 11 | 10 | 2 | 0 | 4 | 6 | 7 | 4 | 4 | 4 | 3 | 15 | 3 | 4 | 3 | 3 | 3 | 2 | 11 | 2 | 3 |
| 15 | 14 | 12 | 8 | 10 | 2 | 3 | 11 | 9 | 13 | 5 | 1 | 0 | 4 | 6 | 7 | 4 | 4 | 4 | 3 | 15 | 3 | 4 | 3 | 3 | 3 | 2 | 11 | 2 | 3 |
| 15 | 14 | 12 | 8 | 10 | 11 | 3 | 1 | 9 | 13 | 5 | 4 | 0 | 2 | 6 | 7 | 4 | 4 | 4 | 3 | 15 | 3 | 4 | 3 | 3 | 3 | 2 | 11 | 2 | 3 |
| 15 | 14 | 12 | 8 | 10 | 11 | 3 | 2 | 6 | 4 | 0 | 1 | 9 | 13 | 5 | 7 | 4 | 4 | 4 | 3 | 15 | 3 | 4 | 3 | 3 | 3 | 2 | 11 | 2 | 3 |
| 15 | 14 | 12 | 13 | 5 | 1 | 0 | 4 | 6 | 2 | 10 | 8 | 9 | 11 | 3 | 7 | 4 | 4 | 4 | 3 | 15 | 3 | 4 | 3 | 3 | 3 | 2 | 11 | 2 | 3 |
| 15 | 14 | 12 | 13 | 5 | 1 | 9 | 11 | 10 | 8 | 0 | 4 | 6 | 2 | 3 | 7 | 4 | 4 | 4 | 3 | 15 | 3 | 4 | 3 | 3 | 3 | 2 | 11 | 2 | 3 |
| 15 | 14 | 12 | 13 | 9 | 1 | 5 | 4 | 6 | 2 | 0 | 8 | 10 | 11 | 3 | 7 | 4 | 4 | 4 | 3 | 15 | 3 | 4 | 3 | 3 | 3 | 2 | 11 | 2 | 3 |
| 15 | 14 | 12 | 13 | 9 | 8 | 0 | 4 | 6 | 2 | 10 | 11 | 3 | 1 | 5 | 7 | 4 | 4 | 4 | 3 | 15 | 3 | 4 | 3 | 3 | 3 | 2 | 11 | 2 | 3 |
| 15 | 14 | 12 | 13 | 9 | 11 | 3 | 1 | 5 | 4 | 0 | 8 | 10 | 2 | 6 | 7 | 4 | 4 | 4 | 3 | 15 | 3 | 4 | 3 | 3 | 3 | 2 | 11 | 2 | 3 |

What is claimed:

1. A method of storing N input bits of data, comprising the steps of:
   (a) providing [N/M] cells, wherein M is at least 2;
   (a.1) providing the N input bits of data, said input bits being partitioned into M logical pages;
   (b) interleaving the N input bits, thereby providing N interleaved bits; and
   (c) programming each cell of said [N/M] cells with up to M of said interleaved bits,
   wherein as a result of the interleaving each bit page of the [N/M] cells is different than each logical page of the N input bits of data.

2. The method of claim 1, wherein M is at least 3.

3. The method of claim 1 wherein said interleaving provides each bit-page of said [N/M] cells with a substantially same number of input bits from each said logical page.

4. The method of claim 1, wherein said interleaving is deterministic.

5. The method of claim 4, wherein N is equal to or greater than M×M and wherein said interleaving is effected by steps including:
   (i) arranging the N input bits in at least one M×M matrix; and
   (ii) transposing each said at least one matrix.

6. The method of claim 5, wherein each matrix element of each said matrix includes a single input bit.

7. The method of claim 5, wherein the N input bits are arranged in a single M×M matrix and wherein each matrix element of said single matrix includes $N/M^2$ input bits.

8. The method of claim 1, wherein said interleaving is random.

9. The method of claim 1, further comprising the steps of:
   (d) reading said N interleaved bits from said cells; and
   (e) de-interleaving said N interleaved bits that have been read from said cells.

10. A memory device comprising:
    (a) a memory that includes at least K cells, each cell being capable of storing at most M bits of data; and
    (b) a controller operative to store N input bits of data in said cells by steps including:
       (i) receiving the N input bits of data, said input bits being partitioned into M logical pages;
       (i) interleaving said N input bits, thereby providing N interleaved bits, and
       (ii) programming each of K cells of said memory with up to M of said interleaved bits;
    wherein M is at least 2 and, as a result of the interleaving, each bit page of the K cells is different than each logical page of the N input bits of data.

11. The memory device of claim 10, wherein M is at least 3.

12. The memory device of claim 10, wherein said controller includes a mechanism for effecting said interleaving of said N input bits.

13. The memory device of claim 12, wherein said mechanism effects said interleaving by executing software.

14. The memory device of claim 12, wherein said controller includes dedicated hardware for effecting said interleaving.

15. The memory device of claim 10, wherein said memory includes dedicated hardware for effecting said interleaving.

16. The memory device of claim 10, wherein said memory is a flash memory.

17. A system for storing data, comprising:
(a) a memory device that includes a memory, said memory including at least K cells, each cell being capable of storing at most M bits of data;
(b) a host of said memory device, for providing N input bits of data to store said input bits being partitioned into M logical pages; and
(c) an interleaving mechanism for interleaving said N input bits, thereby providing N interleaved bits, each of K cells of said memory then being programmed with up to M of said interleaved bits;
wherein M is at least 2 and, as a result of the interleaving, each bit page of the K cells is different than each logical page of the N input bits of data.

18. The system of claim 17, wherein M is at least 3.

19. The system of claim 17, wherein said interleaving mechanism effects said interleaving by executing software.

20. The system of claim 19, wherein said interleaving mechanism is included in said host.

21. The system of claim 19, wherein said interleaving mechanism is included in a controller of said memory, said controller being included in said memory device.

22. The system of claim 17, wherein said interleaving mechanism includes dedicated hardware for effecting said interleaving.

23. The system of claim 22, wherein said interleaving mechanism is included in a controller of said memory, said controller being included in said memory device.

24. The system of claim 22, wherein said interleaving mechanism is included in said memory.

25. The system of claim 17, wherein said memory is a flash memory.

* * * * *